United States Patent
Muto

(10) Patent No.: US 9,397,072 B2
(45) Date of Patent: Jul. 19, 2016

(54) METHOD OF MANUFACTURING SEMICONDUCTOR DEVICE

(71) Applicant: Renesas Electronics Corporation, Koutou-ku, Tokyo (JP)

(72) Inventor: Nobuyasu Muto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/929,326

(22) Filed: Oct. 31, 2015

(65) Prior Publication Data

US 2016/0056124 A1 Feb. 25, 2016

Related U.S. Application Data

(63) Continuation of application No. 14/150,972, filed on Jan. 9, 2014, now Pat. No. 9,177,936, which is a continuation of application No. 13/611,222, filed on Sep. 12, 2012, now Pat. No. 8,796,074, which is a continuation of application No. 12/987,090, filed on Jan. 8, 2011, now Pat. No. 8,283,210.

(30) Foreign Application Priority Data

Jan. 8, 2010 (JP) ................................. 2010-002957

(51) Int. Cl.
*H01L 23/02* (2006.01)
*H01L 23/52* (2006.01)
(Continued)

(52) U.S. Cl.
CPC ........ *H01L 25/0652* (2013.01); *H01L 21/6836* (2013.01); *H01L 21/78* (2013.01); *H01L 23/04* (2013.01); *H01L 23/3142* (2013.01); *H01L 23/49811* (2013.01); *H01L 23/49838* (2013.01); *H01L 24/03* (2013.01); *H01L 24/27* (2013.01);
(Continued)

(58) Field of Classification Search
USPC .......................................... 257/286, 692, 693
See application file for complete search history.

(56) References Cited

U.S. PATENT DOCUMENTS 7,407,834 B2   8/2008   Shimanuki et al.
7,622,799 B2   11/2009  Kuroda et al.
(Continued)

FOREIGN PATENT DOCUMENTS

JP   2007-019415 A   1/2007
JP   2007-194491 A   8/2007
(Continued)

OTHER PUBLICATIONS

Office Action dated Oct. 1, 2013, in Japanese Patent Application No. 2010-002957.

*Primary Examiner* — Marc Armand
*Assistant Examiner* — Wilner Jean Baptiste
(74) *Attorney, Agent, or Firm* — Shapiro, Gabor and Rosenberger, PLLC

(57) ABSTRACT

Chip cracking that occurs when a dicing step using a blade is carried out to acquire semiconductor chips with the reduced thickness of a semiconductor wafer is suppressed. When the semiconductor wafer is cut at the dicing step for the semiconductor wafer, a blade is advanced as follows: in dicing in a first direction (Y-direction in FIG. 12) along a first straight line, the blade is advanced from a first point to a second point. The first point is positioned in a first portion and the second point is opposed to the first point with a second straight line running through the center point of the semiconductor wafer in between.

16 Claims, 46 Drawing Sheets

(51) Int. Cl.
*H01L 23/48* (2006.01)
*H01L 25/065* (2006.01)
*H01L 21/683* (2006.01)
*H01L 21/78* (2006.01)
*H01L 23/00* (2006.01)
*H01L 25/00* (2006.01)
*H01L 23/04* (2006.01)
*H01L 23/31* (2006.01)
*H01L 23/498* (2006.01)

(52) U.S. Cl.
CPC ............... *H01L 24/29* (2013.01); *H01L 24/49* (2013.01); *H01L 24/78* (2013.01); *H01L 24/83* (2013.01); *H01L 24/85* (2013.01); *H01L 24/97* (2013.01); *H01L 25/0657* (2013.01); *H01L 25/50* (2013.01); *H01L 24/45* (2013.01); *H01L 24/73* (2013.01); *H01L 2221/68322* (2013.01); *H01L 2221/68327* (2013.01); *H01L 2224/04042* (2013.01); *H01L 2224/27436* (2013.01); *H01L 2224/2919* (2013.01); *H01L 2224/32145* (2013.01); *H01L 2224/32245* (2013.01); *H01L 2224/43* (2013.01); *H01L 2224/45144* (2013.01); *H01L 2224/48091* (2013.01); *H01L 2224/48145* (2013.01); *H01L 2224/48247* (2013.01); *H01L 2224/48257* (2013.01); *H01L 2224/48471* (2013.01); *H01L 2224/48479* (2013.01); *H01L 2224/4911* (2013.01); *H01L 2224/49111* (2013.01); *H01L 2224/49175* (2013.01); *H01L 2224/49429* (2013.01); *H01L 2224/73265* (2013.01); *H01L 2224/75743* (2013.01); *H01L 2224/78* (2013.01); *H01L 2224/78301* (2013.01); *H01L 2224/838* (2013.01); *H01L 2224/83191* (2013.01); *H01L 2224/85001* (2013.01); *H01L 2224/85051* (2013.01); *H01L 2224/85148* (2013.01); *H01L 2224/85205* (2013.01); *H01L 2224/85986* (2013.01); *H01L 2224/92247* (2013.01); *H01L 2224/97* (2013.01); *H01L 2225/0651* (2013.01); *H01L 2225/06506* (2013.01); *H01L 2225/06562* (2013.01); *H01L 2924/01004* (2013.01); *H01L 2924/014* (2013.01); *H01L 2924/01005* (2013.01); *H01L 2924/01006* (2013.01); *H01L 2924/01014* (2013.01); *H01L 2924/01019* (2013.01); *H01L 2924/01028* (2013.01); *H01L 2924/01029* (2013.01); *H01L 2924/01033* (2013.01); *H01L 2924/01075* (2013.01); *H01L 2924/01078* (2013.01); *H01L 2924/01079* (2013.01); *H01L 2924/01082* (2013.01); *H01L 2924/0665* (2013.01); *H01L 2924/07802* (2013.01); *H01L 2924/12042* (2013.01); *H01L 2924/181* (2013.01); *H01L 2924/1815* (2013.01); *H01L 2924/30105* (2013.01)

(56) References Cited

U.S. PATENT DOCUMENTS

| | | | |
|---|---|---|---|
| 7,981,788 | B2 | 7/2011 | Muto et al. |
| 2002/0163054 | A1 | 11/2002 | Suda |
| 2005/0019979 | A1 | 1/2005 | Kuratomi et al. |
| 2009/0085223 | A1 | 4/2009 | Nishiyama et al. |
| 2009/0108470 | A1 | 4/2009 | Okada et al. |
| 2009/0166829 | A1 | 7/2009 | Nishiyama et al. |
| 2010/0109141 | A1 | 5/2010 | Nishiyama et al. |
| 2010/0148377 | A1* | 6/2010 | Ito ................. H01L 21/561 257/787 |
| 2010/0308442 | A1 | 12/2010 | Naka et al. |

FOREIGN PATENT DOCUMENTS

| | | |
|---|---|---|
| JP | 2009-088217 A | 4/2009 |
| JP | 2009-158739 A | 7/2009 |
| JP | 2009-176849 A | 8/2009 |

\* cited by examiner

METHOD OF MANUFACTURING SEMICONDUCTOR DEVICE

CROSS-REFERENCE TO RELATED APPLICATIONS

The disclosure of Japanese Patent Application No. 2010-2957 filed on Jan. 8, 2010 including the specification, drawings and abstract is incorporated herein by reference in its entirety.

BACKGROUND OF THE INVENTION

The present invention relates to manufacturing technologies for semiconductor devices and in particular to a technology effectively applicable to the reduction of chip cracking that occurs when a thinly formed semiconductor wafer is diced.

A structure for laminating multiple semiconductor elements stepwise over a wiring board has been disclosed (for example, Patent Document 1). In this structure, multiple semiconductor elements comprising a first element group are laminated stepwise over a wiring board; and multiple semiconductor elements comprising a second element group are laminated stepwise over the first element group in the opposite direction to the direction of the tiers in the first element group.

Another structure for laminating multiple semiconductor elements stepwise over a wiring board has been disclosed (for example, Patent Document 2). In this structure, multiple semiconductor elements comprising a first element group are laminated stepwise over a wiring board; multiple semiconductor elements comprising a second element group are laminated stepwise over the first element group in the opposite direction to the direction of the tiers in the first element group; and the semiconductor element in the lowermost tier in the second element group is laminated directly above the semiconductor element in the uppermost tier in the first element group with an insulating adhesive layer in between.

Another structure for laminating multiple semiconductor elements stepwise over a wiring board has been disclosed (for example, Patent Document 3). In this structure, multiple semiconductor elements comprising a first element group are laminated stepwise over a wiring board; multiple semiconductor elements comprising a second element group are laminated stepwise over the first element group in the opposite direction to the direction of the tiers in the first element group; and the semiconductor element positioned in the uppermost tier is thicker than the semiconductor elements positioned thereunder.

[Patent Document 1]
Japanese Unexamined Patent Publication No. 2009-88217
[Patent Document 2]
Japanese Unexamined Patent Publication No. 2009-158739
[Patent Document 3]
Japanese Unexamined Patent Publication No. 2009-176849

SUMMARY OF THE INVENTION

As semiconductor devices increase in capacity, consideration has been given to placing multiple semiconductor chips in one semiconductor device. In this situation, there is also demand for size reduction in electronic equipment (electronic devices) and it is required to also reduce the outer dimensions of the semiconductor device placed in this electronic equipment. It is believed that laminating multiple semiconductor chips (semiconductor elements) in multiple tiers over a wiring board as a base material as described in Patent Documents 1 to 3 is effective at achieving it.

In recent years, the demands for reduction in the thickness of semiconductor devices have increased. Therefore, it is required to reduce not only the thickness of the base material but also the thickness of each semiconductor chip (or each semiconductor wafer from which semiconductor chips are acquired) placed over this base material. However, the investigation by the present inventors revealed the following: if a dicing step using a blade is carried out with the thickness of a semiconductor wafer reduced to 80 µm or less to acquire semiconductor chips, chip cracking occurs.

Patent Documents 1 to 3 all describe that the thickness of each semiconductor chip placed in multiple tiers over a base material is 80 µm or less; however, neither of the documents discloses a concrete technique for acquiring semiconductor chips having such a thickness.

The invention has been made in consideration of the foregoing and it is an object thereof to provide a technology that makes it possible to acquire thin-type semiconductor chips.

It is another object of the invention to provide a technology that makes it possible to manufacture miniature semiconductor devices.

The above and other objects and novel features of the invention will be apparent from the description in this specification and the accompanying drawings.

The following is a brief description of the gist of the representative elements of the invention laid open in this application:

According to a method of manufacturing a semiconductor device in a typical embodiment, the following processing is carried out at a step for acquiring semiconductor chips (first semiconductor chips, second semiconductor chips): in dicing in a first direction along a first straight line connecting a reference portion of a semiconductor wafer and the center point of the semiconductor wafer, a blade is advanced from a first point toward a second point. The first point is positioned in a first portion of the side of the semiconductor wafer. The second point is positioned in a second portion of the above side and opposed to the first point with a second straight line in between. The second straight line is orthogonal to the first straight line in the first direction and runs through the center point of the semiconductor wafer.

The following is a brief description of the gist of the effect obtained by the representative elements of the invention laid open in this application:

Thin-type semiconductor chips can be acquired with reduced chip cracking in the thin-type semiconductor chips.

BRIEF DESCRIPTION OF THE DRAWINGS

FIG. 3 is a plan view illustrating an example of the structure of the semiconductor device illustrated in FIG. 1 with a sealing body seen through;

FIG. 47 is a plan view illustrating the structure of a semiconductor device in a third modification to the first embodiment of the invention with a sealing body seen through;

FIG. 50 is a plan view illustrating an example of the structure of a semiconductor device in a second embodiment of the invention with a sealing body seen through;

FIG. 54 is a perspective view illustrating an example of the structure of a semiconductor device in a second modification (one-side mounting) to the second embodiment of the invention with a sealing body seen through;

FIG. 57 is a back side back view illustrating the structure of the semiconductor device in FIG. 54 as viewed from the back surface side with a sealing body seen through;

FIG. 62 is a perspective view illustrating an example of the structure of a semiconductor device in a third modification (both-side mounting) to the second embodiment of the invention with a sealing body seen through;

DETAILED DESCRIPTION OF THE PREFERRED EMBODIMENTS

In the following description of embodiments, the description of an identical or similar part will not be repeated as a rule unless especially required.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number.

In the following description of embodiments, needless to add, their constituent elements (including elemental steps and the like) are not always indispensable unless explicitly stated otherwise or they are obviously indispensable in principle.

When the wording of "comprised of A," "formed of A," "including A," or "containing A" is used with respect to a constituent element or the like in the following description of embodiments, needless to add, other elements are not excluded. This applies unless it is explicitly stated that only that element is especially involved. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the invention with reference to the drawings. In every drawing for explaining embodiments, the members having an identical function will be marked with identical reference codes and the repetitive description thereof will be omitted.

(First Embodiment)

Figure 1:
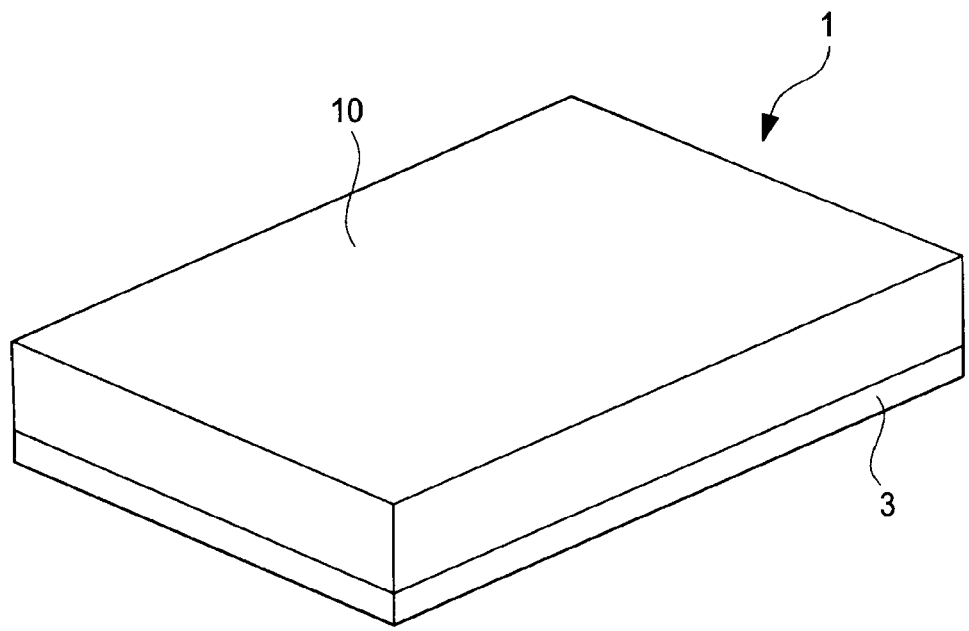
FIG. 1 is a perspective view illustrating an example of the structure of a semiconductor device in a first embodiment of the invention.
Figure 2:
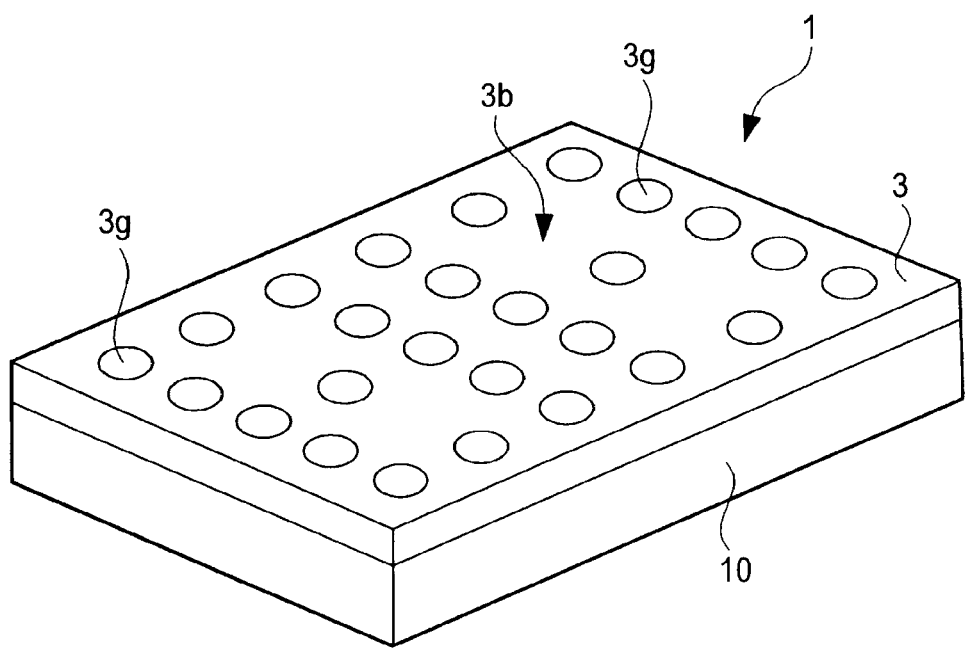
FIG. 2 is a perspective view illustrating an example of the arrangement of external terminals on the back side of the semiconductor device in FIG. 1.
Figure 3:
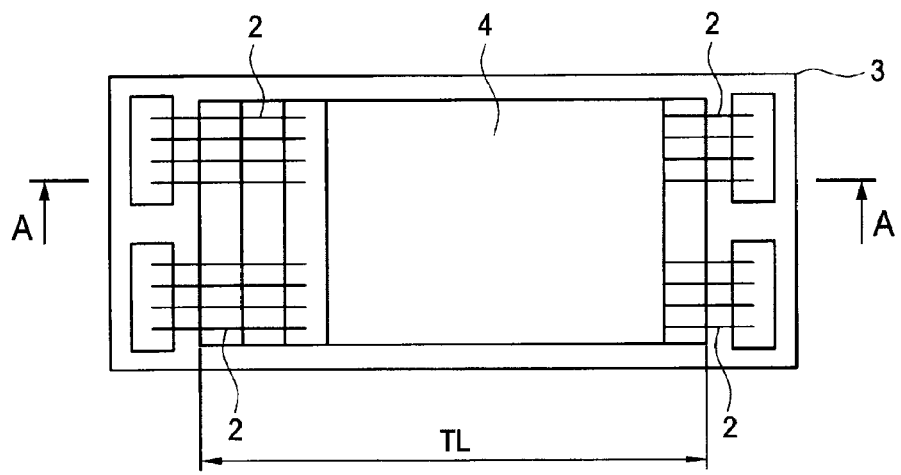
Figure 4:
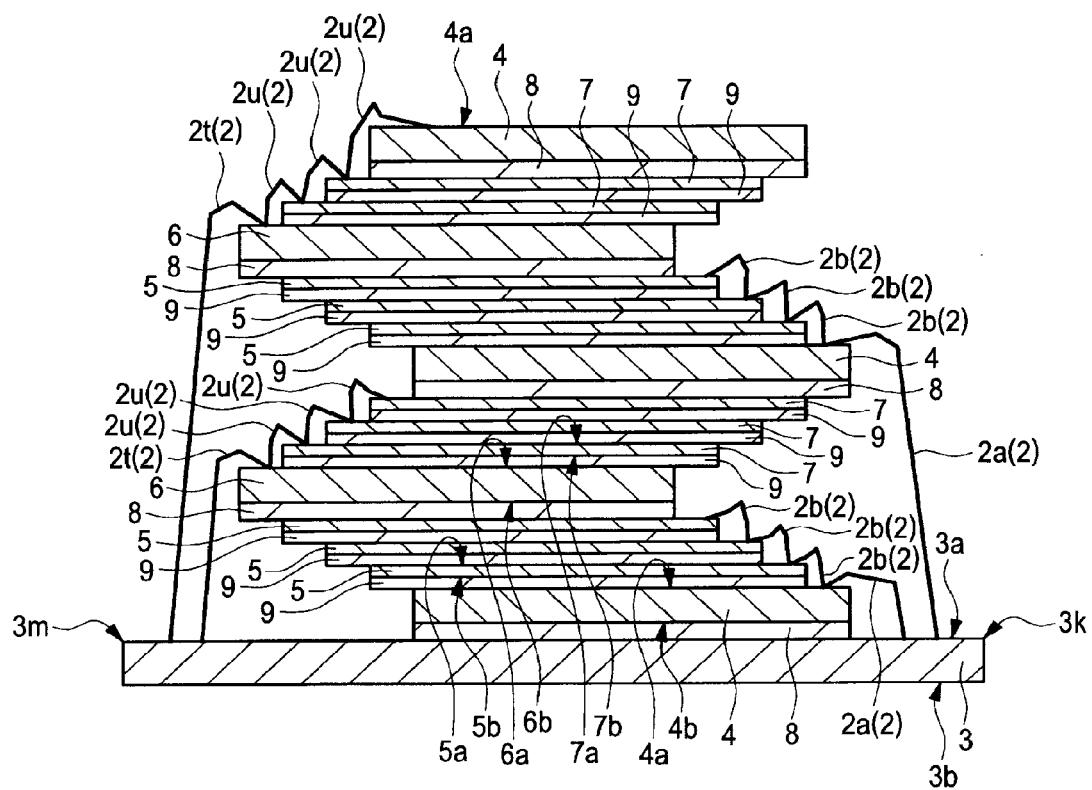
FIG. 4 is an enlarged sectional view taken along line A-A of FIG. 3, illustrating an example of the structure of the semiconductor device in FIG. 3.
Figure 5:
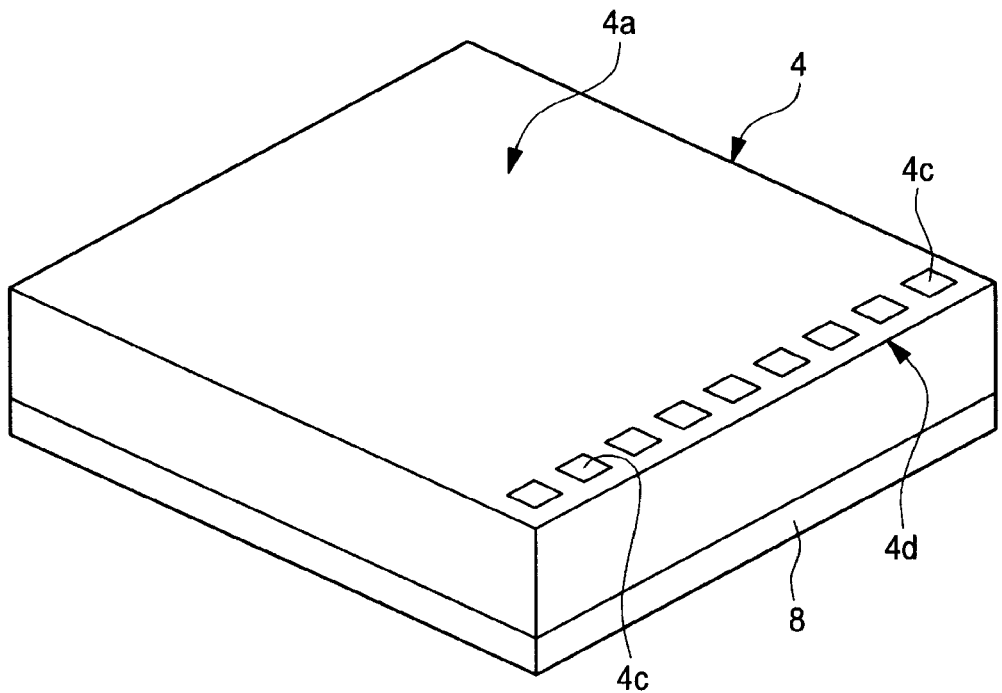
FIG. 5 is a perspective view illustrating an example of the structure of a first semiconductor chip and a first adhesive layer incorporated in the semiconductor device illustrated in FIG. 1.
Figure 6:
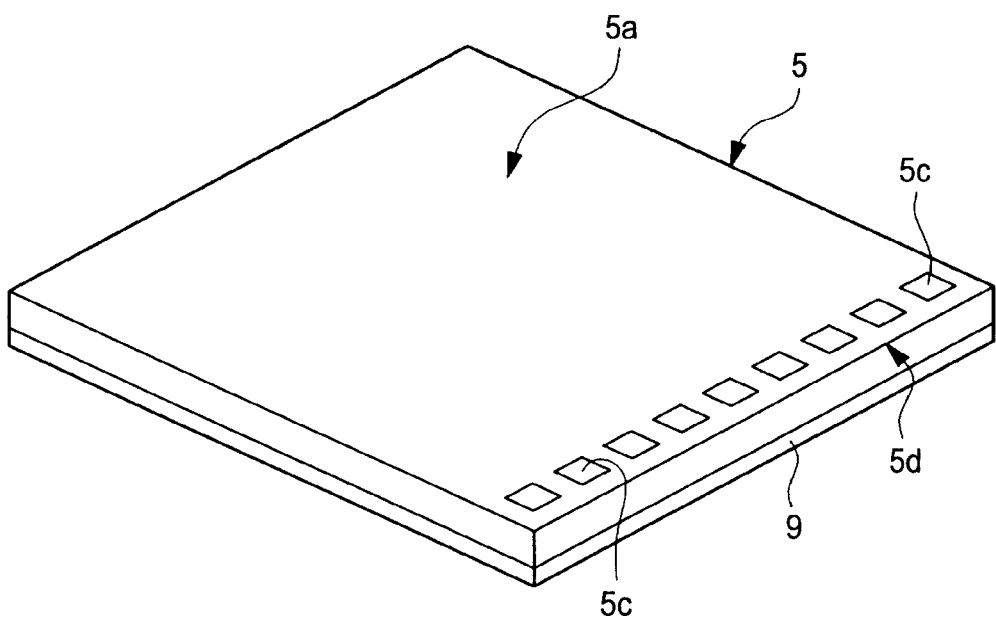
FIG. 6 is a perspective view illustrating an example of the structure of a second semiconductor chip and a second adhesive layer incorporated in the semiconductor device illustrated in FIG. 1.
Figure 7:
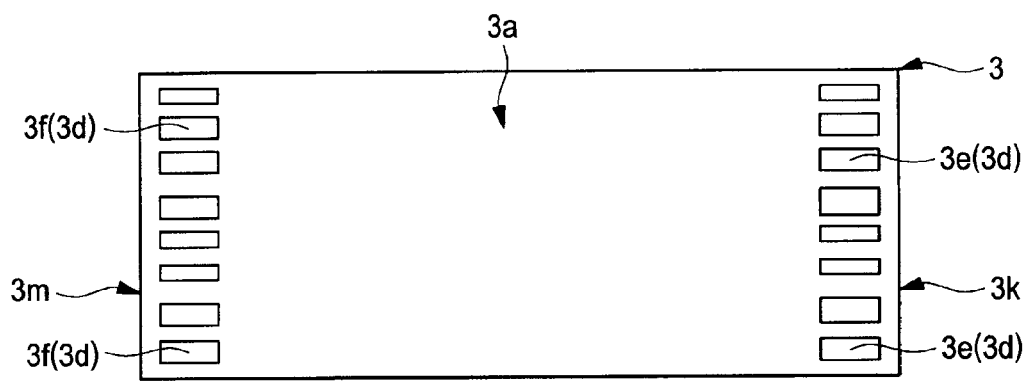
FIG. 7 is a plan view illustrating an example of the structure of a wiring board incorporated in the semiconductor device illustrated in FIG. 1.
Figure 8:
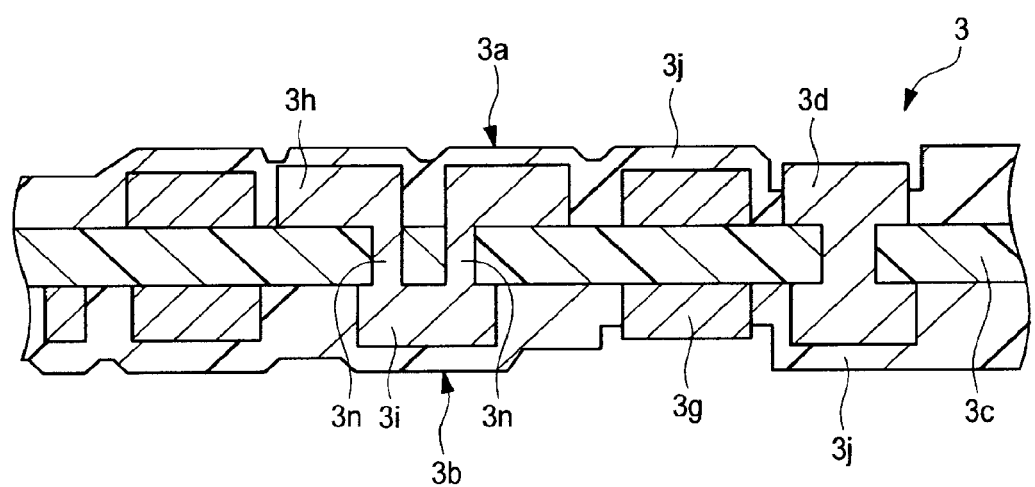
FIG. 8 is an enlarged partial sectional view illustrating an example of the internal structure of the wiring board in FIG. 7.

FIG. 1 is a perspective view illustrating an example of the structure of a semiconductor device in a first embodiment of the invention; FIG. 2 is a perspective view illustrating an example of the arrangement of external terminals on the back surface side of the semiconductor device FIG. 1; FIG. 3 is a plan view illustrating an example of the structure of the semiconductor device illustrated in FIG. 1 with a sealing body seen through; and FIG. 4 is an enlarged sectional view taken along line A-A of FIG. 3, illustrating an example of the structure of the semiconductor device illustrated in FIG. 1. FIG. 5 is a perspective view illustrating an example of the structure of a first semiconductor chip and a first adhesive layer incorporated in the semiconductor device illustrated in FIG. 1; FIG. 6 is a perspective view illustrating an example of the structure of a second semiconductor chip and a second adhesive layer incorporated in the semiconductor device illustrated in FIG. 1; FIG. 7 is a plan view illustrating an example of the structure of a wiring board incorporated in the semiconductor device illustrated in FIG. 1; and FIG. 8 is an enlarged partial sectional view illustrating an example of the internal structure of the wiring board in FIG. 7.

As illustrated in FIG. 1 and FIG. 2, the semiconductor device in the first embodiment is an LGA (Land Grid Array) semiconductor device (hereafter, referred to as LGA) 1. As illustrated in FIG. 3 and FIG. 4, multiple semiconductor chips are laminated over a base material. Its structure will be described below in detail.

<Semiconductor Device>

Figure 16:
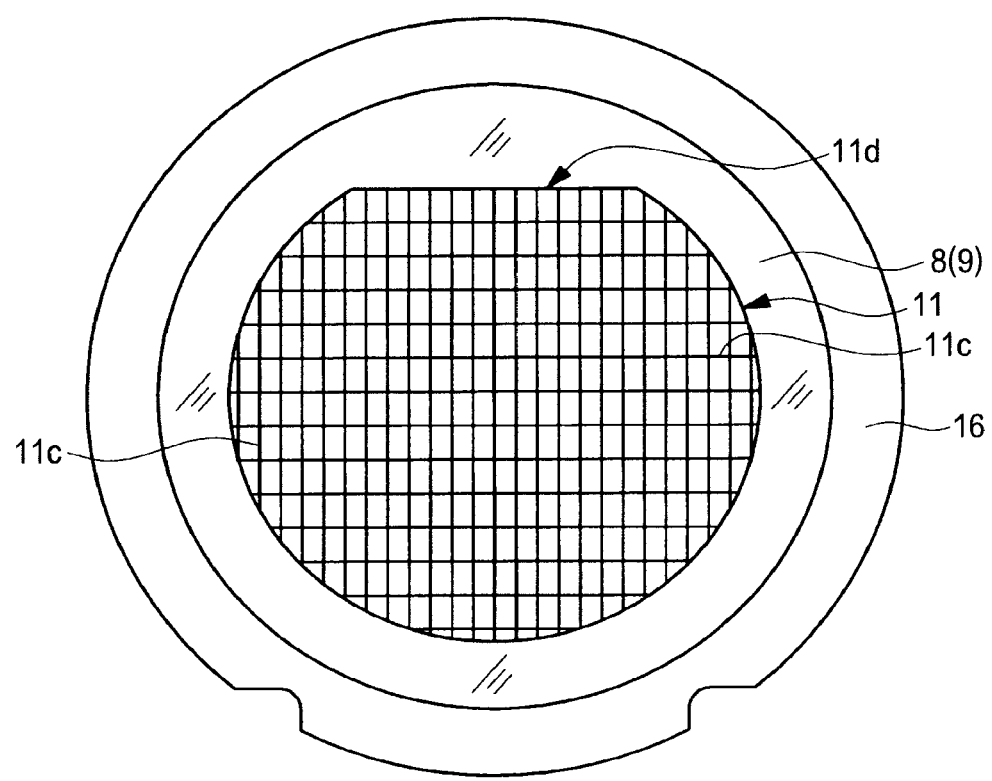
FIG. 16 is a plan view illustrating an example of the structure of a semiconductor wafer after DAF and a dicing tape are stuck in the assembly of the semiconductor device illustrated in FIG. 1.

The LGA 1 in this embodiment uses a wiring board 3 as the base material. As illustrated in FIG. 3 and FIG. 4, 16 semiconductor chips are laminated stepwise (shifted tier by tier) over the wiring board 3. In other wise, a semiconductor chip in an upper tier is shifted from a semiconductor chip in the next lower tier so that the following is implemented: bonding pads (electrode pads) of the semiconductor chip in the next lower tier are exposed. As illustrated in FIG. 4, the following measure is taken so that each four semiconductor chips are oriented to the same direction, in other words, the bonding pads of each semiconductor chip are positioned on the same side of the wiring board 3: four semiconductor chips are laminated stepwise with their orientations aligned and the direction of lamination is changed by 180 degrees and then another four semiconductor chips are placed stepwise. (The direction of lamination refers to the direction to which semiconductor chips are shifted when they are laminated and will be hereafter referred to as lamination direction.) At this time, the semiconductor chips in the fifth to eighth tiers are laminated stepwise so that their bonding pads are arranged on the opposite side to those of the semiconductor chips in the first to fourth tiers.

Description will be given to the reason why 16 semiconductor chips are used in the LGA 1 in this embodiment. Each semiconductor chip used in this embodiment includes a memory circuit and these chips are all flash memory chips (nonvolatile memories) of the same kind. The capacity of each memory chip is 32 Gigabits. In this embodiment, 16 memory chips are used to implement LGA 1 having a capacity of 64 Gigabytes. In general, the capacity of a memory chip is configured by $2^2$ bits; therefore, it is desirable that semiconductor chips should also be laminated by group of $2^2$ chips. In this embodiment, for this reason, four semiconductor chips (in the first to fourth tiers) are placed in the same lamination direction and then another four semiconductor chips (in the fifth to eighth tiers) are placed. Thereafter, the lamination direction is changed by 180 degrees again and the next semiconductor chips (in the ninth to 12th tiers) are laminated stepwise in four tiers as in the first to fourth tiers. Further, the lamination direction is changed by 180 degrees and the next semiconductor chips (in the 13th to 16th tiers) are laminated stepwise in four tiers as in the fifth to eighth tiers.

In this embodiment, as mentioned above, memory chips each having a capacity of 32 Gigabits are used to manufacture the semiconductor device 1 of 64 Gigabytes and thus 16 semiconductor chips (memory chips) are used. However, the semiconductor device 1 may be configured of a lager number or a smaller number of semiconductor chips, needless to add, when the capacity of each memory chip is different and the required capacity of the semiconductor device 1 is different.

As illustrated in FIG. 3 and FIG. 4, the following can be electrically coupled together using a wire 2 formed of a conductive member: the bonding pads (electrode pads) of one semiconductor chip and those of another semiconductor chip; or the bonding pads of a semiconductor chip and bonding leads (electrode pads) 3d of the wiring board 3. (Refer to FIG. 7.)

All the wires 2 in the LGA 1 are wire bonded by a reverse bonding method using ball bonding. The reverse bonding method is a technique in which the following procedure is taken: the ball portion of a wire 2 is joined to a bonding lead 3d of the wiring board 3 (or a bonding pad of a semiconductor chip in a lower tier); and thereafter part of the wire 2 is jointed to a bonding pad of a semiconductor chip (a bonding pad of a semiconductor chip in an upper tier).

Consequently, the LGA 1 is so structured that overstriking is carried out in the reverse bonding method using ball bonding. The wire 2 is composed of, for example, gold (Au).

On the upper surface (front surface) 3a side of the wiring board 3, there are formed semiconductor chips laminated in 16 tiers and multiple wires 2 obtained by the reverse bonding method. The 16-tiered semiconductor chips and the wires 2 are sealed with the sealing body 10 illustrated in FIG. 1 over the upper surface 3a of the wiring board 3. The sealing body 10 is obtained by, for example, thermally curing epoxy sealing resin.

Since the LGA 1 is of a land grid array, multiple bump lands 3g to be external terminals of the LGA 1 are provided on the lower surface 3b side of the wiring board 3 as illustrated in FIG. 2.

In this embodiment, as mentioned above, the following measure is taken when semiconductor chips having a rectangular planar shape illustrated in FIG. 3 are laminated in multiple tiers: as illustrated in FIG. 3 and FIG. 4, four semiconductor chips (in the first to fourth tiers) are placed in the same lamination direction; and thereafter the lamination direction is changed by 180 degrees and another four semiconductor chips (in the fifth to eighth tiers) are placed. Therefore, size reduction can be achieved in the semiconductor device 1 (or the wiring board 3).

<Semiconductor Chip>

Description will be given to the 16 semiconductor chips placed in the LGA 1.

The semiconductor chips used in the first (lowermost), fifth, ninth, 13th, and 16th (uppermost) tiers in FIG. 4 are the semiconductor chip (first semiconductor chip) 4 illustrated in FIG. 5. (However, the semiconductor chips in the fifth and 13th tiers are the same semiconductor chip (third semiconductor chip) 6 as the semiconductor chip 4.) This semiconductor chip 4 includes: a main surface (first front surface, upper surface) 4a; multiple first bonding pads (electrode pads) 4c formed in this main surface 4a; and a main surface (first back surface, lower surface) 4b opposite to the main surface 4a. The planar shape of the main surface 4a (and the main surface 4b) is a quadrilateral and in this embodiment, it is a rectangle. The first bonding pads 4c are formed along a side (first chip side) 4d of the main surface 4a and closer to only this side 4d than to the central part of the main surface 4a. In other words, the semiconductor chip 4 is a so-called one-side pad product and no bonding pads are formed on the other sides. As illustrated in FIG. 5, further, an adhesive layer (first adhesive layer, DAF (Die Attach Film)) 8 formed of insulating material is formed over the main surface 4b. The semiconductor chip 4 is composed of silicon (Si) and the thickness of the semiconductor chip 4 is within a range of 0.040 to 0.200 mm and 0.055 mm in this embodiment. The thickness (Td1) of the adhesive layer 8 stuck to the main surface 4b of the semiconductor chip 4 is within a range of 0.010 to 0.050 mm and 0.020 mm in this embodiment. For this reason, the total thickness of the semiconductor chip 4 and the adhesive layer 8 is 0.075 mm.

The semiconductor chips used in the second to fourth, sixth to eighth, 10th to 12th, 14th, and 15th tiers in FIG. 4 are the semiconductor chip (second semiconductor chip) 5 illustrated in FIG. 6. (However, the semiconductor chips in the sixth to eighth tiers and the 14th and 15th tiers are the same semiconductor chip (fourth semiconductor chip) 7 as the semiconductor chip 5.) Similarly with the semiconductor chip 4, this semiconductor chip 5 includes: a main surface (second front surface, upper surface) 5a; multiple second bonding pads (electrode pads) 5c formed in this main surface 5a; and a main surface (second back surface, lower surface) 5b opposite to the main surface 5a. The planar shape of the main surface 5a (and the main surface 5b) is a quadrilateral. The second bonding pads 5c are formed along a side (second chip side) 5d of the main surface 5a and closer to only this side 5d than to the central part of the main surface 5a. In other words, the semiconductor chip 5 is a so-called one-side pad product like the semiconductor chip 4. As illustrated in FIG. 6, further, an adhesive layer (second adhesive layer, DAF) 9 formed of insulating material is formed over the main surface 5b. The semiconductor chip 5 is composed of silicon (Si) and the thickness of the semiconductor chip 5 is within a range of 0.010 to 0.030 mm and 0.020 mm in this embodiment. The thickness (Td2) of the adhesive layer 9 stuck to the main surface 5b of the semiconductor chip 5 is within a range of 0.003 to 0.010 mm and 0.005 mm in this embodiment. For this reason, the total thickness of the semiconductor chip 5 and the adhesive layer 9 is 0.025 mm. That is, the thickness of the semiconductor chip (second semiconductor chip) 5 illustrated in FIG. 6 is smaller than the thickness of the semiconductor chip (first semiconductor chip) 4 illustrated in FIG. 5. The thickness of the adhesive layer 9 is also smaller than the thickness of the adhesive layer 8. In other words, the total thickness of the first semiconductor chip 4 and the first adhesive layer 8 is larger than the total thickness of the second semiconductor chip 5 and the second adhesive layer 9. The outer dimensions of the main surface 4a (or the main surface 4b) of the first semiconductor chip 4 are identical with the outer dimensions of the main surface 5a (or the main surface 5b) of the second semiconductor chip 5.

<Base Material>

Description will be given to the base material used in the LGA 1. In this embodiment, such a wiring board 3 as illustrated in FIG. 7 and FIG. 8 is used as the base material.

As illustrated in FIG. 7 and FIG. 8, the wiring board 3 includes: a core layer (core material) 3c having an upper surface (front surface) 3a quadrilateral in planar shape and a lower surface (back surface) 3b opposite to this upper surface 3a; an upper surface-side wiring layer 3h formed in the upper surface 3a of the core layer 3c; a lower surface-side wiring layer 3i formed in the lower surface 3b of the core layer 3c; and a via wiring 3n provided in a via (through hole) formed in the core layer 3c and electrically coupling the upper surface-side wiring layer 3h and the lower surface-side wiring layer 3i with each other. The planar shape of the upper surface 3a in this embodiment is a rectangle having two short sides (first board side, second board side) located opposite to each other and two long sides orthogonal to the short sides and located opposite to each other. As illustrated in FIG. 3, the outer dimensions of the upper surface 3a is larger than the outer dimensions thereof with the semiconductor chips 4, 5 laminated thereover. In other words, each long side of the wiring board 3 is larger than the total length TL of the semiconductor chips laminated stepwise; and each short side of the wiring board 3 is longer than the each short side of each semiconductor chip. The core layer 3c is composed of glass epoxy resin. Each of the upper surface-side wiring layer 3h and the lower surface-side wiring layer 3i is composed of copper (Cu).

Though not shown in the drawings, the upper surface-side wiring layer 3h includes multiple wirings (wiring patterns). Each of the multiple bonding leads 3d formed in the upper surface 3a of the core layer 3c is formed of part of each of the wirings. The upper surface 3a and upper surface wiring layer 3h of the core layer 3c are covered with an upper surface solder resist film 3j and only the bonding leads 3d are exposed from openings formed in this upper surface solder resist film 3j. The bonding leads 3d include: multiple bonding leads (first bonding leads, electrode pads) 3e formed along one (first board side) 3k of the two short sides and arranged closer to this side 3k than to the other side (second board side) 3m opposed to the side 3k; and multiple bonding leads (second bonding leads, electrode pads) 3f formed along the other (second board side) 3m of the two short sides and arranged closer to this side 3m than to the side (second board side) 3k. That is, the wiring board 3 used in this embodiment is a so-called both-side pad product. Though not shown in the drawing, a plating layer is formed over the front surface of each of the bonding leads and this plating layer is configured, for example, by depositing a gold (Au) layer over a nickel (Ni) layer.

Though not shown in the drawings, the lower surface-side wiring layer 3i includes multiple wirings (wiring patterns). As illustrated in FIG. 2, each of the bump lands 3g formed in the lower surface 3b of the core layer 3c is formed of part of each of the wirings. The lower surface 3b and lower surface-side wiring layer 3i of the core layer 3c are covered with a lower surface solder resist film 3j. As illustrated in FIG. 2 and FIG. 8, only the bump lands 3g are exposed from the lower surface solder resist film 3j.

As mentioned above, wiring layers (upper surface-side wiring layer 3h, lower surface-side wiring layer 3i) having multiple wirings are formed under the solder resist films 3j. For this reason, the front surfaces of the solder resist films 3j are not flat as illustrated in FIG. 8. In other words, unevenness (step) is formed there.

In the LGA 1 in the first embodiment, therefore, the following measure is taken when semiconductor chips are laminated in 16 tiers as illustrated in FIG. 4: the first semiconductor chip 4, or a thicker-type chip, is placed only in requiring tiers and the second semiconductor chip 5, or a thinner-type chip, is used in the other tiers. The 16-tiered laminate is thereby thinned to achieve reduction in the thickness of the LGA 1.

In the first tier, or the lowermost tier, of the 16 tiers, the first semiconductor chip 4 is used. The first semiconductor chip 4 is thicker than the second semiconductor chip 5 and the first adhesive layer 8 thicker than the second adhesive layer 9 is stuck thereto. In the upper surface 3a of the wiring board 3, as mentioned above, the unevenness in the solder resist film 3j and the like is large. Therefore, it is possible to absorb the unevenness by the thick first adhesive layer 8 to enhance the adhesive strength. The thickness of 0.010 to 0.050 mm of the first adhesive layer 8 is sufficient to absorb the unevenness in the upper surface 3a of the wiring board 3. This makes it possible to prevent the semiconductor chip from coming off from the wiring board 3 during molding.

The thickness of 0.040 to 0.200 mm of the first semiconductor chip 4 makes it possible to maintain strength sufficient to ensure the flatness of the first back surface 4b of the first semiconductor chip 4. This makes it possible to enhance the adhesive strength and ensure the flatness of the first front surface 4a of the first semiconductor chip 4 to enhance the die bondability of the semiconductor chip in the second tier.

The thick-type first semiconductor chip 4 is also used in the fifth, ninth, and 13th tiers of the 16 tiers. These tiers are equivalent to the first tier of every four-tiered turn-back lamination in the 16-tiered lamination. In these tiers, it is required for a wire 2 for reverse bonding in the respective tiers (fourth, eighth, and 12th tiers) located directly under to ensure a certain height by the semiconductor chips in the fifth, ninth, and 13th tiers. This is intended to prevent the wire from being brought into contact with an end of the back surface of each of the semiconductor chips located directly above (sixth, 10th, and 14th tiers). For this reason, the thick-type first semiconductor chip 4 with the thicker first adhesive layer 8 stuck thereto is used in the fifth, ninth, and 13th tiers.

This makes it possible to prevent (reduce) contact between a semiconductor chip and a wire 2 in 16-tiered lamination in which turn-back lamination is carried out every four tiers.

In the fifth, ninth, and 13th tiers, further, a chip end is overhanged (protruded) due to turn-back lamination. As a result, there are bonding pads whose lower parts are not supported by anything and they must withstand bonding force during wire bonding. Therefore, use of the thick-type first semiconductor chip 4 makes it possible to enhance the strength of the chip itself and prevent (reduce) chip breakage due to bonding force during wire bonding.

Since there are portions whose lower parts are not supported by anything in the overhanged area at the chip end, chip fracture is prone to be caused by pressure from a resin flow during resin molding. Therefore, use of the thick-type first semiconductor chip 4 makes it possible to enhance the strength of the chip itself similarly with the foregoing. In addition, it makes it possible to prevent (reduce) the occurrence of chip fracture due to pressure from a resin flow during resin molding.

The thick-type first semiconductor chip 4 is also used in the 16th tier, or the uppermost tier, of the 16-tiered laminate. This is a measure against the following: the semiconductor chip in the 16th tier is not especially supported by any member on its upper surface side (main surface side); therefore, chip fracture is prone to be caused by pressure from a resin flow during resin molding similarly with the foregoing. Use of the thick-type first semiconductor chip 4 also in the 16th tier makes it possible to enhance the strength of the chip itself and prevent (reduce) the occurrence of chip fracture due to pressure from a resin flow during resin molding.

<Method of Manufacturing Semiconductor Device>

Description will be given to a method of manufacturing the semiconductor device (LGA 1) in the first embodiment.

Figure 9:
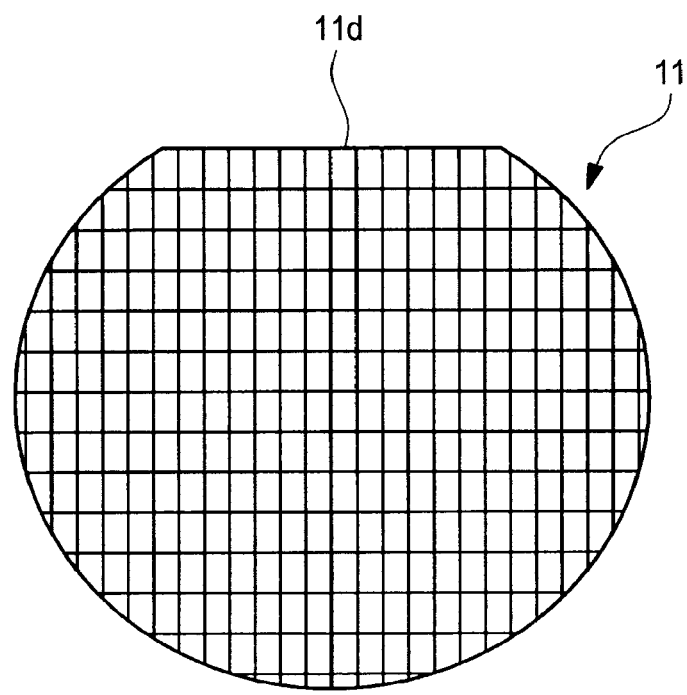
FIG. 9 is a plan view illustrating an example of the structure of a semiconductor wafer after dicing in the assembly of the semiconductor device illustrated in FIG. 1.
Figure 10:
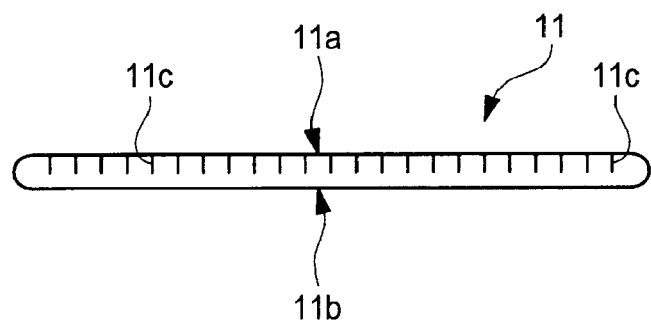
FIG. 10 is a side view illustrating an example of the structure of the semiconductor wafer illustrated in FIG. 9.
Figure 11:
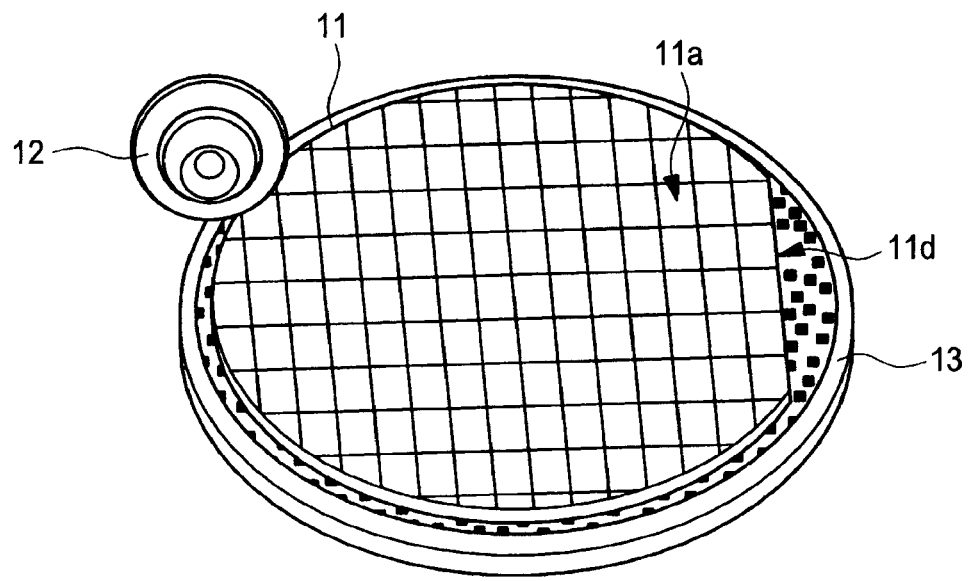
FIG. 11 is a perspective view illustrating an example of the structure of a semiconductor wafer during dicing in the assembly of the semiconductor device illustrated in FIG. 1.
Figure 12:
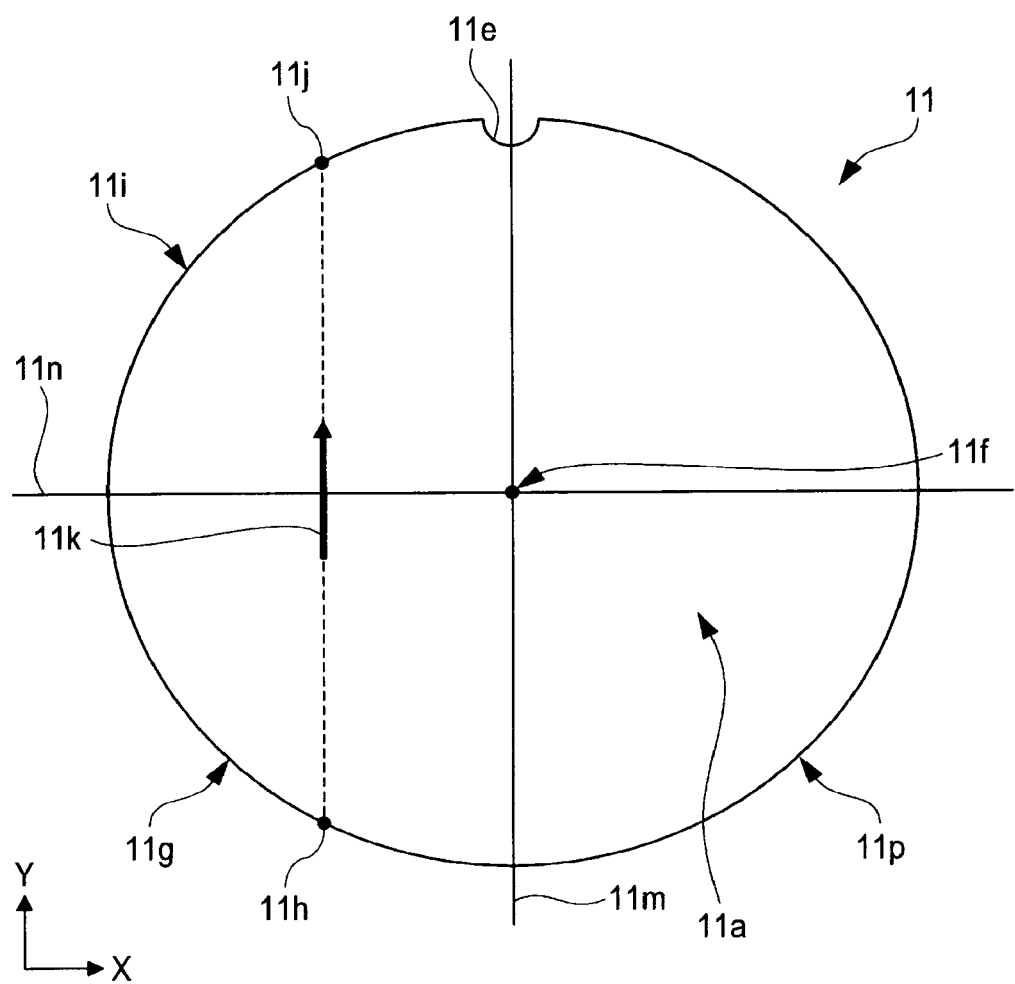
FIG. 12 is a plan view illustrating an example of the traveling direction of a blade during the dicing illustrated in FIG. 11.
Figure 13:
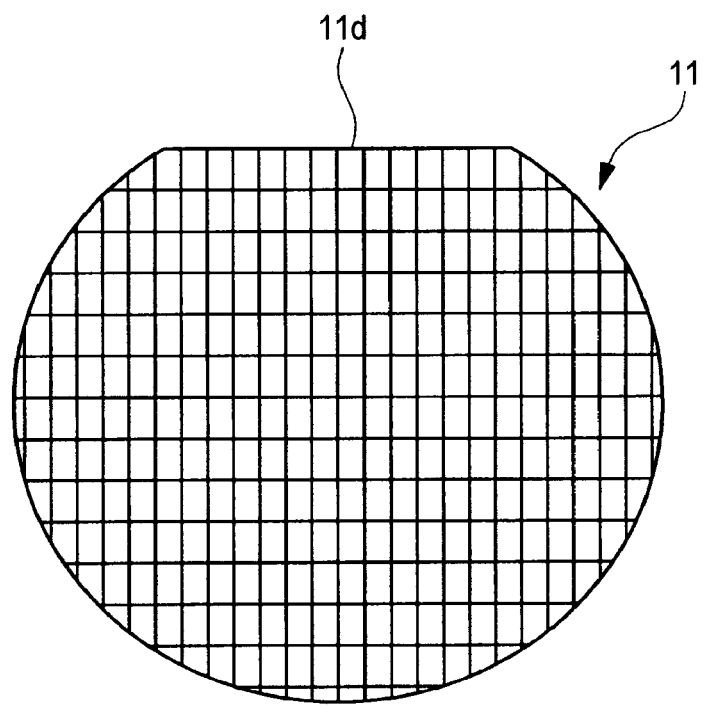
FIG. 13 is a plan view illustrating an example of the structure of a semiconductor wafer after back grind in the assembly of the semiconductor device illustrated in FIG. 1.
Figure 14:
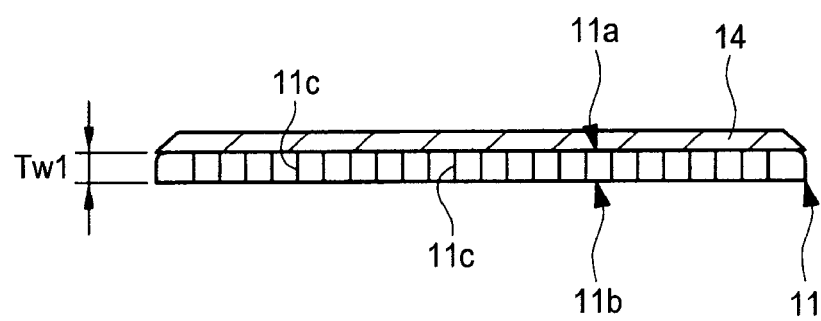
FIG. 14 is a side view illustrating an example of the structure of the semiconductor wafer illustrated in FIG. 13.
Figure 15:
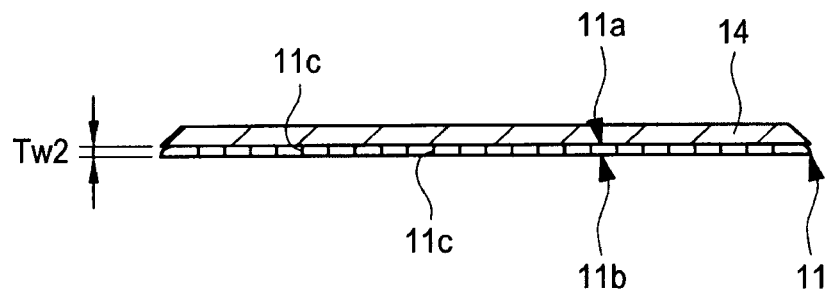
FIG. 15 is a side view illustrating an example of the structure of the thin semiconductor wafer illustrated in FIG. 13.
Figure 17:
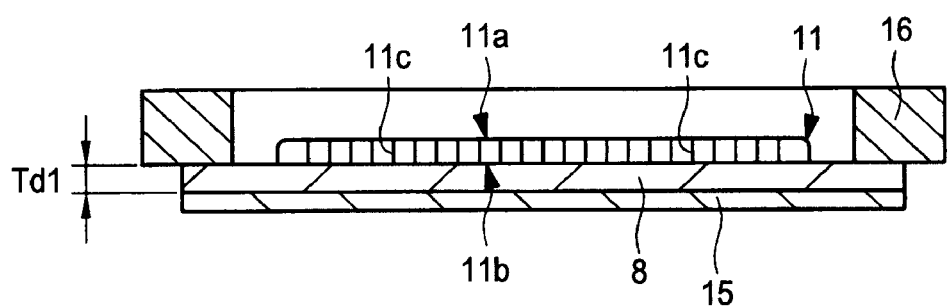
FIG. 17 is a sectional view illustrating an example of the structure of the semiconductor wafer illustrated in FIG. 16.
Figure 18:
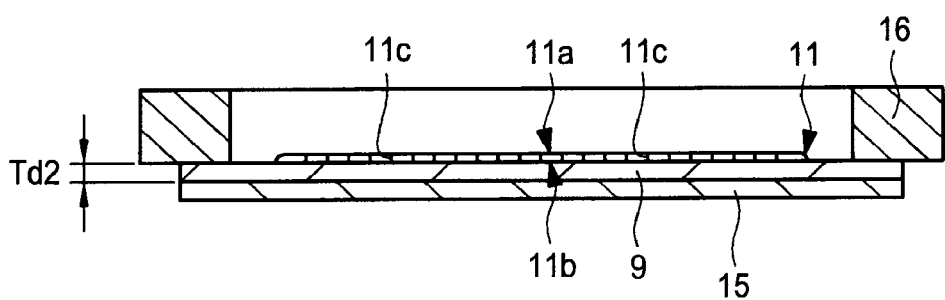
FIG. 18 is a sectional view illustrating an example of the structure of the thin semiconductor wafer illustrated in FIG. 16.
Figure 19:
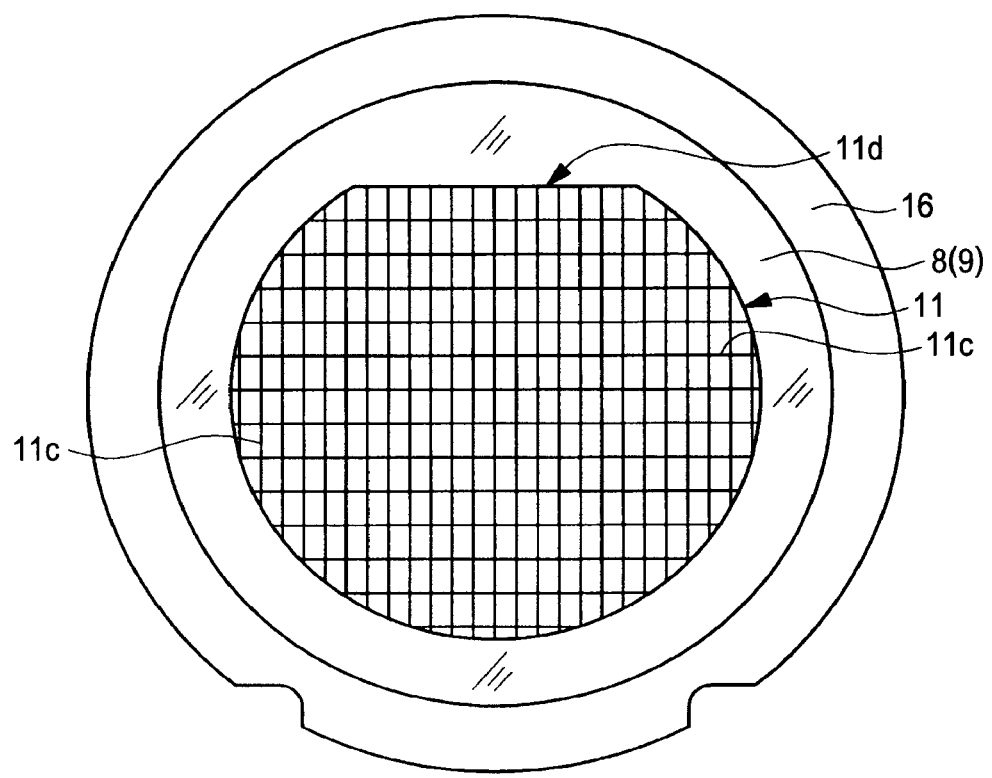
FIG. 19 is a plan view illustrating an example of the structure of a semiconductor wafer after DAF cutting in the assembly of the semiconductor device illustrated in FIG. 1.
Figure 20:
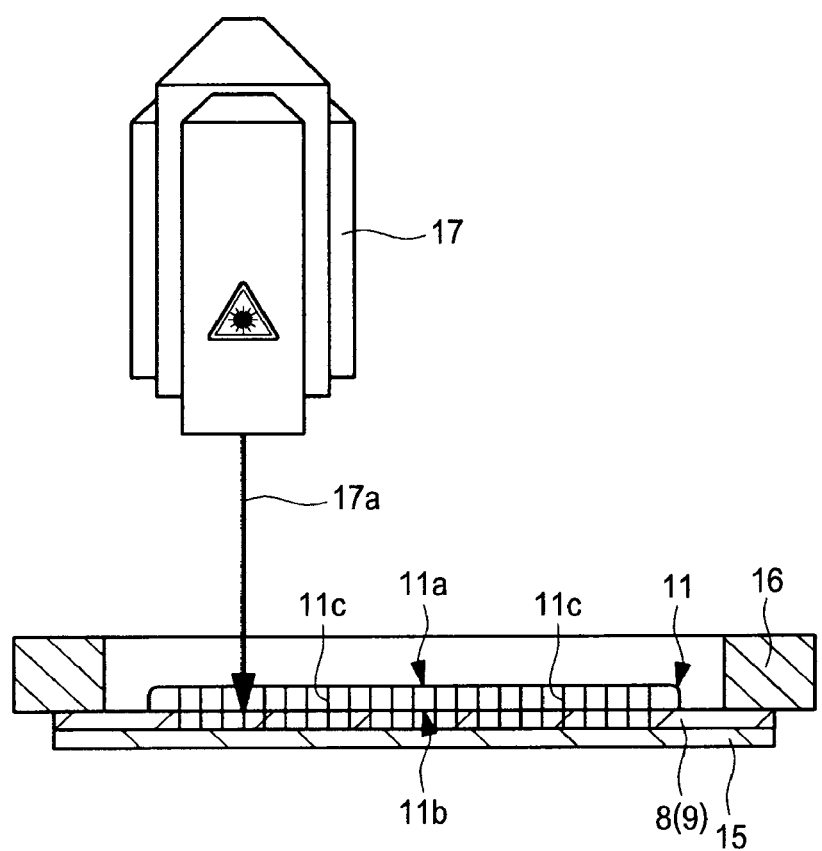
FIG. 20 is a sectional view illustrating an example of the structure of the semiconductor wafer illustrated in FIG. 19 during DAF cutting.
Figure 21:
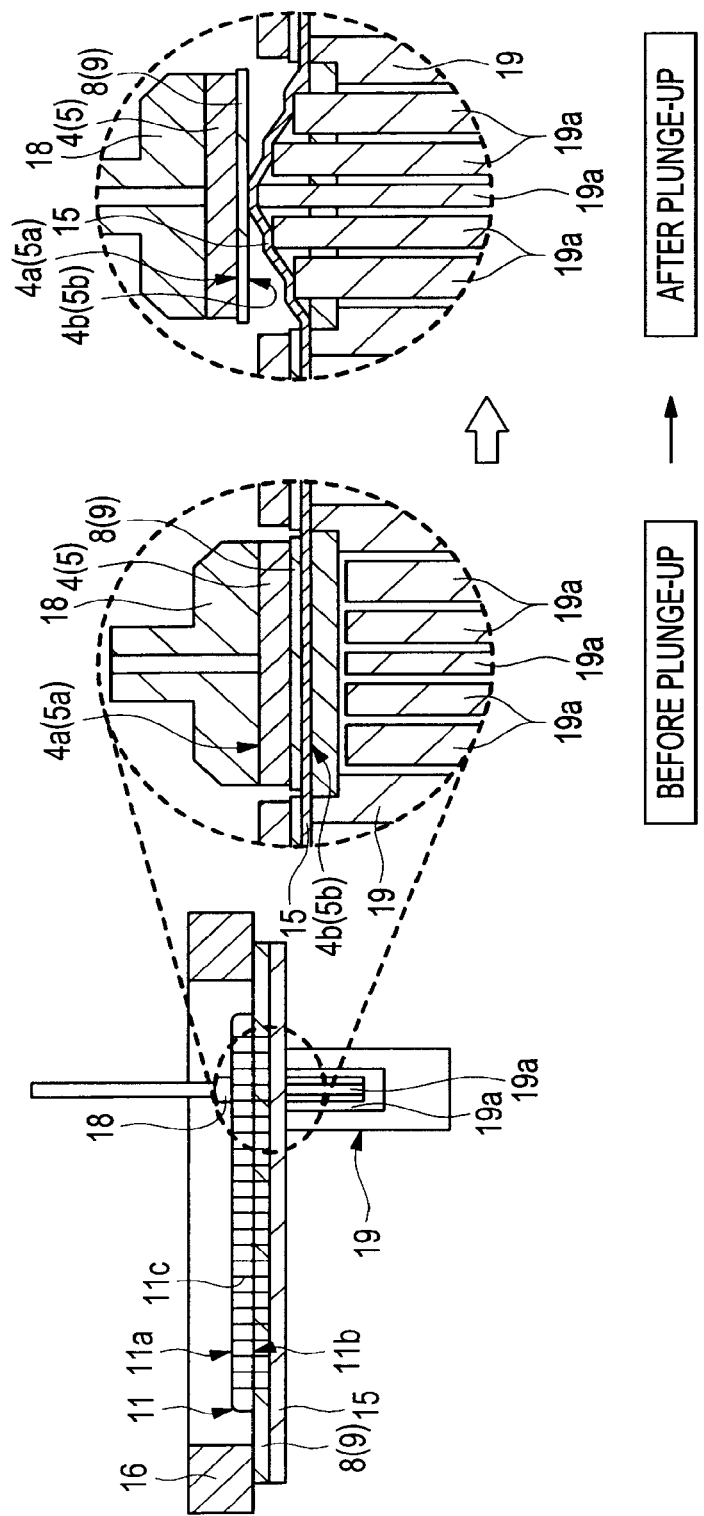
FIG. 21 is a sectional view illustrating an example of the structure of a semiconductor wafer during chip plunge-up at a pick-up step in the assembly of the semiconductor device illustrated in FIG. 1 and enlarged partial sectional views illustrating it before plunge-up and after plunge-up.
Figure 22:
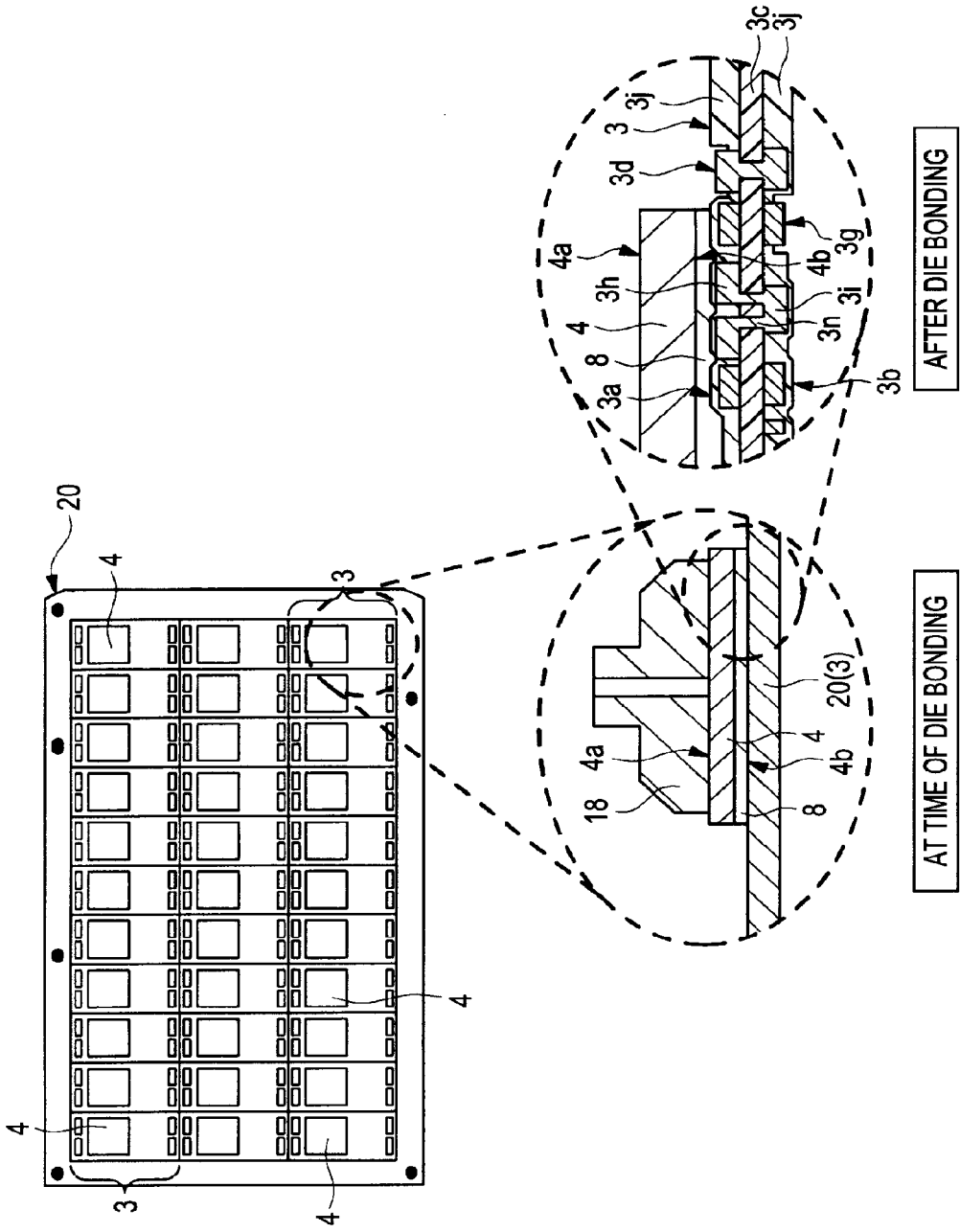
FIG. 22 is a plan view illustrating an example of the structure of a semiconductor wafer after die bonding for a first semiconductor chip at a die bonding step in the assembly of the semiconductor device illustrated in FIG. 1, an enlarged partial sectional view obtained at the time of pressing, and an enlarged partial sectional view obtained after pressing.
Figure 23:
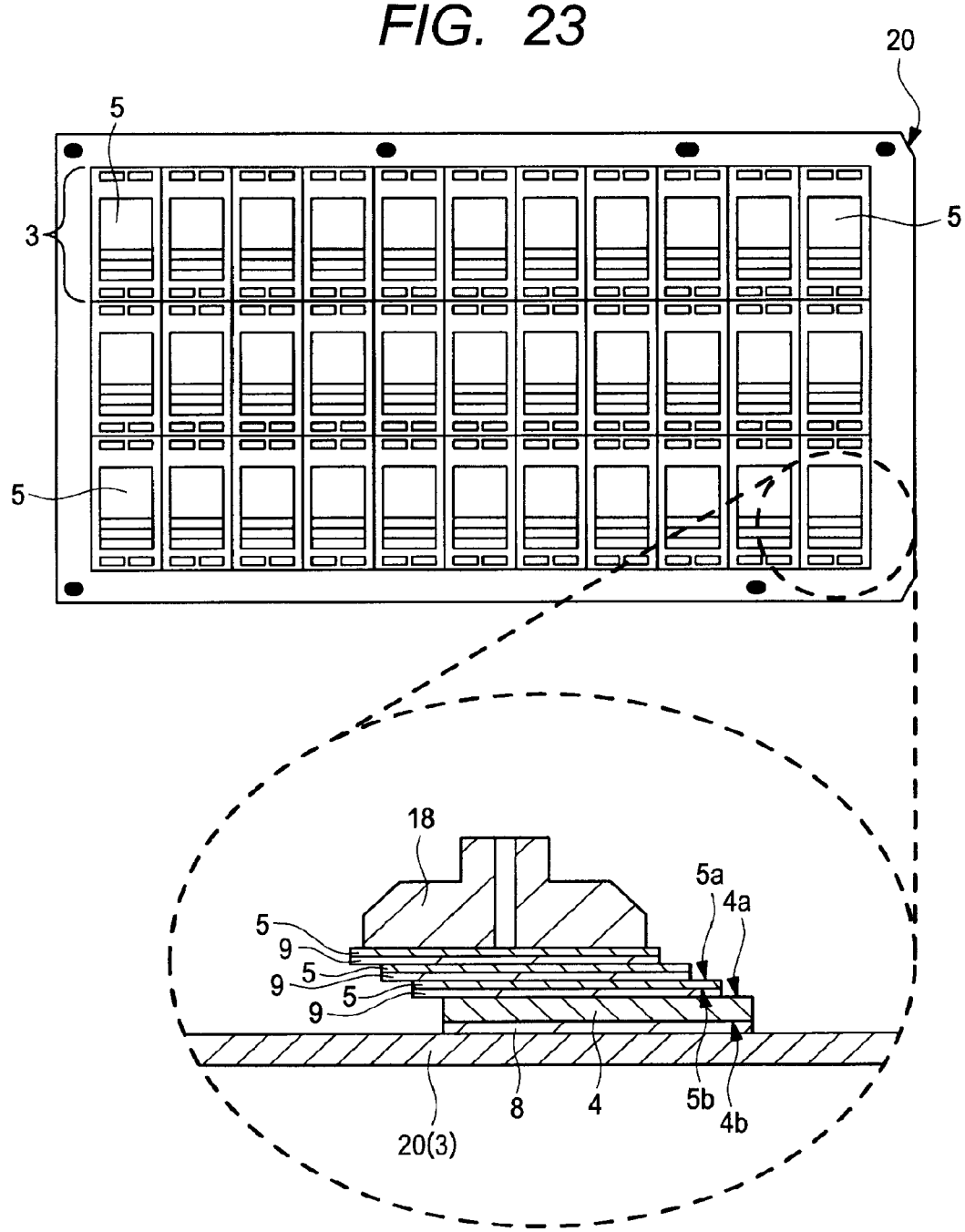
FIG. 23 is a plan view illustrating an example of the structure of a semiconductor wafer after die bonding for second semiconductor chips at the die bonding step in the assembly of the semiconductor device illustrated in FIG. 1 and an enlarged partial sectional view obtained at the time of pressing.

FIG. 9 is a plan view illustrating an example of the structure of a semiconductor wafer after dicing in the assembly of the semiconductor device illustrated in FIG. 1; FIG. 10 is a side view Illustrating an example of the structure of the semiconductor wafer illustrated in FIG. 9; FIG. 11 is a perspective view illustrating an example of a structure obtained at the time of dicing in the assembly of the semiconductor device illustrated in FIG. 1; and FIG. 12 is a plan view illustrating an example of the traveling direction of a blade in the dicing illustrated in FIG. 11. FIG. 13 is a plan view illustrating an example of the structure of a semiconductor wafer after back grind in the assembly of the semiconductor device illustrated in FIG. 1; FIG. 14 is a side view illustrating an example of the structure of the semiconductor wafer illustrated in FIG. 13; and FIG. 15 is a side view illustrating an example of the structure of the thin semiconductor wafer illustrated in FIG. 13. FIG. 16 is a plan view illustrating an example of a structure obtained after DAF and a dicing tape are stuck in the assembly of the semiconductor device illustrated in FIG. 1; FIG. 17 is a sectional view illustrating an example of the structure of the semiconductor wafer illustrated in FIG. 16; and FIG. 18 is a sectional view illustrating an example of the structure of the thin semiconductor wafer illustrated in FIG. 16. FIG. 19 is a plan view illustrating an example of a structure obtained after DAF is cut in the assembly of the semiconductor device illustrated in FIG. 1; FIG. 20 is a sectional view illustrating an example of the structure, illustrated in FIG. 19, obtained when DAF is cut; and FIG. 21 is a sectional view illustrating an example of a structure obtained at the time of chip plunge-up at a pick-up step in the assembly of the semiconductor device illustrated in FIG. 1 and enlarged partial sectional views obtained before plunge-up and after plunge-up. FIG. 22 is a plan view illustrating an example of a structure obtained after die bonding for a first semiconductor chip at a die bonding step in the assembly of the semiconductor device illustrated in FIG. 1 and an enlarged partial sectional view obtained at the time of pressing and an enlarged partial sectional view obtained after pressing; and FIG. 23 is a plan view illustrating an example of a structure obtained after die bonding for second semiconductor chips at a die bonding step in the assembly of the semiconductor device illustrated in FIG. 1 and an enlarged partial sectional view obtained at the time of pressing.

<<Dicing Step for Semiconductor Wafer>>

First, a semiconductor wafer 11 that is circular in planar shape and has a reference portion formed therein as illustrated in FIG. 9 is prepared. The reference portion is such an orientation flat 11d in the semiconductor wafer 11 as illustrated in FIG. 9 or such a notch 11e as illustrated in FIG. 12. It functions as a basis indicating the crystal orientation of silicon in the semiconductor wafer 11. The semiconductor wafer 11 used in this embodiment is so formed that the crystal orientation of silicon is matched with the X and Y-directions shown in FIG. 12 on the basis of this reference portion.

Thereafter, dicing is carried out on this semiconductor wafer 11 to segment it into each semiconductor chip. At this time, as illustrated in FIG. 11, the back surface 11b (Refer to FIG. 10) of the semiconductor wafer 11 is vacuum chucked with a vacuum stage 13 and a dicing blade 12 (grindstone) is run along the X and Y-directions. When the blade 12 is run in the Y-direction in FIG. 12, the blade 12 is advanced toward the reference portion (orientation flat 11d or notch 11e) to cut the wafer.

Description will be given to the reason for this.

At the dicing step in this embodiment, the semiconductor wafer 11 is cut using the blade 12 rotating at high speed. In the area of contact between the blade 12 and the semiconductor wafer 11, stress (cutting stress) is produced and a crack is prone to occur in this cut area.

As mentioned above, the reference portion indicating the crystal orientation of silicon is formed in the semiconductor wafer 11 as illustrated in FIG. 9 or FIG. 12. That is, the planar shape of the semiconductor wafer 11 is not a perfect circle. In proximity to the reference portion of the semiconductor wafer 11, internal stress become uneven when a thin film is formed in element formation. For this reason, stress produced when the area where the reference portion (orientation flat 11d, notch 11e) is formed is cut on the side lip of the semiconductor wafer 11 is different from stress produced when the other areas are cut. Specifically, stress produced when the area where the reference portion is formed is cut is larger than stress produced when the other areas are cut. For this reason, if the blade 12 is caused to enter from the reference portion side and advanced in such a direction that it goes away from the reference portion, a long (for example, several centimeters or so) microcrack is produced.

In this embodiment, to prevent this, the blade 12 is first run along the crystal orientation of silicon to dice the semiconductor wafer 11. As a result, even though stress (cutting stress) is produced in the area of contact between the blade 12 and the semiconductor wafer 11, it is possible to develop stress along the crystal orientation and suppress cracking.

In dicing in the Y-direction shown in FIG. 12, the blade 12 is advanced toward the reference portion (orientation flat 11d or notch 11e) to cut the wafer. As a result, when the blade 12 is caused to enter from the side farther from the reference portion and dicing is carried out toward the side closer to the reference portion, a microcrack can be suppressed short (to several millimeters or so). Even though cutting stress larger than stress produced when the other areas are cut is produced in the area where the reference portion is formed, no problem arises. Since the semiconductor wafer 11 has been already cut, cracking in the semiconductor wafer 11 caused by the influence of this large stress can be suppressed. The principle behind this can be explained by that the growth of chip cracks is concentrated in the direction of strain (absorbed in grooves that have already undergone dicing).

Detailed description will be given to a dicing method of advancing the blade 12 toward the reference portion with reference to FIG. 12.

First, each part in the semiconductor wafer 11 will be defined. The center of the semiconductor wafer 11 forming a circle will be taken as center point 11f; the straight line (center line) connecting the notch 11e as the reference portion (reference point) and the center point 11f of the semiconductor wafer 11 will be taken as first straight line 11m; and the straight line (center line) orthogonal to the first straight line 11m and running through the center point 11f of the semiconductor wafer 11 will be taken as second straight line 11n. The side 11p on the periphery of the semiconductor wafer 11 is so formed that it substantially draws a circle. Therefore, the side 11p includes a first portion 11g opposite to the notch 11e with respect to the second straight line 11n and a second portion 11i (reference portion side) other than the first portion 11g.

An arbitrary point in the first portion 11g on the side lip will be taken as first point 11h and the following point will be taken as second point 11j: a point positioned in the second portion 11i on the side lip and opposed to the first point 11h with the second straight line 11n in between in a first direction 11k along the first straight line 11m (or on an imaginary line parallel with the first straight line 11m).

At the dicing step for the semiconductor wafer 11 under these definitions, the blade 12 is advanced as described below. In dicing in the first direction 11k along the first straight line 11m connecting the notch 11e (or the orientation flat 11d) and the center point 11f of the semiconductor wafer 11, it is advanced from the first point 11h to the second point 11j. As mentioned above, the first point 11h is positioned in the first portion 11g on the side lip of the semiconductor wafer 11; and the second point 11j is positioned in the second portion 11i on the side lip and opposed to the first point 11h in the first direction 11k with the second straight line 11n in between. The second straight line 11n is orthogonal to the first straight line 11m and runs through the center point 11f of the semiconductor wafer 11.

That is, at the dicing step for the semiconductor wafer 11 (step for acquiring semiconductor chips), the following procedure is taken in dicing in the Y-direction shown in FIG. 12: the blade 12 is advanced from the first point 11h to the second point 11j to cut the semiconductor wafer 11.

As mentioned above, dicing is carried out by advancing the blade 12 from the first point 11h on the side farther from the notch 11e to the second point 11j on the side closer to the notch 11e. As a result, dicing can be carried out along the crystal orientation of silicon in the semiconductor wafer 11. Therefore, it is possible to reduce stress produced at cut portions of the semiconductor wafer 11 at this dicing step. For this reason, even though the thickness of the semiconductor wafer 11 is reduced, chip cracking arising from dicing can be reduced or prevented.

In dicing in the direction (X-direction shown in FIG. 12) intersecting with the first direction 11k, the blade 12 may be advanced in any direction because a reference portion is not formed.

Up to this point, description has been given to that cracking in the semiconductor wafer 11 can be suppressed by the direction in which the blade 12 is run. In this embodiment, a so-called preceding dicing method is adopted. In this method, a dicing step is carried out prior to a back grind step for the semiconductor wafer 11 (step for thinly grinding the wafer).

Description will be given to the preceding dicing method. As illustrated in FIG. 10, cuts extended from the front surface 11a to the intermediate portion of the semiconductor wafer 11 are formed by the blade 12. In other words, a slight uncut portion is left by preventing the blade 12 from reaching the back surface 11b of the semiconductor wafer 11. At this time, a gap is formed between adjacent semiconductor chips. Thereafter, the back grind step is carried out from the back surface 11b side of the semiconductor wafer 11 to reduce the thickness of the semiconductor wafer 11. When the back grind step is carried out until the cuts are reached, multiple semiconductor chips can be obtained.

According to the preceding dicing method, as mentioned above, the dicing step can be carried out with the semiconductor wafer 11 large in thickness. Even though cutting stress is produced at the dicing step, therefore, the occurrence of chip cracking due to this dicing can be reduced or prevented because the strength of the semiconductor wafer 11 is large.

That is, the occurrence of chip cracking at the dicing step can be reduced or prevented by adopting only the preceding dicing method without applying the above-mentioned technology related to the traveling direction of the blade 12. Therefore, the above-mentioned technology related to the traveling direction of the blade 12 need not necessarily be adopted.

<<Back Grind Step for Semiconductor Wafer>>

Subsequently, the thickness of the diced semiconductor wafer 11 illustrated in FIG. 13 is reduced to a desired thickness by back grind.

At this back grind step, the following procedure is taken as illustrated in FIG. 14 and FIG. 15 to protect the semiconductor elements (not shown) formed in the front surface 11a of the semiconductor wafer 11: first, a back grind tape 14 is stuck to the front surface 11a of the semiconductor wafer 11; and thereafter, a grindstone (not shown) is pressed against the back surface 11b of the semiconductor wafer 11 to grind the semiconductor wafer 11. In the LGA 1 in the first embodiment, semiconductor chips of two different thicknesses are placed as illustrated in FIG. 4. Therefore, the following wafers are formed by this back grind step: a semiconductor wafer having a first thickness (Tw1) illustrated in FIG. 14 and a semiconductor wafer having a second thickness (Tw2) smaller than the first thickness illustrated in FIG. 15. The thickness Tw1 is within a range of 0.040 to 0.200 mm, and in this embodiment, the thickness TW1 is 0.055 mm. The thickness Tw2 is within a range of 0.010 to 0.030 mm, and in this embodiment, the thickness Tw2 is 0.020 mm.

In this embodiment, the dicing step for the semiconductor wafer 11 is carried out prior to the back grind step. Therefore, multiple semiconductor chips 4, 5 are obtained by this back grind step. However, these semiconductor chips 4, 5 are held by the back grind tape 14 on the main surface (front surface, upper surface) 4a, 5a side; therefore, even though it is divided into multiple semiconductor chips, they do not scatter.

<<Re-Stacking to Dicing Tape>>

Subsequently, the tape on each back ground semiconductor wafer 11 is changed and each semiconductor wafer 11 that underwent the back grind step is arranged inside a wafer ring 16 as illustrated in FIG. 16.

More detailed description will be given. First, a dicing tape 15 with the adhesive layer 8 having a first thickness formed thereover is prepared. Over this dicing tape 15, the wafer ring 16 circular in planar shape and formed in an annular shape (ring shape) is fixed with the adhesive layer 8 in between. The semiconductor wafer 11 having the first thickness (Tw1) is fixed over the adhesive layer 8 so that the semiconductor wafer 11 is positioned inside the wafer ring 16 and the back surface 11b of the semiconductor wafer 11 is opposed to the adhesive layer 8. Though not shown in the drawings, thereafter, the back grind tape 14 stuck to the front surface 11a of the semiconductor wafer 11 is stripped off and the state illustrated in FIG. 17 is obtained.

This is the same with the semiconductor wafer 11 having the second thickness (Tw2). First, a dicing tape 15 including the adhesive layer 9 having a second thickness and the wafer ring 16 fixed through this adhesive layer 9 is prepared. Then the semiconductor wafer 11 having the second thickness (Tw2) is fixed over the adhesive layer 9 so that the semiconductor wafer 11 is positioned inside the wafer ring 16 and the back surface 11b of the semiconductor wafer 11 is opposed to the adhesive layer 9. Though not shown in the drawings, thereafter, the back grind tape 14 stuck to the front surface 11a of the semiconductor wafer 11 is stripped off and the state illustrated in FIG. 18 is obtained.

<<Die Bonding Step for First Tier to Fourth Tier>>

Subsequently, the adhesive layer (DAF) is cut with a laser dicer 17 as illustrated in FIG. 19 and FIG. 20 before each of the acquired semiconductor chips is picked up from the dicing tape 15. At this time, a laser 17a is applied along the gaps formed by the above-mentioned dicing step for semiconductor wafers and only the adhesive layer (first adhesive layer 8, second adhesive layer 9) is cut so that the dicing tape 15 is not damaged. As a result, the adhesive layer 8, 9 is cut in accordance with the outside shape of each semiconductor chip 4, 5.

As illustrated in FIG. 21, subsequently, the plunge-up blocks 19a of a plunge-up unit 19 are pressed against the first back surface 4b of each semiconductor chip 4 (to plunge it up) with the dicing tape 15 and the adhesive layer 8 in between. This processing is carried out with the main surface 4a of the semiconductor chip vacuum chucked with a collet 18. The plunge-up blocks 19a are of multiple-stage plunge-up type. As illustrated in the sketch of "AFTER PLUNGE-UP" in FIG. 21, a chip is gradually pushed up from the peripheral portion toward the center of the first back surface 4b of the first semiconductor chip 4 to peel it away from the dicing tape 15. Even in case of thin-type semiconductor chip, for this reason, damage to the chip can be further reduced.

In the first embodiment, the above-mentioned multiple-stage plunge-up is carried out on all the semiconductor chips including the first semiconductor chips 4 and the second semiconductor chips 5.

Then the semiconductor chip 4, 5 held by the collet 18 is placed over the wiring board 3 or over a previously placed semiconductor chip. In the LGA 1 in the first embodiment, the following procedure is taken when semiconductor chips are laminated in 16 tiers as illustrated in FIG. 4: the first semiconductor chip 4, or the thick-type chip, is placed only in the requiring tiers and the second semiconductor chip 5, or the thin-type chip, is placed in the other tiers. The thickness of the 16-tiered laminate is thereby reduced to achieve reduction in the thickness of the LGA 1.

More detailed description will be given. The first semiconductor chip 4 having the first thickness (Tw1) is placed as the chip in the first (lowermost) tier over the upper surface 3a of the wiring board 3. Over the first semiconductor chip 4, there is formed the adhesive layer 8 having the first thickness. The wiring board 3 used in this embodiment is from a multiple substrate 20 having multiple device areas as illustrated in FIG. 22 and the above-mentioned bonding leads 3e, 3f (Refer to FIG. 7) are formed in each device area. In this embodiment, this die bonding step is carried out on each device area.

Figure 35:
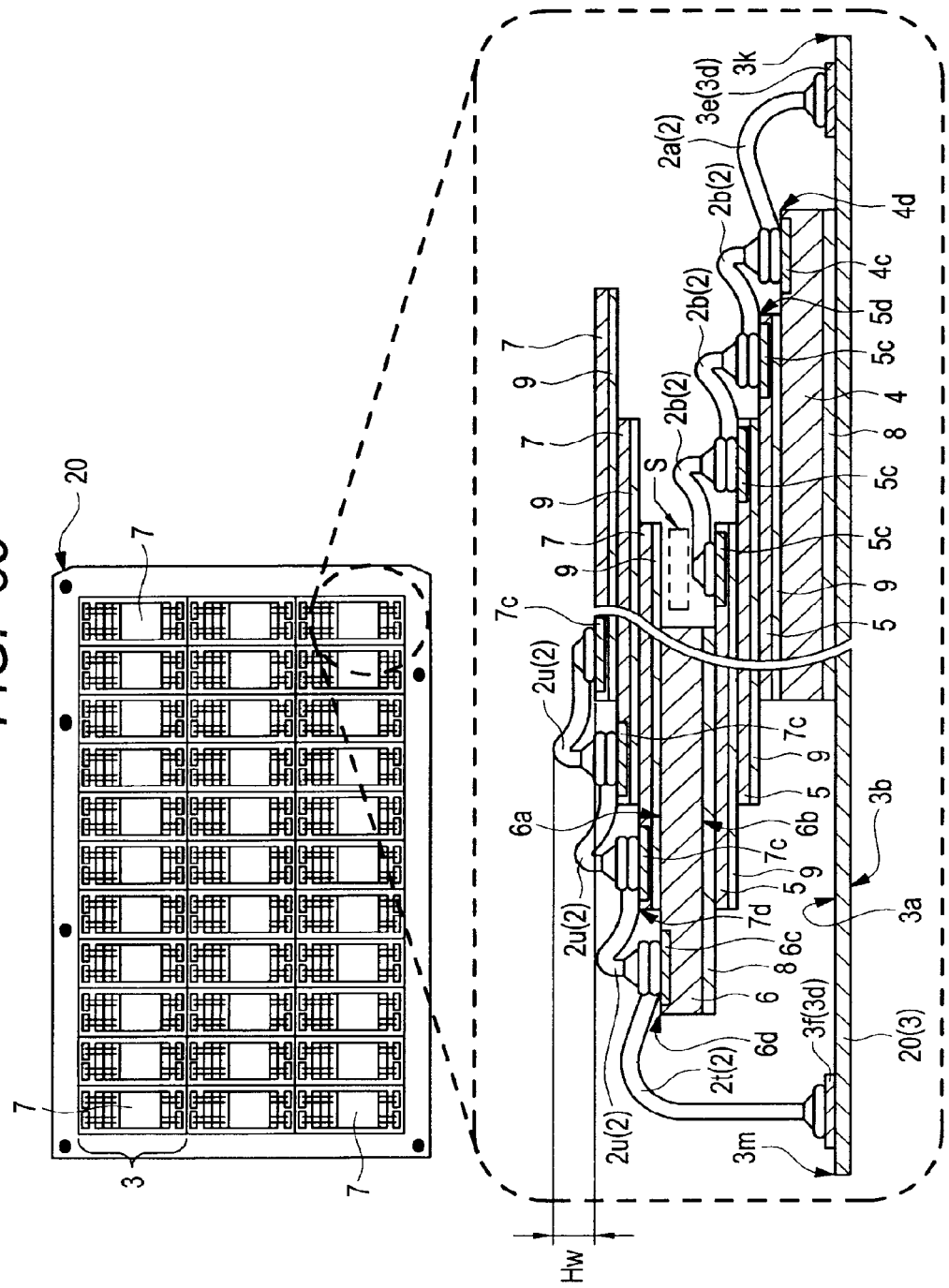
FIG. 35 is a plan view illustrating an example of the structure of a semiconductor wafer after wire bonding after turn-back lamination in the assembly of the semiconductor device in FIG. 1 and a corresponding enlarged partial sectional view.

At this time, as illustrated in FIG. 35, the semiconductor chip 4 in the first tier is arranged (placed) over the upper surface 3a of the wiring board 3 so that the following is implemented: the first chip side (the side on which the multiple bonding pads 4c are arranged) 4d of the first semiconductor chip 4 faces toward one side (first board side) 3k of the two short sides of the wiring board 3; and the semiconductor chip 4 is positioned in the device area (the upper surface 3a of the wiring board 3) as viewed in a plane. In other words, the first semiconductor chip 4 in the first tier (lowermost tier) is arranged (placed) over the upper surface 3a of the wiring board 3 so that the following is implemented: the distance between the first chip side 4d and the first board side 3k is shorter than the distance between the first chip side 4d (or the chip side (the other short side) opposed to the first chip side 4d) and the second board side 3m. In other words, the first semiconductor chip 4 in the first tier (lowermost tier) is arranged (placed) over the upper surface 3a of the wiring board 3 so that the first chip side 4d is arranged closer to the first board side 3k than to the second board side 3m. In addition, the first semiconductor chip 4 is placed so that the arranged first bonding pads 4c thereof are lined adjacently to the arranged first bonding leads 3e of the wiring board 3.

As mentioned above, the first semiconductor chip 4 with the thick first adhesive layer 8 stuck thereto is placed in the lowermost tier. As a result, the unevenness in the upper surface 3a of the wiring board 3 can be absorbed by the first adhesive layer 8. More specific description will be given. In the area in the upper surface 3a of the wiring board 3 that planarly overlaps with the first semiconductor chip 4, there are formed such multiple wiring patterns (upper surface-side wiring layer 3h) as illustrated in FIG. 8. Because of the presence or absence of this upper surface-side wiring layer 3h, resulting steps in the solder resist film 3j, an opening in the solder resist film 3j, and the like, the unevenness is formed. Therefore, use of the thick first adhesive layer 8 as the adhesive layer in the lowermost tier makes it possible to implement the following: the unevenness in the wiring board 3 is absorbed and the adhesive strength between the wiring board 3 and the first adhesive layer 8 is enhanced.

Further, the first semiconductor chip 4 also has a sufficient thickness; therefore, it maintains strength sufficient to ensure the flatness of the first back surface 4b of the first semiconductor chip 4. As a result, the flatness of the first front surface 4a of the first semiconductor chip 4 can be ensured to enhance the die bondability of the semiconductor chip in the second tier.

As illustrated in FIG. 23, subsequently, a die bonding step is carried out for the second tier to the fourth tier.

In this example, the second semiconductor chips 5 are used in the second to fourth tiers. The second semiconductor chip 5 is thinner than the first semiconductor chip 4 and the second adhesive layer 9 thinner than the first adhesive layer 8 is stuck to the second back surface 5b thereof. At the time of die bonding for the second semiconductor chips 5, they are arranged (laminated) over the first semiconductor chip 4 so that the following is implemented: as illustrated in FIG. 35, the distance between the second chip side 5d of each second semiconductor chip and the first board side 3k is shorter than the following distance when the second semiconductor chip 5 is viewed in a plane: the distance between the second chip side 5d (or the chip side (the other short side) opposed to the second chip side 5d) and the second board side 3m. In other words, the second semiconductor chips 5 are arranged (laminated) over the first semiconductor chip 4 so that the following is implemented: their respective second chip sides 5d are arranged closer to the first board side 3k than to the second board side 3m and the multiple first bonding pads 4c are exposed from the second semiconductor chips 5. That is, the second semiconductor chips 5 are laminated (placed) stepwise with their lamination directions matched with that of the semiconductor chip 4 in the first tier so that the following is implemented: the second chip side (side on which multiple bonding pads 5c are arranged) 5d of each second semiconductor chip 5 faces toward one side (first board side) 3k of the two short sides of the wiring board 3; and the semiconductor chips 5 are positioned in the device area (the upper surface 3a of the wiring board 3) as viewed in a plane.

As mentioned above, the flatness of the first front surface 4a of the first semiconductor chip 4 in the first tier is ensured. Therefore, even when the second semiconductor chip 5 thinner than the first semiconductor chip 4 is used, the adhesive strength can be obtained in the second tier to the fourth tier. This makes it possible to reduce the thickness of the LGA 1.

In die bonding for the second semiconductor chips 5, the second semiconductor chip 5 in the second tier is arranged over the first semiconductor chip 4 so that the following is implemented: the arranged second bonding pads 5c thereof are lined adjacently to the arranged first bonding pads 4c of the first semiconductor chip 4 in the lower tier; and the first bonding pads 4c are exposed from the second semiconductor chip 5.

More specific description will be given. When the second semiconductor chips 5 in the second and following tiers (the second to fourth tiers) are laminated, the following measure is taken: the semiconductor chips are shifted stepwise at every tier and laminated so that the bonding pad row of the semiconductor chip in the next lower tier are exposed. That is, the semiconductor chips in the lowermost tier to the fourth tier are laminated stepwise so that their lamination directions are identical and the respective bonding pads of the individual semiconductor chips are arranged on the same side.

In the third tier and the fourth tier, the second semiconductor chips 5, or the thin-type chips, are used to reduce the thickness of the entire laminate and laminated by the same lamination method as for the second tier. This completes the die bonding for the first tier to the fourth tier as illustrated in FIG. 23.

<<Wire Bonding Step for First Tier to Fourth Tier>>

Subsequently, wire bonding is carried out for the first tier to the fourth tier. At every wire bonding step carried out in the assembly of the LGA 1, the reverse bonding method is used.

Figure 24:
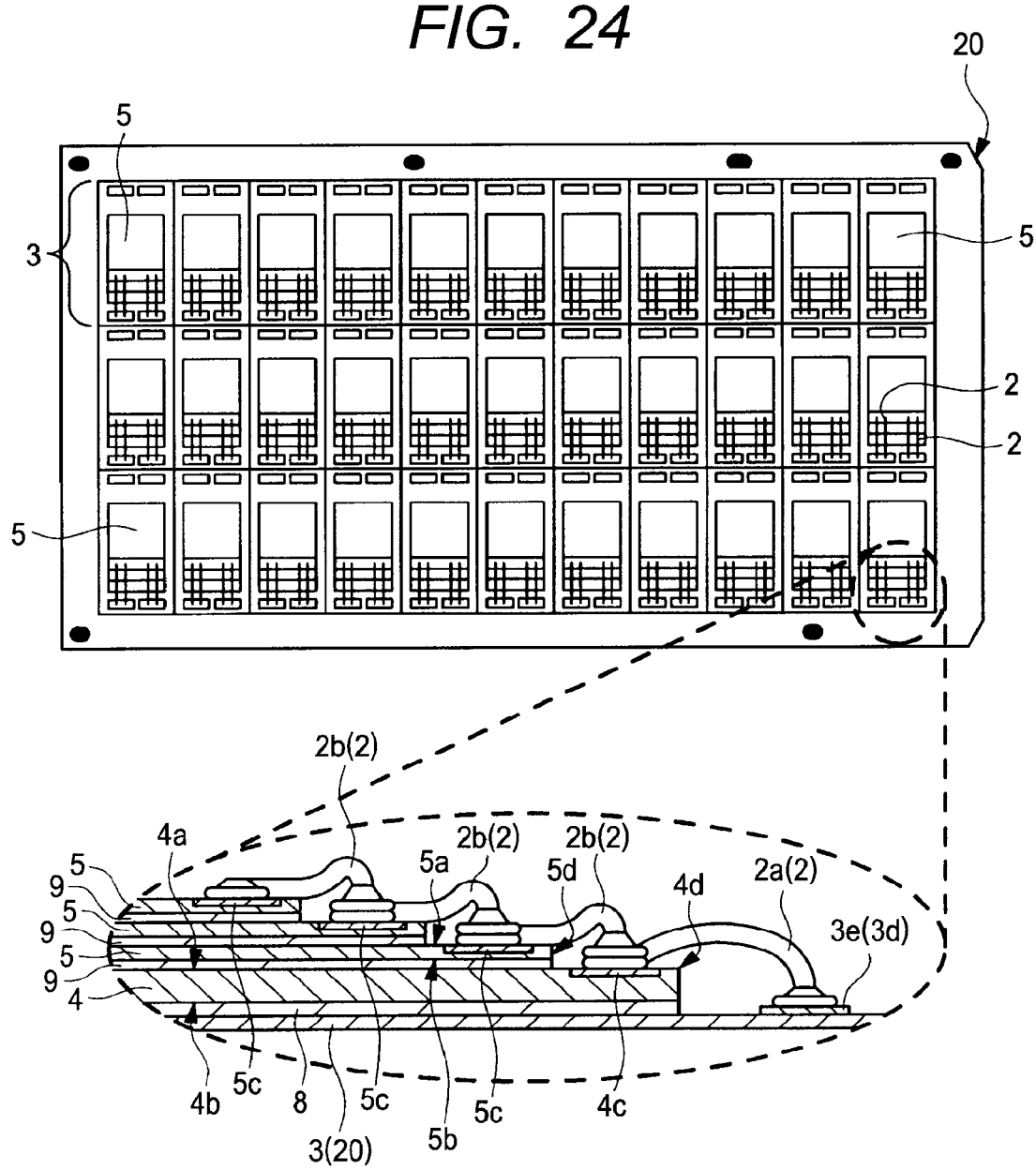
FIG. 24 is a plan view illustrating an example of the structure of a semiconductor wafer after wire bonding at a wire bonding step in the assembly of the semiconductor device illustrated in FIG. 1 and a corresponding enlarged partial sectional view.
Figure 25:
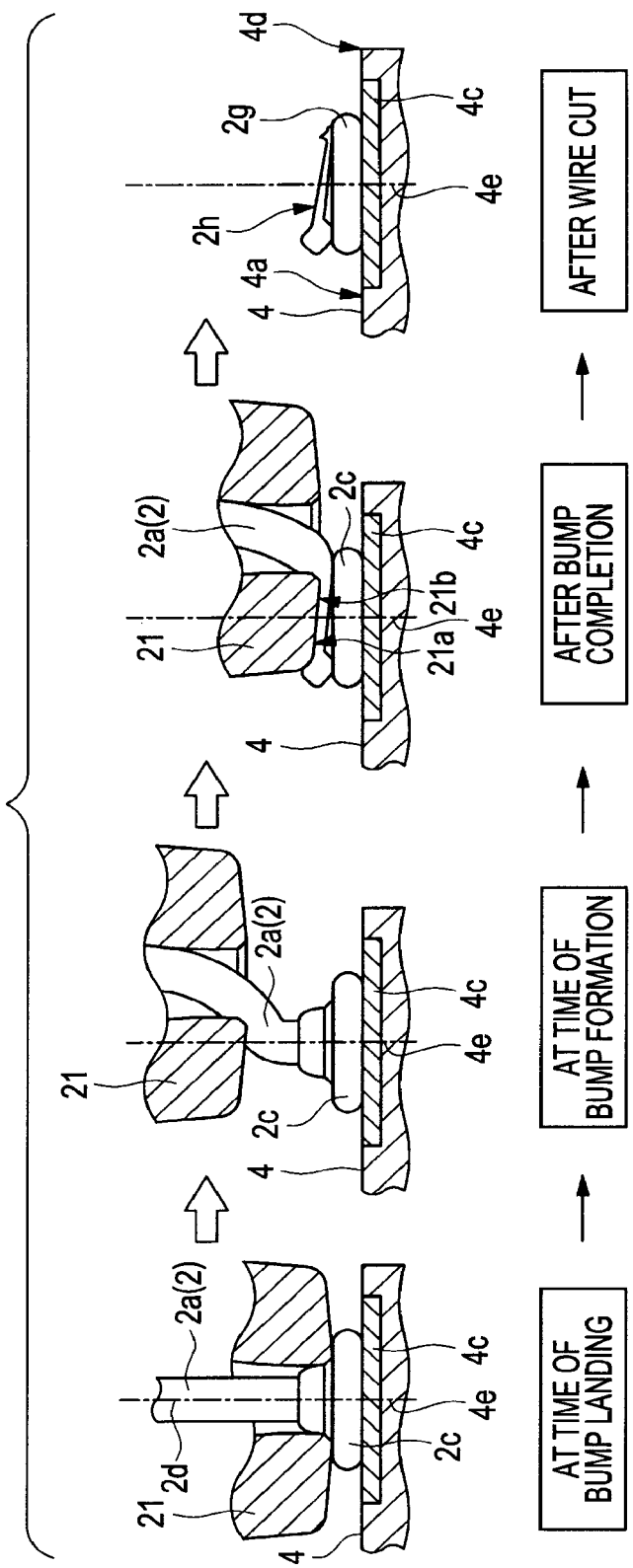
FIG. 25 is a partial sectional view illustrating an example of a formation method for a first bump electrode at a wire bonding step in the assembly of the semiconductor device illustrated in FIG. 1.
Figure 26:
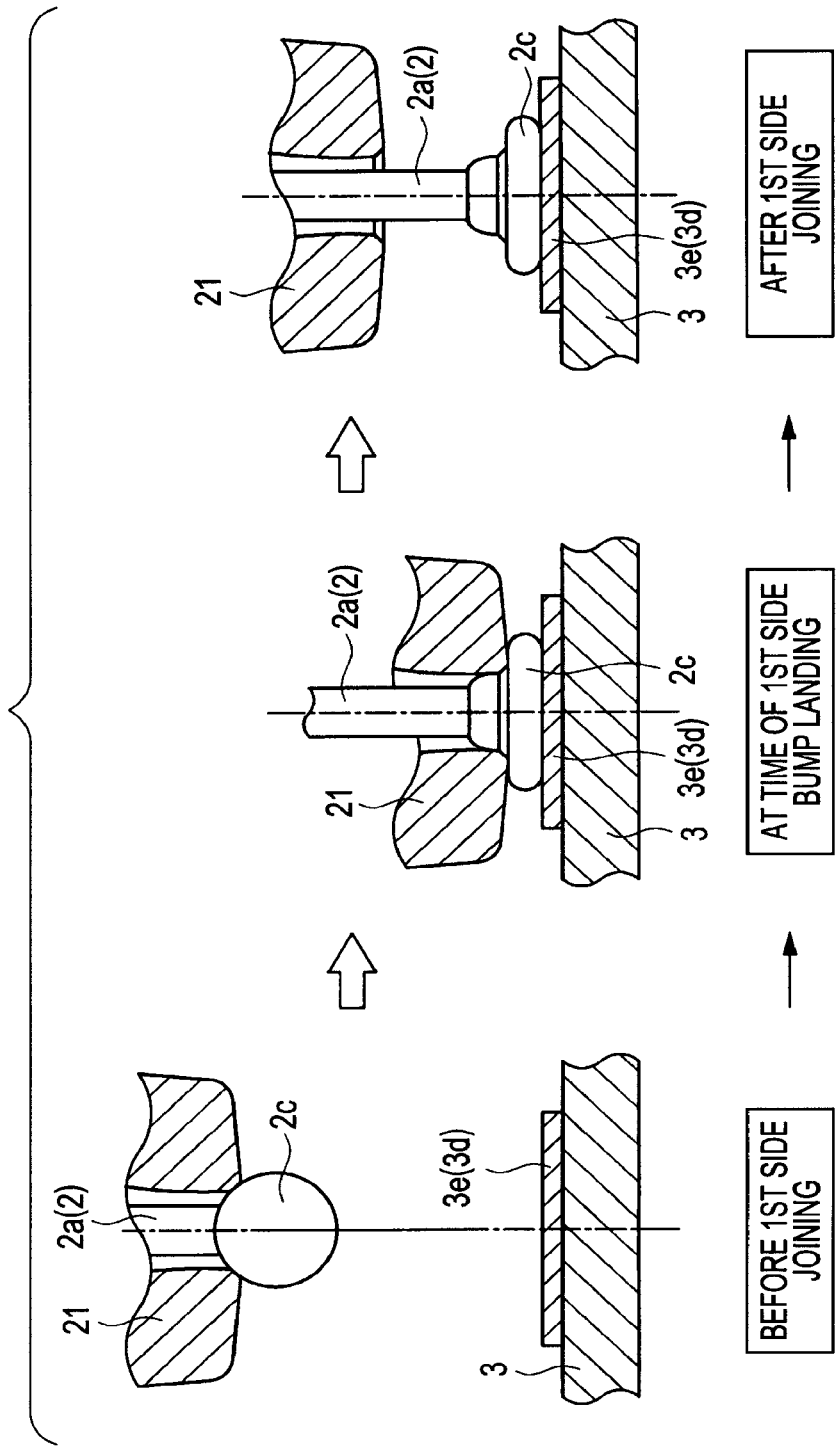
FIG. 26 is a partial sectional view illustrating an example of a wire bonding method for the 1st side at a wire bonding step in the assembly of the semiconductor device illustrated in FIG. 1.
Figure 27:
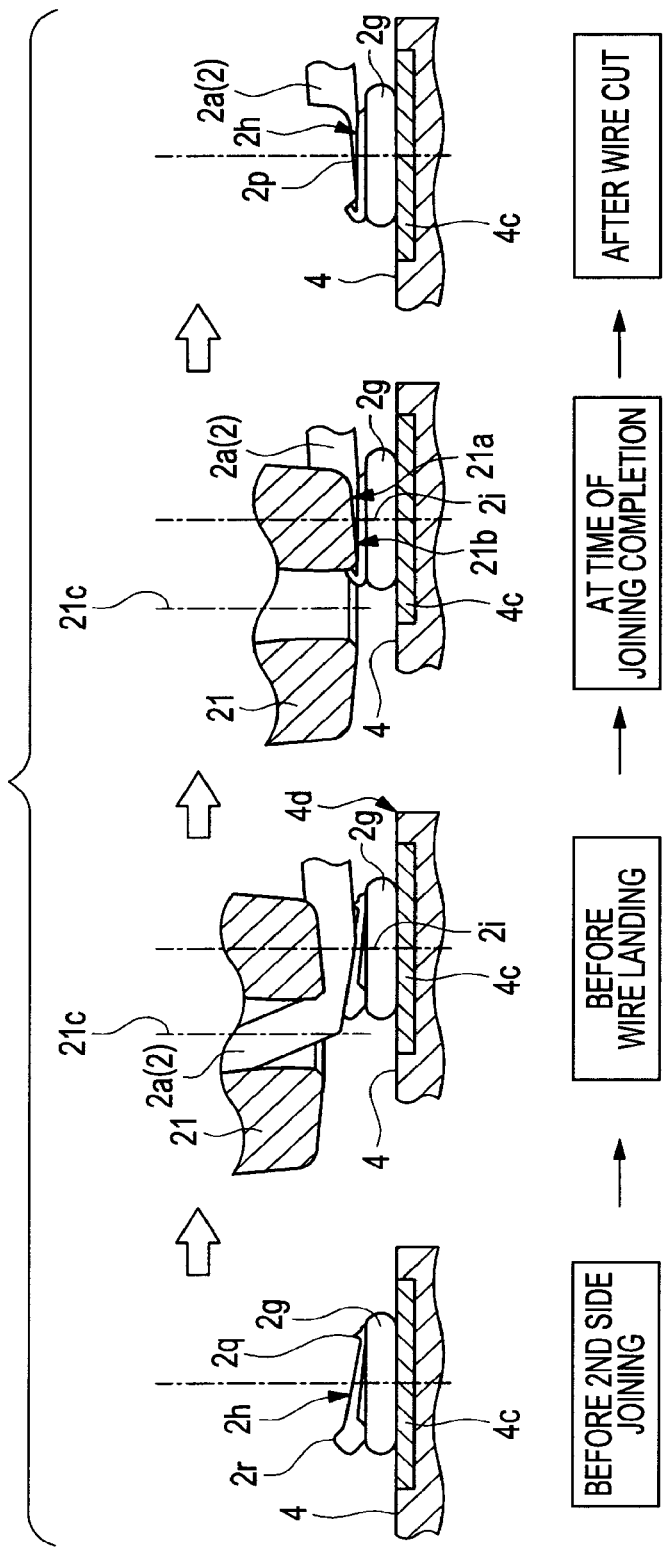
FIG. 27 is a partial sectional view illustrating an example of a wire bonding method for the 2nd side at a wire bonding step in the assembly of the semiconductor device illustrated in FIG. 1.
Figure 28:
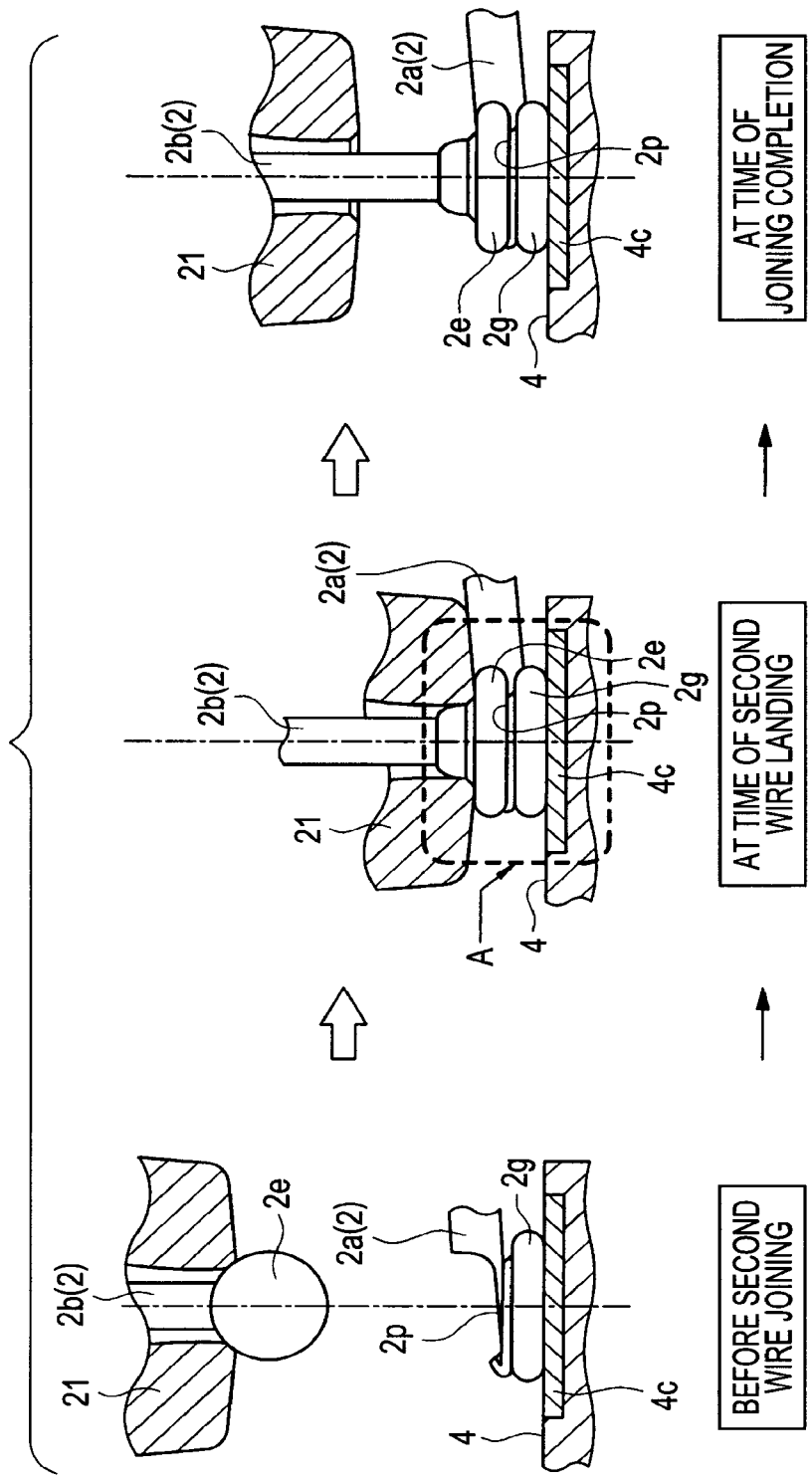
FIG. 28 is a partial sectional view illustrating an example of a bonding method for a second wire on the 2nd side at a wire bonding step in the assembly of the semiconductor device illustrated in FIG. 1.
Figure 29:
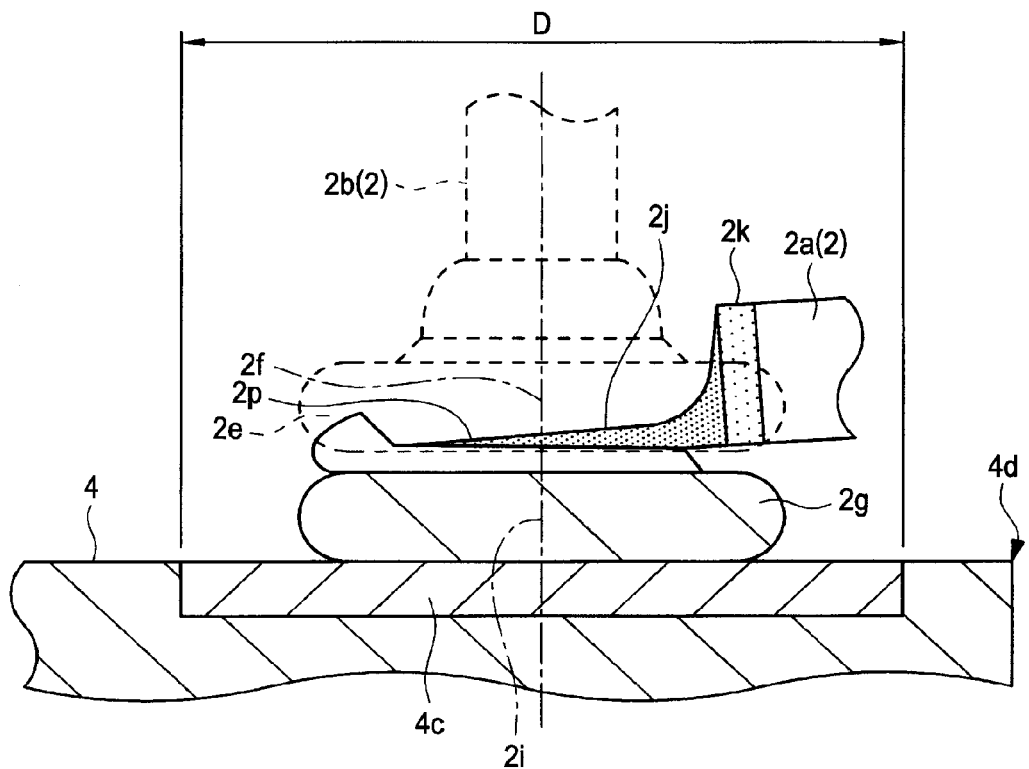
FIG. 29 is an enlarged partial sectional view illustrating an example of the structure of A site shown in FIG. 28.
Figure 30:
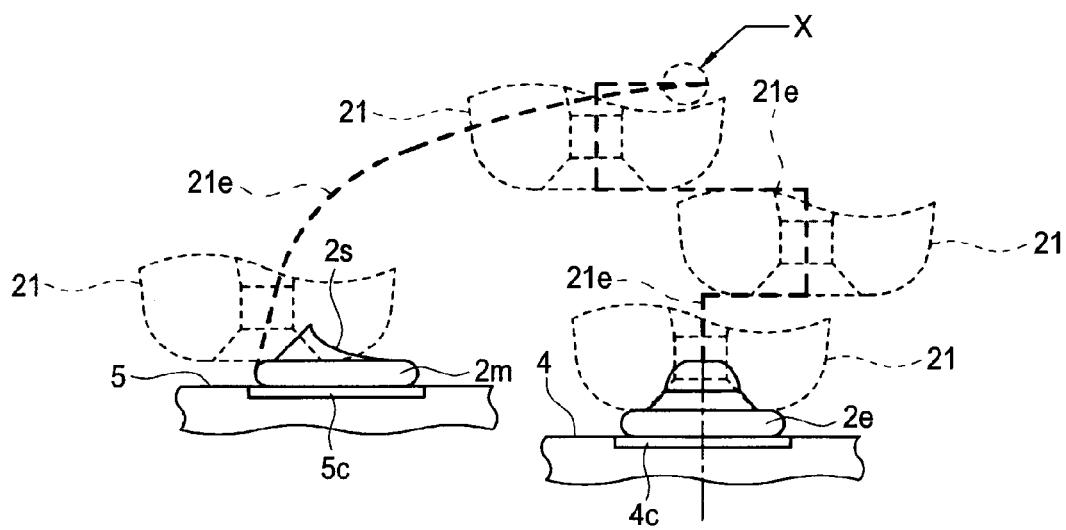
FIG. 30 is a conceptual diagram illustrating an example of the path of a capillary at a wire bonding step in the assembly of the semiconductor device illustrated in FIG. 1.
Figure 31:
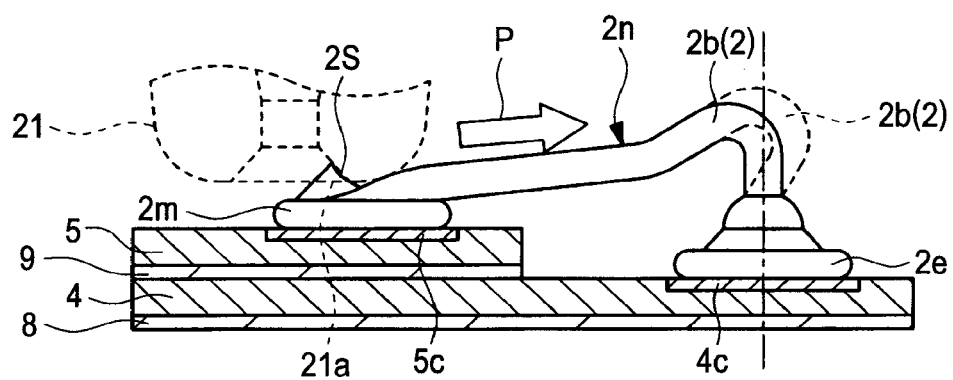
FIG. 31 is a sectional view illustrating an example of a structure wired along the path of a capillary illustrated in FIG. 30.
Figure 32:
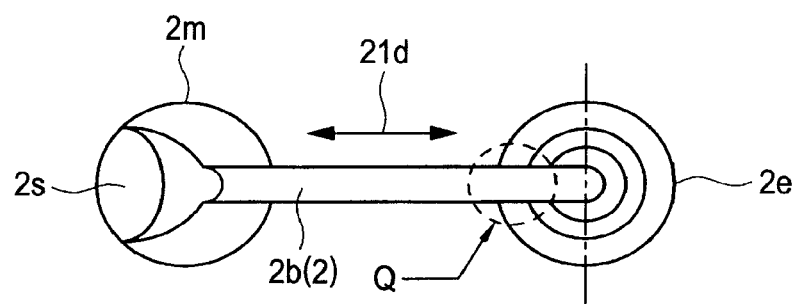
FIG. 32 is a plan view illustrating an example of the wiring structure illustrated in FIG. 31.
Figure 33:
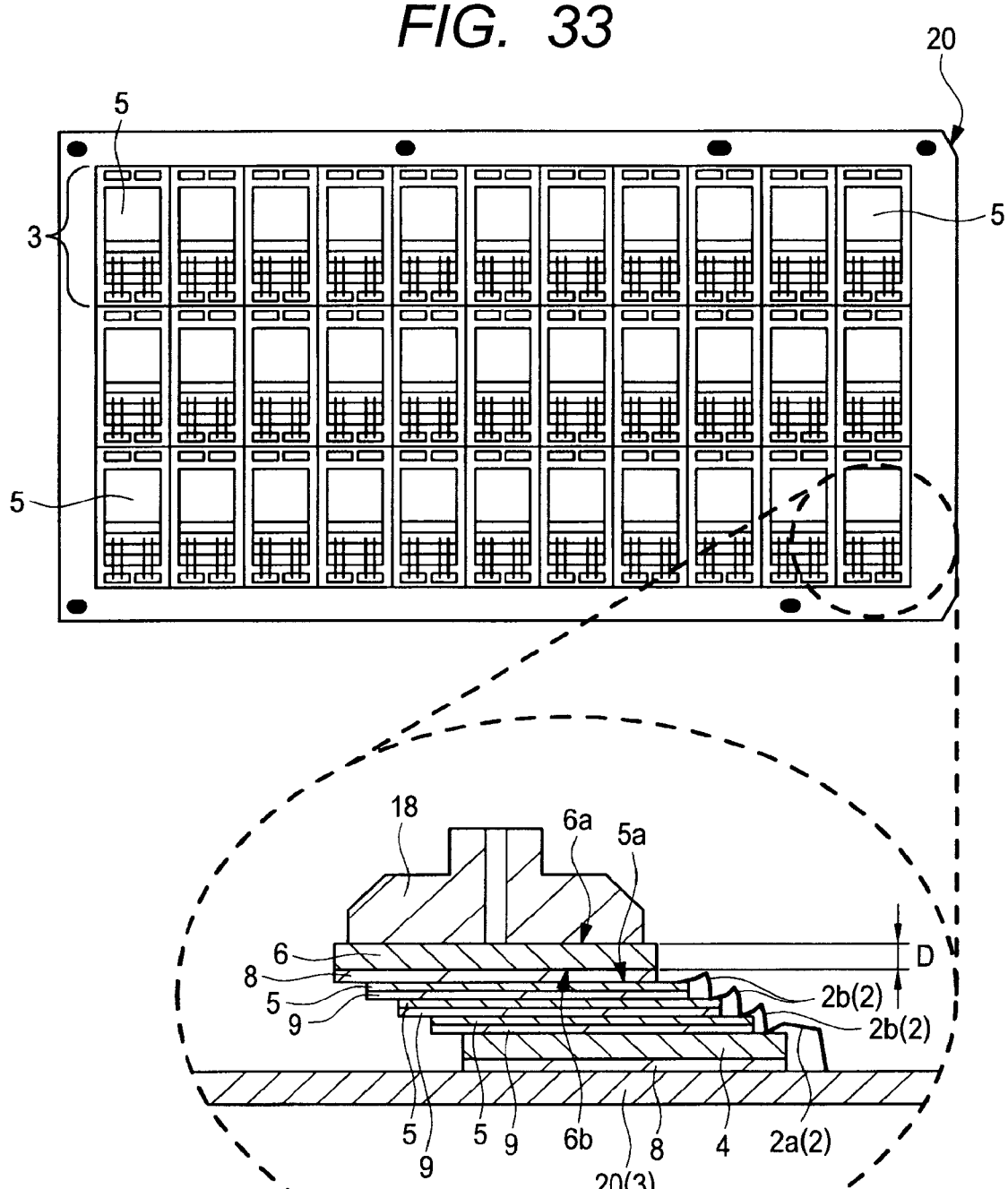
FIG. 33 is a plan view illustrating an example of the structure of a semiconductor wafer after die bonding for a first semiconductor chip at the time of turn-back lamination in the assembly of the semiconductor device in FIG. 1 and an enlarged partial sectional view obtained at the time of pressing.
Figure 34:
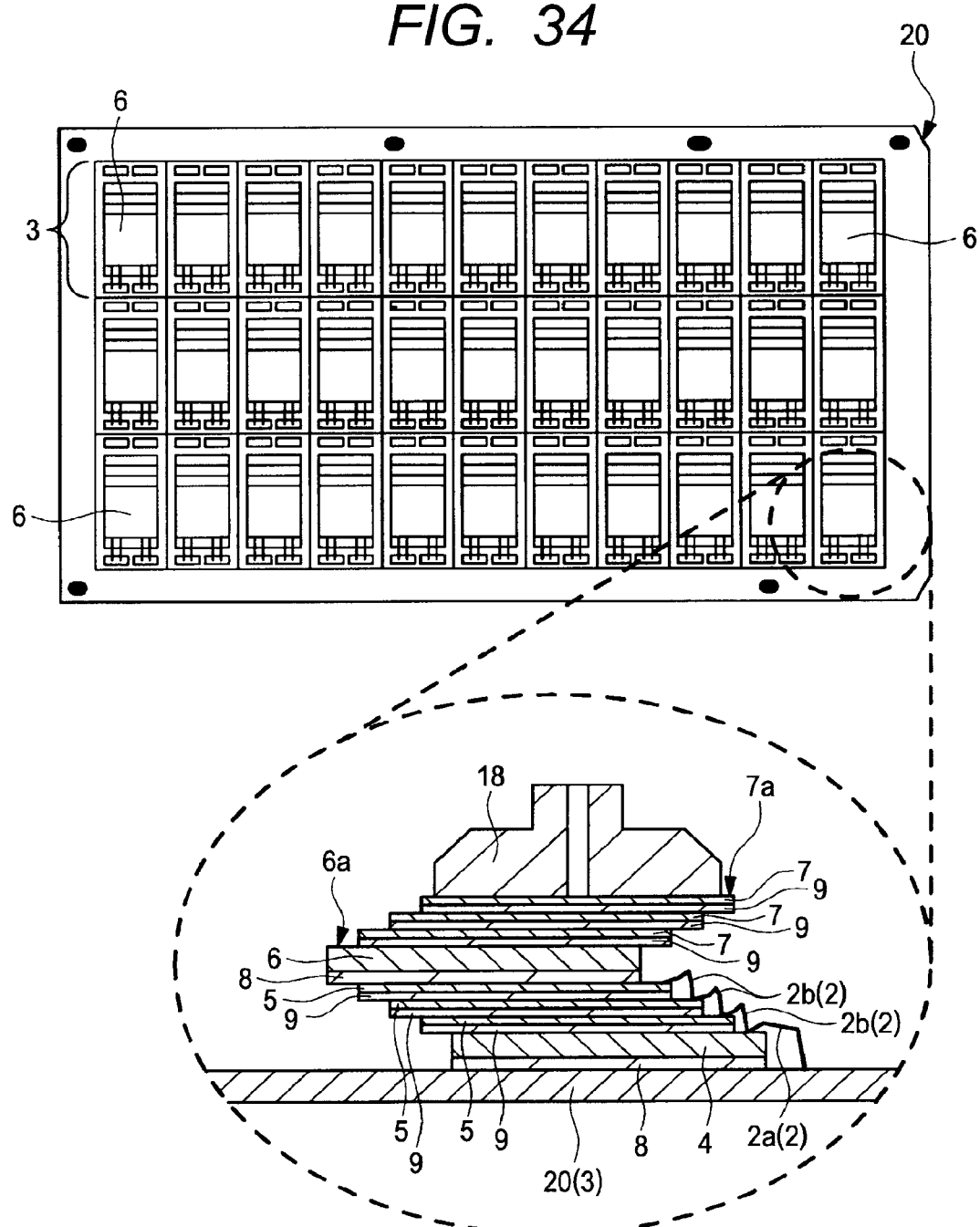
FIG. 34 is a plan view illustrating an example of the structure of a semiconductor wafer after die bonding for second semiconductor chips after turn-back lamination in the assembly of the semiconductor device in FIG. 1 and an enlarged partial sectional view obtained at the time of pressing.
Figure 36:
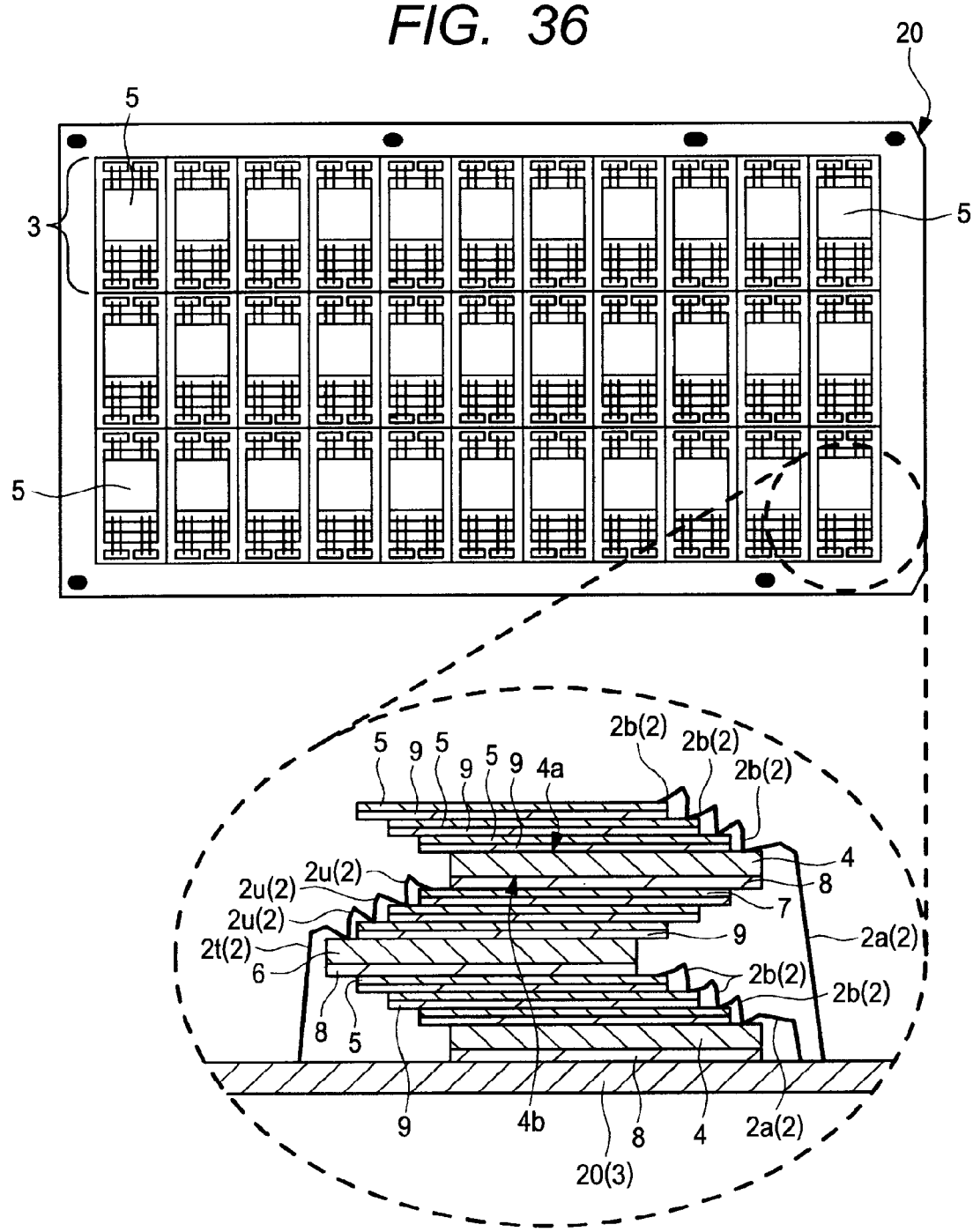
FIG. 36 is a plan view illustrating an example of the structure of a semiconductor wafer after wire bonding after re-turn-back lamination in the assembly of the semiconductor device in FIG. 1 and a corresponding enlarged partial sectional view.
Figure 37:
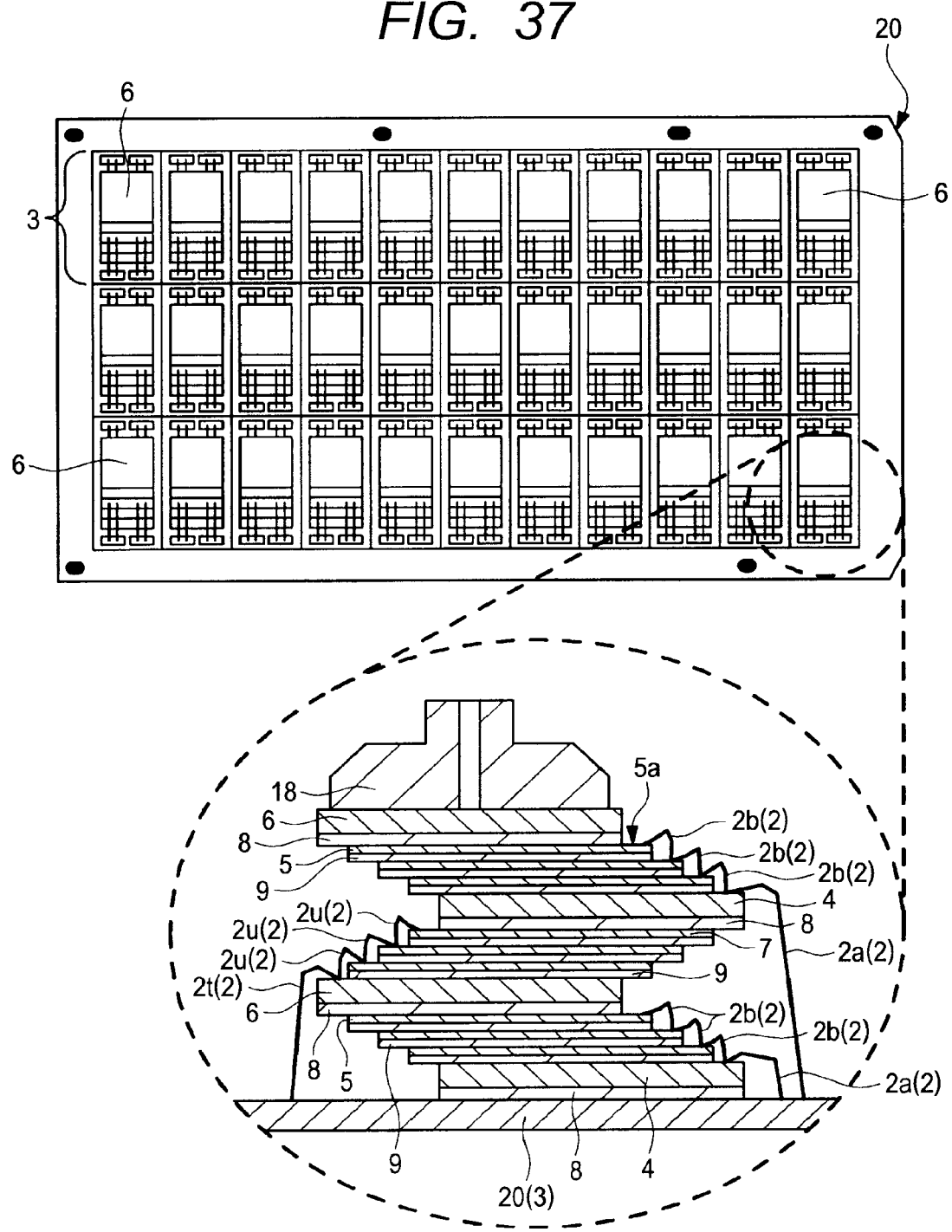
FIG. 37 is a plan view illustrating an example of the structure of a semiconductor wafer after die bonding for a first semiconductor chip at the time of re-re-turn-back lamination in the assembly of the semiconductor device in FIG. 1 and an enlarged partial sectional view obtained at the time of pressing.
Figure 38:
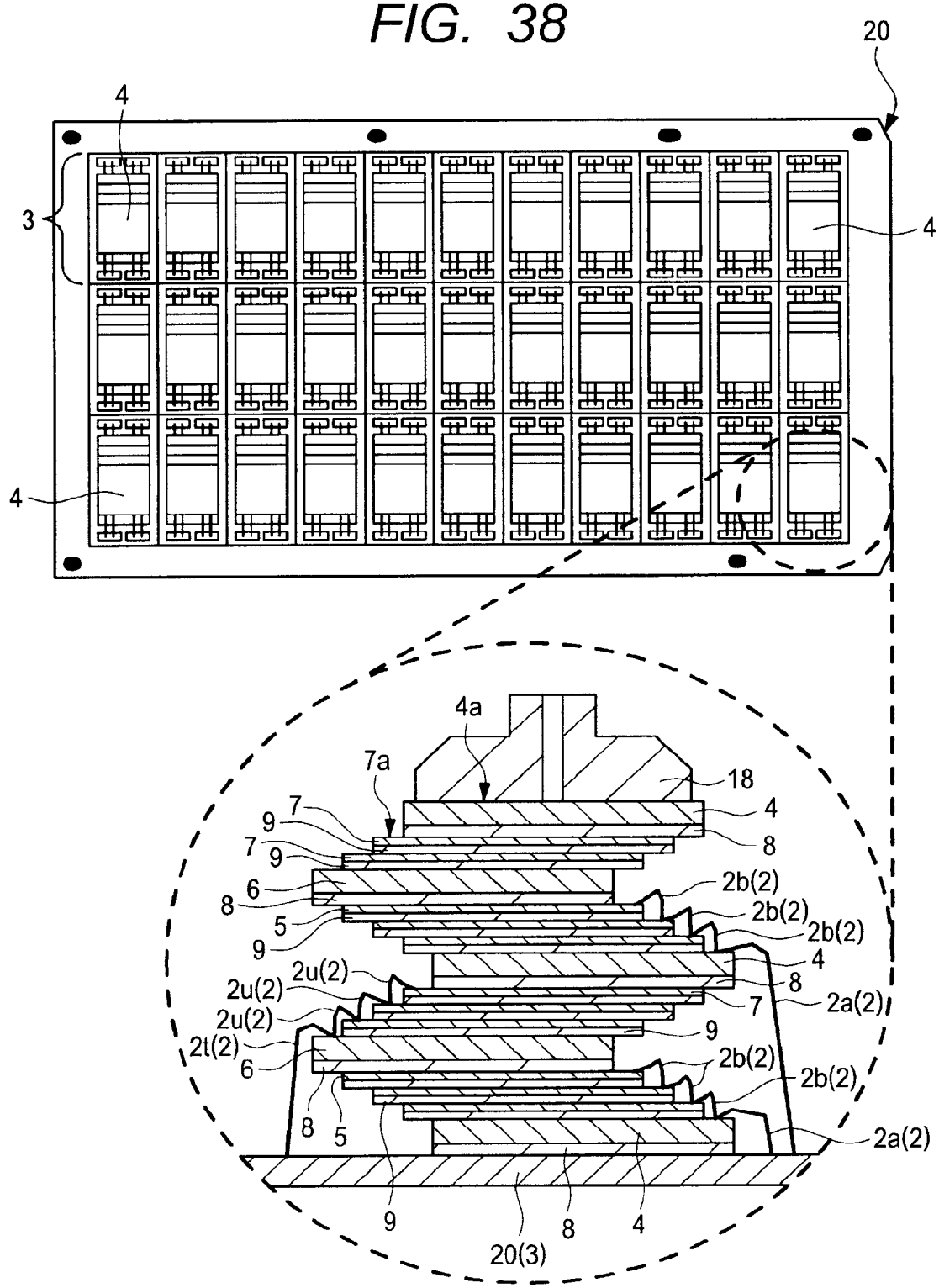
FIG. 38 is a plan view of the first semiconductor chip in the uppermost tier in die bonding in the assembly of the semiconductor device in FIG. 1 and an enlarged partial sectional view obtained at the time of pressing.
Figure 39:
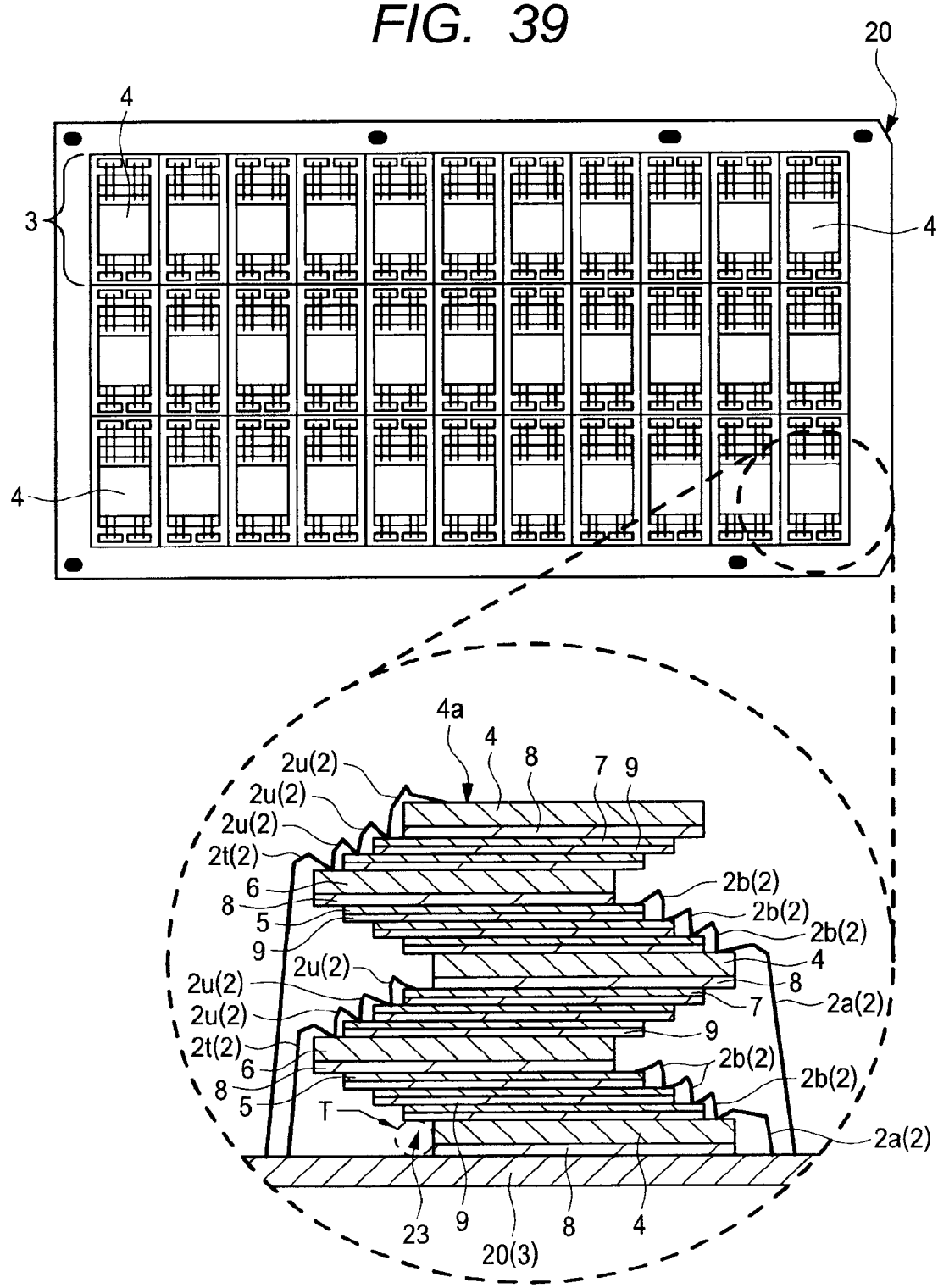
FIG. 39 is a plan view illustrating an example of the structure of a semiconductor wafer at the time of completion of wire bonding after the placement of the first semiconductor chip in the uppermost tier in the assembly of the semiconductor device in FIG. 1 and a corresponding enlarged partial sectional view.

FIG. 24 is a plan view illustrating an example of a structure obtained after wire bonding at a wire bonding step in the assembly of the semiconductor device illustrated in FIG. 1 and a corresponding enlarged partial sectional view; FIG. 25 is partial sectional views illustrating an example of a formation method for a first bump electrode at the wire bonding step in the assembly of the semiconductor device illustrated in FIG. 1; FIG. 26 is partial sectional views illustrating an example of a wire bonding method on the 1st side at the wire bonding step in the assembly of the semiconductor device illustrated in FIG. 1; and FIG. 27 is partial sectional views illustrating an example of a wire bonding method on the 2nd side at the wire bonding step in the assembly of the semiconductor device illustrated in FIG. 1. FIG. 28 is partial sectional views illustrating an example of a bonding method for a second wire on the 2nd side at the wire bonding step in the assembly of the semiconductor device illustrated in FIG. 1; FIG. 29 is an enlarged partial sectional view illustrating an example of the structure of A site illustrated in FIG. 28; FIG. 30 is a conceptual diagram illustrating an example of the path of a capillary at the wire bonding step in the assembly of the semiconductor device illustrated in FIG. 1; FIG. 31 is a sectional view illustrating an example of a structure wired along the path of the capillary illustrated in FIG. 30; and FIG. 32 is a plan view illustrating an example of the wiring structure illustrated in FIG. 31. FIG. 33 is a plan view illustrating an example of a structure obtained after die bonding for a first semiconductor chip at the time of turn-back lamination in the assembly of the semiconductor device in FIG. 1 and an enlarged partial sectional view obtained at the time of pressing; FIG. 34 is a plan view illustrating an example of a structure obtained after die bonding for second semiconductor chips after turn-back lamination in the assembly of the semiconductor device in FIG. 1 and an enlarged partial sectional view obtained at the time of pressing; and FIG. 35 is a plan view illustrating an example of a structure obtained after wire bonding after turn-back lamination in the assembly of the semiconductor device in FIG. 1 and a corresponding enlarged partial sectional view. FIG. 36 is a plan view illustrating an example of a structure obtained after wire bonding after re-turn-back lamination in the assembly of the semiconductor device in FIG. 1 and a corresponding enlarged partial sectional view; FIG. 37 is a plan view illustrating an example of a structure after die bonding for a first semiconductor chip at the time of re-re-turn-back lamination in the assembly of the semiconductor device in FIG. 1 and an enlarged partial sectional view obtained at the time of pressing; FIG. 38 is a plan view obtained at the time of pressing in die bonding for the first semiconductor chip in the uppermost tier in the assembly of the semiconductor device in FIG. 1 and a corresponding enlarged partial sectional view; and FIG. 39 is a plan view illustrating an example of a structure at the time of completion of wire bonding after the placement of the first semiconductor chip in the uppermost tier in the assembly of the semiconductor device in FIG. 1 and a corresponding enlarged partial sectional view.

At the wire bonding step in the first embodiment, a so-called reverse bonding method is adopted. In this method, a wire is bonded from the wiring board 3 to a semiconductor chip or from a semiconductor chip in a lower tier to a semiconductor chip in an upper tier. Therefore, the lower tier side is taken as 1st bond and the upper tier side is taken as 2nd bond.

As illustrated in FIG. 24, first, the multiple first bonding leads 3e of the wiring board 3 and the multiple first bonding pads 4c of the first semiconductor chip 4 are respectively electrically coupled with each other through multiple first wires 2a. That is, the first bonding leads 3e of the wiring board 3 and the first bonding pads 4c of the first semiconductor chip 4 are electrically coupled with each other through first wires 2a. In this example, each first bonding lead 3e in the lower tier is 1st bond and each first bonding pad 4c in the upper tier is 2nd bond.

In the reverse bonding method in this embodiment, the following measure is taken as illustrated in the sketch of "AFTER WIRE CUT" in FIG. 25: a first bump electrode 2g is formed beforehand on a bonding pad to be the 2nd bond. (In this example, this bonding pad is one of the first bonding pads 4c of the first semiconductor chip 4.) At this time, the following inclined plane 2h is formed in the front surface of the first bump electrode 2g by pressing the apical surface 21a of the capillary 21 against the front surface of the first bump electrode 2g as illustrated in FIG. 25: the inclined plane 2h whose height is reduced from the central part in the first front surface 4a of the first semiconductor chip 4 toward the first chip side 4d.

More detailed description will be given. As illustrated in the sketch of "AT TIME OF BUMP LANDING" in FIG. 25, the following processing is carried out under the guidance of the capillary 21: the central part 2d of the ball portion 2c of the first wire 2a is aligned with the central part 4e of the first bonding pad 4c (2nd side) and they are joined together. At this time, heat and an ultrasonic wave are used to join the ball portion 2c to the bonding pad 4c. Thereafter, the capillary 21 is moved up as illustrated in the sketch of "AT TIME OF BUMP FORMATION" in FIG. 25 and is slightly moved toward the first bonding lead 3e (1st bond) illustrated in FIG. 24. Further, as illustrated in the sketch of "AFTER BUMP COMPLETION," the capillary 21 is moved down and the ball portion 2c is pressed and crushed by the inclined portion 21b of the apical surface 21a of the capillary 21. Thereafter, the first wire 2a is cut and as a result, the first bump electrode 2g is formed as illustrated in the sketch of "AFTER WIRE CURE" in FIG. 25. At this time, the following inclined plane 2h is formed in the front surface of the first bump electrode 2g: the inclined plane 2h whose height is reduced from the central part in the first front surface 4a of the first semiconductor chip 4 toward the first chip side 4d.

As illustrated in FIG. 26, subsequently, 1st bond joining in the reverse bonding method is carried out on the first bonding lead 3e of the wiring board 3. First, using the capillary 21, the ball portion 2c of the first wire 2a is joined to one of the multiple first bonding leads 3e of the wiring board 3. At this time, the first wire 2a is arranged above the first bonding lead 3e under the guidance of the capillary 21 as illustrated in the sketch of "BEFORE 1ST SIDE JOINING" in FIG. 26.

Thereafter, the following processing is carried out as illustrated in the sketch of "AT TIME OF 1ST SIDE BUMP LANDING" in FIG. 26: the ball portion 2c is landed on the first bonding lead 3e under the guidance of the capillary 21 and then the ball portion 2c is pressed against and joined to the first bonding lead 3e by the capillary 21. At this time, heat and an ultrasonic wave are used to join the ball portion 2c to the bonding pad 4c.

Thereafter, the capillary 21 is moved up as illustrated in the sketch of "AFTER 1ST SIDE JOINING" in FIG. 26.

As illustrated in FIG. 27, subsequently, 2nd bond is carried out. In this example, part of the first wire 2a is joined to the front surface of the first bump electrode 2g. First, it is set above the first bonding pad 4c of the first semiconductor chip 4 as illustrated in the sketch of "BEFORE 2ND SIDE JOINING" in FIG. 27. Then, as illustrated in the sketches of "AT TIME OF WIRE LANDING" and "AT TIME OF JOINING COMPLETION" in FIG. 27, the first wire 2a is landed on the front surface of the first bump electrode 2g formed beforehand under the guidance of the capillary 21. At this time, the inclined plane 2h of the first bump electrode 2g is pressed by the inclined portion 21b of the apical surface 21a of the capillary 21 in the following state: a state in which the central part 21c of the capillary 21 is shifted from the central part 2i of the first bump electrode 2g in such a direction that it goes away from the first chip side 4d (inward). That is, the entire inclined plane 2h of the first bump electrode 2g is pressed by the apical surface 21a of the capillary 21.

As a result, bonding is carried out with both the thin portion 2q and the thick portion 2r in the inclined plane 2h of the first bump electrode 2g crushed. This makes it possible to increase the joining area to enhance the joining strength.

Thereafter, as illustrated in the sketch of "AFTER WIRE CUT" in FIG. 27, the first wire 2a is cut and the bonding of the first wire 2a on the 2nd side is completed. Over the first bonding pad 4c, an end (part) 2p of the first wire 2a is joined to the inclined plane 2h of the first bump electrode 2g.

Using the same reverse bonding method, the other first bonding leads 3e of the wiring board 3 and the other first bonding pads 4c of the first semiconductor chip 4 are electrically coupled with each other through first wires 2a.

Subsequently, the first bonding pads 4c of the first semiconductor chip 4 in the first tier and the second bonding pads 5c of the second semiconductor chip 5 in the second tier are coupled with each other by the reverse bonding method. In this example, the multiple first bonding pads 4c and the multiple second bonding pads 5c are respectively electrically coupled with each other through multiple second wires 2b.

First, a second bump electrode 2m (Refer to FIG. 30) is formed over a second bonding pad 5c of the second semiconductor chip 5 to be the 2nd side by the same formation method as that for the first bump electrode 2g illustrated in FIG. 25. Also at the second bump electrode 2m, at this time, the inclined plane 2s whose height is reduced toward the first bonding pad 4c in the lower tier is formed in the front surface similarly with the inclined plane 2h of the first bump electrode 2g.

Thereafter, the following processing is carried out as illustrated in the sketch of "BEFORE SECOND WIRE JOINING" in FIG. 28: the ball portion 2e of the second wire 2b is arranged above the end 2p of the first wire 2a joined to the first bump electrode 2g over the first bonding pad 4c of the first semiconductor chip 4 under the guidance of the capillary 21. At this time the end 2p of the first wire 2a includes the following portions as illustrated in FIG. 29: a first portion (thin wire area) 2j; and a second portion (thick wire area) 2k positioned closer to the first chip side 4d than the first portion 2j is and larger in thickness (thicker) than the first portion 2j.

Thereafter, the following processing is carried out as illustrated in the sketch of "AT TIME OF SECOND WIRE LANDING" in FIG. 28 and FIG. 29: the capillary 21 is moved down and the ball portion 2e of the second wire 2b is pressed against and joined to the end 2p of the first wire 2a and the first bump electrode 2g by the capillary 21. In this example, the second wire 2b is guided by the capillary 21 so that the ball portion 2e of the second wire 2b is brought into contact with the first portion 2j and second portion 2k of the first wire 2a illustrated in FIG. 29. Then the ball portion 2e of the second wire 2b is joined to the end 2p of the first wire 2a and the first bump electrode 2g.

As a result, bonding is carried out with both the first portion 2j and the second portion 2k at the end 2p of the first wire 2a crushed. This makes it possible to increase the joining area to enhance the joining strength.

To enhance the joining strength between the first bump electrode 2g and the ball portion 2e of the second wire 2b, it is important to take the measure illustrated in FIG. 29. That is, the first bump electrode 2g, first wire 2a, and second wire 2b are bonded so that they do not protrude beyond the pad width D of the first bonding pad 4c of the first semiconductor chip 4. That is, to enhance the joining strength, it is important to join the ball portion 2e of the second wire 2b from directly above the first bump electrode 2g.

Preferably, the joining area between the second wire 2b and the first bump electrode 2g is increased to enhance the joining strength by taking the following measure: the ball portion 2e of the second wire 2b is joined to the end 2p of the first wire 2a and the first bump electrode 2g so that the following is implemented: the central part 2f of the ball portion 2e of the second wire 2b overlaps with the central part 2i of the first bump electrode 2g.

Thereafter, as illustrated in the sketch of "AT TIME OF JOINING COMPLETION" in FIG. 28, the capillary 21 is moved up and the wire bonding of the second wire 2b on the 1st side is completed.

Subsequently, wire bonding of the second wire 2b on the 2nd side is carried out. (This is wire bonding to the second bonding pads 5c of the second semiconductor chip 5 in the second tier.) In the assembly in the first embodiment, at this time, the path 21e of the capillary 21 illustrated in FIG. 30 to FIG. 32 is used to carry out wire bonding of the second wire 2b on the 2nd side.

As illustrated in FIG. 30 to FIG. 32, first, the ball portion 2e of the second wire 2b is joined to the first bump electrode 2g (refer to FIG. 29) over the first bonding pad 4c under the guidance of the capillary 21. When the capillary 21 is subsequently moved from the first bonding pad 4c to the second bonding pad 5c, the following processing is carried out: on the way, it is moved back toward the first bonding pad 4c along the second direction 21d connecting the first bonding pad 4c and the second bonding pad 5c. That is, the capillary 21 is pulled up above the first bonding pad 4c and the pulled-up capillary 21 is moved in such a direction that it goes away from the second bonding pad 5c as viewed in a plane. (This direction is the direction from directly above the first bonding pad 4c toward the first chip side 4d.) Subsequently, the capillary is cut back toward the second bonding pad 5c in a continuous action to form a curved point 2n in the second wire 2b. More specific description will be given. The capillary 21 is moved in such a direction that it goes close to the second bonding pad 5c as viewed in a plane. The capillary 21 is arranged closer to the second bonding pad 5c than when it is positioned directly above the first bonding pad 4c. Then the capillary 21 is moved again in such a direction that it goes away from the second bonding pad 5c as viewed in a plane. (This direction is the direction from directly above the first bonding pad 4c toward the first chip side 4d.) Then part of the second wire 2b is joined to the front surface of the second bump electrode 2m formed over the second bonding pad 5c.

More detailed description will be given. After joining on the 1st side is completed as illustrated in FIG. 30, the capillary 21 is pulled up above the first bonding pad 4c. The second wire 2b is thereby pulled out once in such a direction that it goes away from the second bonding pad 5c. The capillary is further moved up and then moved toward the second bonding pad 5. Further, on the way from the first bonding pad 4c toward the second bonding pad 5c, the capillary 21 is moved up. Thereafter, it is moved back toward the first bonding pad 4c along the second direction 21d illustrated in FIG. 32 and then cut back toward the second bonding pad 5c (X site in FIG. 30) in a continuous action. The curved point 2n illustrated in FIG. 31 is thereby formed in the second wire 2b. Thereafter, part of the second wire 2b is joined to the front surface of the second bump electrode 2m formed over the second bonding pad 5c.

When part of the second wire 2b is joined to the second bump electrode 2m, the method of joining the first wire 2a to the first bump electrode 2g illustrated in FIG. 27 is used.

In the second bump electrode 2m, there is formed the inclined plane 2s. Therefore, when part of the second wire is joined to the second bump electrode 2m, force P is applied to the second wire 2b. This force P is produced by the inclined plane 2s and the action of pressing force from the apical surface 21a of the capillary 21 as illustrated in FIG. 31 and acts to push the second wire 2b toward the first bonding pad 4c substantially horizontally. (This force P similarly acts at the inclined plane 2h of the first bump electrode 2g as well.)

As the result of the application of this force P, the second wire 2b is substantially horizontally pushed out and thus the wire loop height can be reduced over the second bonding pad 5c (2nd side). This loop height reduction is intended to implement the following: the height of the wire 2 is reduced within the range where the semiconductor chip in the fourth tier and a semiconductor chip arranged planarly in the same position thereabove overlap with each other as shown in S site in FIG. 35. If usual reverse bonding is carried out at S site, the wire 2 can be brought into contact with the upper semiconductor chip. When the inclined plane 2h is formed in the first bump electrode 2g as in the first embodiment, the loop height of the wire 2 can be reduced at S site to prevent this.

Figure 67:
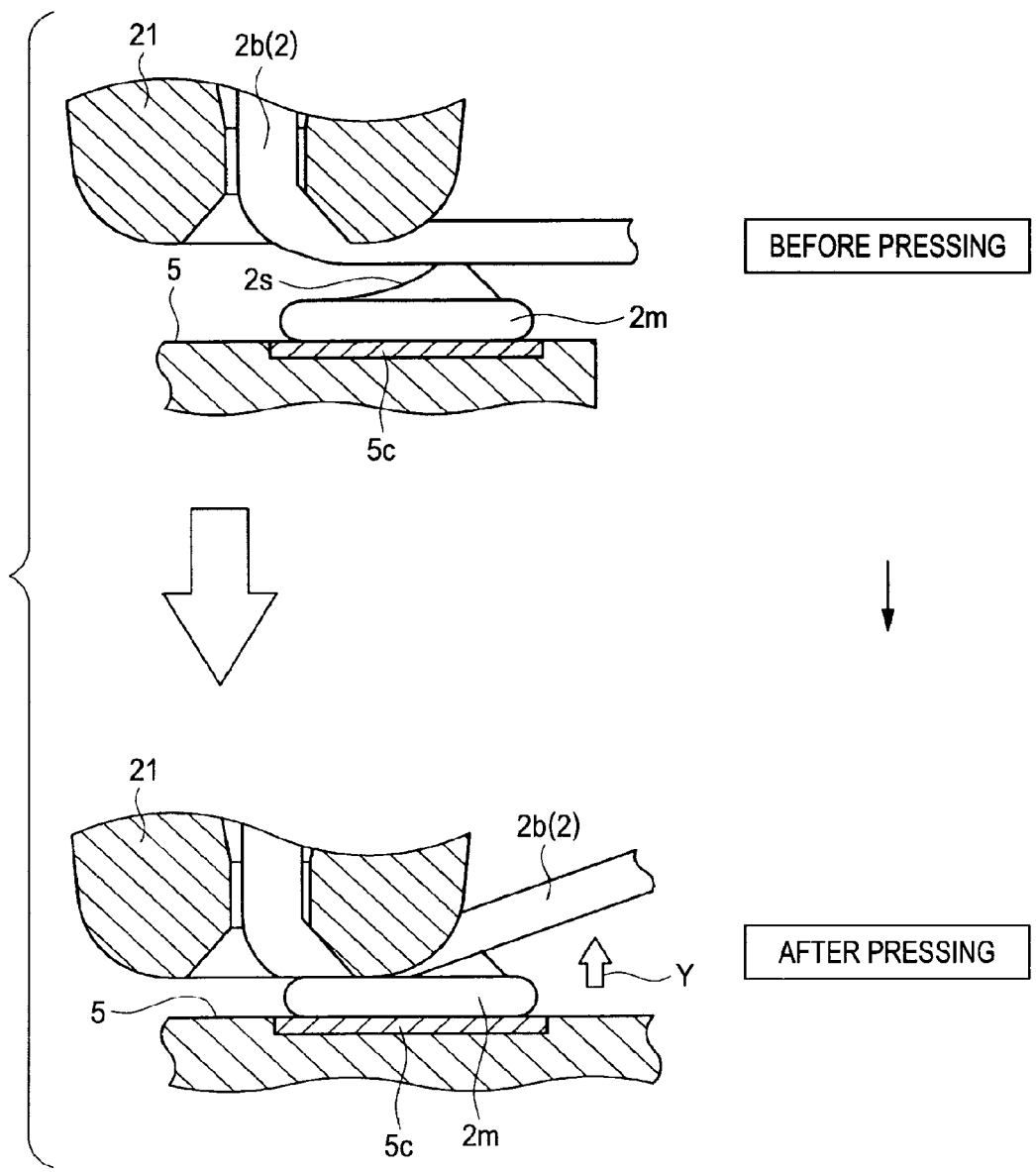
FIG. 67 is partial sectional views illustrating structures obtained before pressing and after pressing on the 2nd side in wire bonding in a comparative example.

FIG. 67 illustrates a comparative example of the inclined plane 2s of the second bump electrode 2m investigated by the present inventors. In this comparative example, the inclination direction in which the height of the inclined plane 2s (same with the inclined plane 2h of the first bump electrode 2g) is reduced is reversed relative to the first bonding pad 4c. That is, the inclined plane 2s has an inclination whose height is increased toward the first bonding pad 4c.

In the sketches of "BEFORE PRESSING" and "AFTER PRESSING" in FIG. 67, the inclined plane 2s of the second bump electrode 2m is so inclined that it becomes higher toward the first bonding pad 4c (refer to FIG. 31) in wire bonding on the 2nd side. In this case, the following takes place during wire bonding as illustrated in the sketches: the second wire 2b is joined so that it is inclined in such a direction that it becomes higher toward the first bonding pad 4c (direction Y in which it is lifted). As a result, the wire loop height cannot be reduced over the second bonding pad 5c (2nd side).

Therefore, it is desirable that the inclined plane 2s of the second bump electrode 2m should be so inclined that it becomes lower toward the first bonding pad 4c in the lower tiers. (This is the same with the inclined plane 2h of the first bump electrode 2g.)

In wire bonding on the 2nd side, as illustrated in FIG. 31, the second wire 2b is pushed out toward the first bonding pad 4c by force P arising from the following: the inclined plane 2s inclined toward the first bonding pad 4c in the lower tier formed over the second bump electrode 2m and the action of pressing force from the apical surface 21a of the capillary 21. However, the curved point 2n is formed in the second wire 2b and it is high in rigidity in proximity to the curved point 2n.

Therefore, the second wire 2b does not laterally topple and is straightly pushed out in the area (Q site) located above the first bonding pad 4c as illustrated in FIG. 32.

Figure 68:
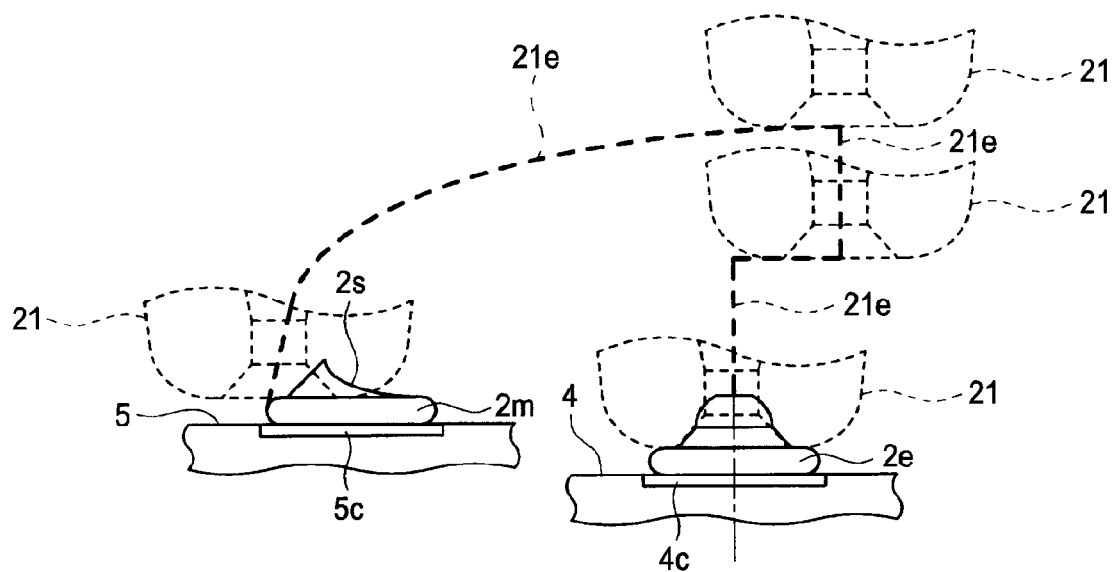
FIG. 68 is a conceptual diagram illustrating the path of a capillary in wire bonding in a comparative example.
Figure 69:
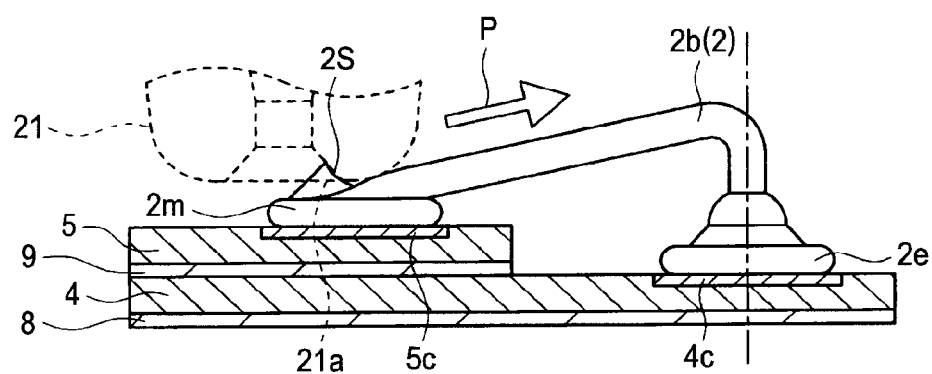
FIG. 69 is a sectional view illustrating a structure wired along the path of a capillary in the comparative example illustrated in FIG. 68.
Figure 70:
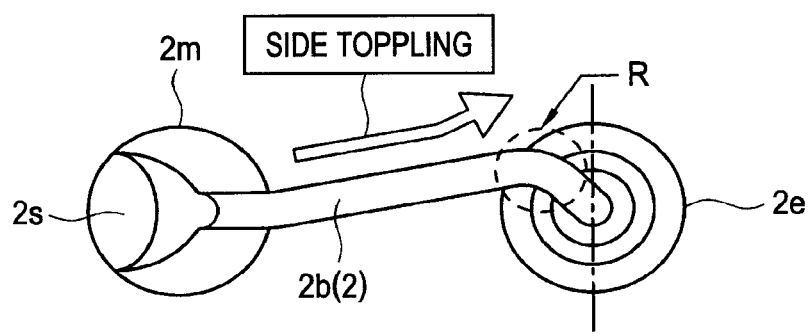
FIG. 70 is a plan view illustrating the wiring structure in the comparative example illustrated in FIG. 69.

FIG. 68 to FIG. 70 illustrate the path 21e of a capillary 21 in a comparative example investigated by the present inventors. According to this path 21e, the processing is carried out as follows: after wire bonding on the 1st side is completed at the first bonding pad 4c, the capillary 21 is moved up to once pull up the second wire 2b in such a direction that it goes away from the second bonding pad 5c; and the capillary is further moved up and then moved toward the second bonding pad 5 and wire bonding on the 2nd side at the second bonding pad 5c is directly started. That is, the above path does not involve the following operation unlike the path 21e of the capillary 21 in the first embodiment illustrated in FIG. 30: the capillary is moved back toward the first bonding pad 4c once and then cut back toward the second bonding pad 5c in a continuous action.

Therefore, such a curved point 2n as illustrated in FIG. 31 is not formed in the second wire 2b. Therefore, a problem arises when the second wire 2b is pushed out toward the first bonding pad 4c by force P arising from the following as illustrated in FIG. 69: the inclined plane 2s formed in the second bump electrode 2m and the action of pressing force from the apical surface 21a of the capillary 21. As illustrated in R site in FIG. 70, a side toppling phenomenon occurs in the second wire 2b in proximity to above the first bonding pad 4c. This causes bonding failure, such as contact with an adjacent second wire 2b.

When the path 21e of the capillary 21 in the first embodiment illustrated in FIG. 30 is adopted, the curved point 2n is formed in the second wire 2b and thus the side toppling phenomenon can be prevented. Further, the loop height of a wire formed by the wire bonding step can be reduced as illustrated in FIG. 24. For this reason, the following problem can be suppressed even when another semiconductor chip is arranged directly above at steps (die bonding steps) of placing the semiconductor chips in the fifth and following tiers: a problem of contact between a wire and a semiconductor chip arranged directly above. In this embodiment, the wire bonding method illustrated in FIG. 30 is not adopted at the wire bonding step for electrically coupling the semiconductor chip in the first tier to the wiring board 3 for the sake of simplification of the process. As illustrated in FIG. 4, this is because the distance between the semiconductor chip in the first tier and the semiconductor chip arranged directly above this semiconductor chip is larger than the following distance: the distance between each of the semiconductor chips in the second to fourth tiers (especially, in the fourth tier) and the semiconductor chip arranged directly thereabove. However, the wire bonding method illustrated in FIG. 30 may also be applied to the semiconductor chip in the first tier, needless to add.

As mentioned above, highly reliable wire bonding with a reduced loop height can be achieved by taking the following measure: the second bump electrode 2m in the first embodiment is provided with the inclined plane 2s (same with the inclined plane 2h of the first bump electrode 2g); and the path 21e of the capillary 21 illustrated in FIG. 30 is used to carry out wire bonding.

Wire bonding for the third tier and the fourth tier is carried out similarly with the wire bonding (reverse bonding) for coupling the first semiconductor chip 4 in the first tier and the second semiconductor chip 5 in the second tier through second wires 2b. This completes wire bonding for up to the fourth tier.

<<Die Bonding Step for Fifth Tier to Eighth Tier>>

As illustrated in FIG. 33 and FIG. 34, subsequently, die bonding for the fifth tier to the eighth tier is carried out. In die bonding for the fifth tier to the eighth tier, the lamination direction is changed by 180 degrees from that in die bonding for the first tier to the fourth tier and the lamination direction is turned back at the fifth tier. However, this die bonding is identical with that for the first tier and the fourth tier in that semiconductor chips are shifted at every tier and laminated stepwise. At this time, the semiconductor chips are laminated so that the bonding pads in each tier are arranged on the opposite side to those in the first tier to the fourth tier.

In the fifth tier as the first tier in turn-back lamination, as illustrated in FIG. 33, a third semiconductor chip 6 identical in thickness with the first semiconductor chip 4 and thicker than the second semiconductor chip 5 is placed. As illustrated in FIG. 35, the third semiconductor chip 6 includes: a third front surface 6a quadrilateral in planar shape; multiple third bonding pads (electrode pads, pads to which a wire 2 is directly bonded) 6c formed along (only) the third chip side 6d of the third front surface 6a; and a third back surface 6b opposite to the third front surface 6a. Further, a first adhesive layer 8 as a first adhesive layer large in thickness is stuck to the third back surface 6b of the third semiconductor chip 6. Therefore, the third semiconductor chip 6 is placed through the first adhesive layer 8. The third semiconductor chip 6 is a memory chip having the same functions as the first semiconductor chip 4.

The thickness of the third semiconductor chip 6 is within a range of 0.040 to 0.200 mm, and 0.055 mm in this embodiment. The thickness of the first adhesive layer 8 stuck to the third semiconductor chip 6 is within a range of 0.010 to 0.050 mm, and 0.020 mm in this embodiment. In this case, the total thickness of the third semiconductor chip 6 and the first adhesive layer 8 is 0.075 mm.

In die bonding of the third semiconductor chip 6 in the fifth tier, it is placed (arranged, laminated) over the second semiconductor chip 5 in the fourth tier so that the following is implemented: as illustrated in FIG. 35, the distance between the third chip side 6d and the second board side 3m is shorter than the following distance as viewed in a plane and the multiple second bonding pads 5c are exposed from the third semiconductor chip 6: the distance between the third chip side 6d (or the chip side (the other short side) opposed to the third chip side 6d) and the first board side 3k. In other words, the third semiconductor chip 6 in the fifth tier is placed so that the third chip side 6d is arranged closer to the second board side 3m than to the first board side 3k. That is, the semiconductor chip 6 in the fifth tier is laminated (placed) stepwise with its lamination direction changed by 180 degrees from those of the semiconductor chips 4, 5 in the first to fourth tiers so that the following is implemented: the third chip side (side on which the bonding pads 6c are arranged) 6d of the third semiconductor chip 6 faces toward the other side (second board side) 3m of the two short sides of the wiring board 3; and the semiconductor chip 6 is positioned in the device area (the upper surface 3a of the wiring board 3) as viewed in a plane.

When the thickness (Tw1) of the third semiconductor chip 6 in the fifth tier and the thickness (Td1) of the first adhesive layer 8 are added together, the total thickness of Tw1+Td1 is obtained. Because of the relation with the wire loop height (Hw) in FIG. 35, it is required to prevent interference between the wire 2 in the lower tier (fourth tier) and the fourth semiconductor chip 7 in the upper tier (sixth tier). To achieve this, it is required to meet the requirement for the clearance (D)= (Tw1+Td1)−Hw>0 as illustrated in FIG. 33.

As mentioned above, the third semiconductor chip 6 is identical in thickness with the first semiconductor chip 4 and thicker than the second semiconductor chip 5. Further, the first adhesive layer 8 is thick; therefore, the following can be implemented by adding the thickness of the third semiconductor chip 6 and the thickness of the first adhesive layer 8: it is possible to ensure a height sufficient to prevent interference between the loop of the wire 2 in the directly lower tier (fourth tier) and the fourth semiconductor chip 7 located directly above (sixth tier) as shown in S site in FIG. 35; and it is possible to prevent (reduce) interference (contact) between the wire 2 in the lower tier (fourth tier) and the fourth semiconductor chip 7 located directly above.

In wire bonding to the second bonding pads 5c of the second semiconductor chip 5 in the fourth tier, the following can be implemented. The second wire 2b whose loop height is reduced by the inclined plane 2s of the second bump electrode 2m as illustrated in FIG. 31. Therefore, a sufficient clearance can be ensured at S site in FIG. 35 by a combination of the low loop height and the large total thickness of the third semiconductor chip 6 and the first adhesive layer 8 that are both thick. Thus it is possible to prevent (reduce) interference between the wire 2 in the lower tier (fourth tier) and the fourth semiconductor chip 7 located directly above.

In the first tier in the turn-back lamination, a portion of the chip end is overhanged (protruded) from the chip in the lower tier. In the overhanged portion, there are bonding pads whose lower parts are not supported by anything and they must withstand bonding force during wire bonding. Therefore, use of the thick-type third semiconductor chip 6 makes it possible to enhance the strength of the chip itself and prevent (reduce) chip breakage due to bonding force during wire bonding.

Since there are portions whose lower parts are not supported by anything in the overhanged area at the chip end, chip fracture is prone to be caused by pressure from a resin flow during resin molding. Therefore, use of the thick-type third semiconductor chip 6 makes it possible to enhance the strength of the chip itself similarly with the foregoing. In addition, it makes it possible to prevent (reduce) the occurrence of chip fracture due to pressure from a resin flow during resin molding.

As illustrated in FIG. 34, subsequently, the second and following tiers (the sixth tier to the eighth tier) after turn-back are laminated. That is, die bonding is carried out for the sixth tier to the eighth tier. At this time, fourth semiconductor chips 7 as thin-type semiconductor chips like the second semiconductor chips 5 in the second tier to the fourth tier are used.

The fourth semiconductor chip 7 includes: a fourth front surface 7a quadrilateral in planar shape; multiple fourth bonding pads (electrode pads, pads to which a wire 2 is directly bonded) 7c formed along (only) the fourth chip side 7d of the fourth front surface 7a; and a fourth back surface 7b opposite to the fourth front surface 7a. Further, a second adhesive layer 9 as a second adhesive layer small in thickness is stuck to the fourth back surface 7b of the fourth semiconductor chip 7. Therefore, the fourth semiconductor chip 7 is placed through the second adhesive layer 9. The fourth semiconductor chip 7 is a memory chip having the same functions as the second semiconductor chip 5.

The thickness (Tw2) of the fourth semiconductor chip 7 is within a range of 0.010 to 0.030 mm similarly with the second semiconductor chip 5 and is, for example, 0.020 mm. The thickness (Td2) of the second adhesive layer 9 stuck to the fourth semiconductor chip 7 is within a range of 0.003 to 0.010 mm and is, for example, 0.005 mm. In this case, the total thickness of the fourth semiconductor chip 7 and the second adhesive layer 9 is 0.025 mm.

In die bonding of the fourth semiconductor chip 7 in the sixth tier, it is placed (arranged, laminated) over the third semiconductor chip 6 in the fifth tier so that the following is implemented: as illustrated in FIG. 35, the distance between the fourth chip side 7d and the second board side 3m is shorter than the following distance as viewed in a plane and the multiple third bonding pads 6c are exposed form the fourth semiconductor chip 7: the distance between the fourth chip side 7d (or the chip side (the other short side) opposed to the fourth chip side 7d) and the first board side 3k. In other words, the fourth semiconductor chip 7 in the sixth tier is placed so that the fourth chip side 7d is arranged closer to the second board side 3m than to the first board side 3k. That is, the fourth semiconductor chip 7 in the sixth tier is laminated (placed) stepwise with its lamination direction matched with the semiconductor chip 6 in the fifth tier so that the following is implemented: the fourth chip side (side on which the bonding pads 7c are arranged) 7d of the fourth semiconductor chip 7 faces toward the other side (second board side) 3m of the two short sides of the wiring board 3; and the semiconductor chip 7 is positioned in the device area (the upper surface 3a of the wiring board 3) as viewed in a plane.

Also in die bonding for the seventh tier and the eighth tier, the same semiconductor chip as the fourth semiconductor chip 7 is used and this die bonding is carried out as for the sixth tier.

As mentioned above, a combination of the fourth semiconductor chip 7 and the second adhesive layer 9 that are both thin is used in die bonding for the sixth tier to the eighth tier. This makes it possible to reduce the overall thickness of the 16-tiered laminate to reduce the thickness of the LGA 1.

In each of the semiconductor chips in the fifth tier to the eighth tier, the bonding pads in each tier are arranged on the second bonding lead 3f side of the wiring board 3.

This completes die bonding for the fifth tier to the eighth tier. In the first tier to the eighth tier, semiconductor chips are used as follows: the thick-type first semiconductor chip 4 and third semiconductor chip 6 are respectively used in the first tier and the fifth tier; and the thin-type second semiconductor chip 5 and fourth semiconductor chip 7 are respectively used in the second tier to the fourth tier and in the sixth tier to the eighth tier. The first semiconductor chip 4 and the third semiconductor chip 6 are both thicker than the second semiconductor chip 5 and the fourth semiconductor chip 7. That is, the thickness of the LGA 1 can be reduced by using as many thin-type semiconductor chips as possible.

<<Wire Bonding Step for Fifth Tier to Eighth Tier>>

As illustrated in FIG. 35, subsequently, wire bonding (reverse bonding) is carried out for the fifth tier to the eighth tier. The wire bonding for the fifth tier to the eighth tier is different from the wire bonding for the first tier to the fourth tier only in that the direction of wiring in each tier is changed by 180°. In the other respects, the wire bonding for the fifth tier to the eighth tier is exactly the same as that for the first tier to the fourth tier.

First, wire bonding is carried out for the third semiconductor chip 6 in the fifth tier. That is, the multiple second bonding leads 3f of the wiring board 3 and the multiple third bonding pads 6c of the third semiconductor chip 6 are respectively electrically coupled together through multiple third wires 2t by the reverse bonding method.

At this time, a first bump electrode 2g is formed beforehand on a third bonding pad 6c of the third semiconductor chip 6 equivalent to the 2nd side as in wire bonding for the first semiconductor chip 4 in the first tier. However, the inclined plane 2h formed in the first bump electrode 2g over the third bonding pad 6c is inclined so that it becomes lower toward the second bonding leads 3f located in the lower tier.

Reverse bonding in the third semiconductor chip 6 in the fifth tier is the same as reverse bonding in the first semiconductor chip 4. First, a third wire 2t is joined to a second bonding lead 3f of the wiring board 3 as the 1st side; thereafter, part of the third wire 2t is electrically coupled to the first bump electrode 2g over the third bonding pad 6c of the third semiconductor chip 6 as the 2nd side. This completes the reverse bonding in the third semiconductor chip 6 in the fifth tier.

Thereafter, wire bonding is carried out for the sixth tier to the eighth tier. The wire bonding for the sixth tier to the eighth tier is exactly the same as the wire bonding for the second tier to the fourth tier except the direction of wiring. More specific description will be given. A second bump electrode 2m having an inclined plane 2s is formed beforehand on a bonding pad of a semiconductor chip in the upper tier (2nd side). In this state, wire bonding on the 1st side is carried out on a bonding pad of a semiconductor chip in the lower tier; thereafter, wire bonding on the 2nd side is carried out on the inclined plane 2s of the second bump electrode 2m over the bonding pad of the semiconductor chip in the upper tier.

In wire bonding in the fourth semiconductor chip 7 in the sixth tier, for example, the following processing is carried out: the multiple third bonding pads 6c of the third semiconductor chip 6 in the fifth tier and the multiple fourth bonding pads 7c of the fourth semiconductor chip 7 in the sixth tier are respectively electrically coupled together through multiple fourth wires 2u by reverse bonding.

At this time, a second bump electrode 2m is formed beforehand in a fourth bonding pad 7c of the fourth semiconductor chip 7 equivalent to the 2nd side as in wire bonding in the second semiconductor chip 5 in the second tier. However, the inclined plane 2s formed in the second bump electrode 2m over the fourth bonding pad 7c is inclined so that it becomes lower toward the third bonding pads 6c located in the lower tier.

Reverse bonding in the fourth semiconductor chip 7 in the sixth tier is the same as reverse bonding in the second semiconductor chip 5. First, a fourth wire 2u is joined as the 1st side to part of the third wire 2t over the third bonding pad 6c of the third semiconductor chip 6; thereafter, part of the fourth wire 2u is electrically coupled to the second bump electrode 2m over the fourth bonding pad 7c of the fourth semiconductor chip 7 as the 2nd side. This completes the reverse bonding in the fourth semiconductor chip 7 in the sixth tier.

The wire bonding method for the seventh tier and the eighth tier is the same as the reverse bonding method for the fourth semiconductor chip 7 in the sixth tier.

The wire bonding for the fifth tier to the eighth tier is carried out as mentioned above. This makes it possible to achieve highly reliable wire bonding with a reduced loop height as in the wire bonding for the first tier to the fourth tier.

As mentioned above, the following takes place in the main surface (back surface, lower surface) 6b of the semiconductor chip 6 in the fifth tier: the area that planarly overlaps with the bonding pads 6c of the semiconductor chip 6 is not supported by the semiconductor chip (the semiconductor chip in the fourth tier in this case) positioned in the lower tier. That is, the bonding pads 6c of the semiconductor chip 6 are formed in a so-called overhang area. For this reason, when the capillary 21 used at the wire bonding step is pressed against such a bonding pad 6c, chip cracking is prone to occur. In this embodiment, however, the semiconductor chip 4 having the first thickness (Tw1) illustrated in FIG. 5 is used as the semiconductor chip in the fifth tier. For this reason, the semiconductor chip is less prone to bend and even though force from the capillary 21 is applied to the overhang area, the occurrence of chip cracking can be suppressed.

As mentioned above, further, the following semiconductor chip is used as the semiconductor chip placed in the fifth tier: the semiconductor chip 4 having the first thickness (Tw1) larger than the second thickness (Tw2) of the semiconductor chip 5 used in the second to fourth tiers (or the sixth to eighth tiers). As illustrated in FIG. 4, this makes it possible to increase the distance between the semiconductor chip in the fourth tier and the semiconductor chip in the sixth tier positioned above this semiconductor chip. In this embodiment, in addition, the following adhesive layer is used as the adhesive layer used to place the semiconductor chip in the fifth tier: the adhesive layer 8 having the first thickness (Td1) larger than the second thickness (Td2) of the adhesive layer 9 used in the second to fourth tiers (or the sixth to eighth tiers). For this reason, it is possible to further increase the distance between the semiconductor chip in the fourth tier and the semiconductor chip in the sixth tier positioned above this semiconductor chip. This makes it possible to prevent a problem of contact between a wire bonded to a bonding pad of the semiconductor chip in the fourth tier and the semiconductor chip in the sixth tier positioned directly above this semiconductor chip. In this embodiment, further, such a wire bonding method as illustrated in FIG. 30 is adopted at the wire bonding step for the semiconductor chip in the fourth tier. Since the loop height of a formed wire can be further reduced, therefore, it is possible to more reliably prevent a problem of contact between a wire and the semiconductor chip in the upper tier.

<<Die Bonding Step for Ninth Tier to 12th Tier>>

As illustrated in FIG. 36, subsequently, die bonding is carried out for the ninth tier to the 12th tier. The die bonding for the ninth tier to the 12th tier is exactly the same as the die bonding for the first tier to the fourth tier. The thick-type first semiconductor chip 4 is used in the ninth tier and the thin-type second semiconductor chip 5 is used in the 10th tier to the 12th tier.

Since the thick-type first semiconductor chip 4 is placed in the ninth tier at a turn-back of lamination, the following can be implemented: it is possible to ensure a height sufficient to prevent interference between the loop of a wire 2 in the directly lower tier (eighth tier) and the second semiconductor chip 5 located directly above (10th tier); and it is possible to prevent (reduce) interference (contact) between the wire 2 in the lower tier (eighth tier) and the second semiconductor chip 5 located directly above.

In the first tier in the turn-back lamination (the ninth tier), a portion of the chip end is overhanged (protruded) from the chip in the lower tier. In the overhanged portion, there are bonding pads whose lower parts are not supported by anything and they must withstand bonding force during wire bonding. Therefore, use of the thick-type first semiconductor chip 4 makes it possible to enhance the strength of the chip itself and prevent (reduce) chip breakage due to bonding force during wire bonding.

Since there are portions whose lower parts are not supported by anything in the overhanged area at the chip end, chip fracture is prone to be caused by pressure from a resin flow during resin molding. Therefore, use of the thick-type first semiconductor chip 4 makes it possible to enhance the strength of the chip itself similarly with the foregoing. In addition, it makes it possible to prevent (reduce) the occurrence of chip fracture due to pressure from a resin flow during resin molding.

As mentioned above, a combination of the second semiconductor chip 5 and the second adhesive layer 9 that are both thin is used in die bonding for the 10th tier to the 12th tier. This makes it possible to reduce the overall thickness of the 16-tiered laminate to reduce the thickness of the LGA 1.

<<Wire Bonding Step for Ninth Tier to 12th Tier>>

Subsequently, the wire bonding for the ninth tier to the 12th tier, illustrated in FIG. 36 is carried out. The wire bonding for the ninth tier to the 12th tier is exactly the same as the wire bonding (reverse bonding) for the first tier to the fourth tier; therefore, the description thereof will be omitted. Also in the wire bonding for the ninth tier to the 12th tier, highly reliable wire bonding with a reduced loop height can be achieved as in the wire bonding for the first tier to the fourth tier.

<<Die Bonding Step for 13th Tier to 16th Tier>>

As illustrated in FIG. 37, subsequently, die bonding is carried out for the 13th tier. The die bonding for the 13th tier is exactly the same as the die bonding for the fifth tier as the first tier after a turn-back of lamination. That is, a combination of the third semiconductor chip 6 and the first adhesive layer 8 that are both thick is used.

This makes it possible to ensure a height sufficient to prevent interference between the loop of a wire 2 in the directly lower tier (12th tier) and the fourth semiconductor chip 7 lactated directly above (14th tier). Therefore, it is possible to prevent (reduce) interference (contact) between the wire 2 in the lower tier (12th tier) and the fourth semiconductor chip 7 located directly above.

In the first tier in the turn-back lamination (13th tier), a portion of the chip end is overhanged (protruded) from the chip in the lower tier. In the overhanged portion, there are bonding pads whose lower parts are not supported by anything and they must withstand bonding force during wire bonding. Therefore, use of the thick-type third semiconductor chip 6 makes it possible to enhance the strength of the chip itself and prevent (reduce) chip breakage due to bonding force during wire bonding.

Since there are portions whose lower parts are not supported by anything in the overhanged area at the chip end, chip fracture is prone to be caused by pressure from a resin flow during resin molding. Therefore, use of the thick-type third semiconductor chip 6 makes it possible to enhance the strength of the chip itself similarly with the foregoing. In addition, it makes it possible to prevent (reduce) the occurrence of chip fracture due to pressure from a resin flow during resin molding.

Subsequently, the die bonding for the 14th tier to the 16th tier (the uppermost tier) illustrated in FIG. 38 is carried out. The die bonding for the 14th tier and the 15th tier is the same as the die bonding for the sixth tier and the seventh tier. A combination of the thin-type fourth semiconductor chip 7 and the thin second adhesive layer 9 is used.

This makes it possible to reduce the overall thickness of the 16-tiered laminate to reduce the thickness of the LGA 1.

In the 16th tier, which is the uppermost tier, a combination of the first semiconductor chip 4 and the first adhesive layer 8 that are both thick is used.

The semiconductor chip in the 16th tier as the uppermost tier is not especially supported by any member on its upper surface side (first front surface 4a side). Therefore, the foregoing is a measure against chip fracture prone to be caused by pressure from a resin flow during resin molding. Use of the thick-type first semiconductor chip 4 also in the 16th tier makes it possible to implement the following: the strength of the chip itself is enhanced and the occurrence of chip fracture, chip bending, and chip peeling-off due to pressure from a resin flow during resin molding is prevented (reduced).

<<Wire Bonding Step for 13th Tier to 16th Tier>>

Subsequently, the wire bonding for the 13th tier to the 16th tier, illustrated in FIG. 39 is carried out. The wire bonding for the 13th tier to the 16th tier is exactly the same as the wire bonding (reverse bonding) for the fifth tier to the eighth tier; therefore, the description thereof will be omitted. Also in the wire bonding for the 13th tier to the 16th tier, highly reliable wire bonding with a reduced loop height can be achieved as in the wire bonding for the fifth tier to the eighth tier.

<<Molding Step>>

Figure 40:
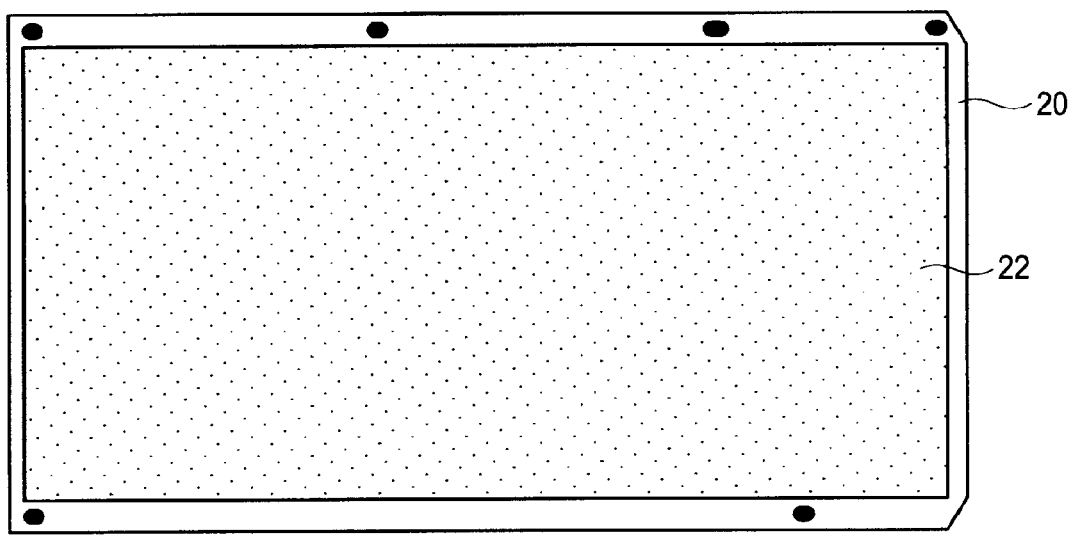
FIG. 40 is a plan view illustrating an example of a structure obtained after resin molding in the assembly of the semiconductor device illustrated in FIG. 1.
Figure 41:
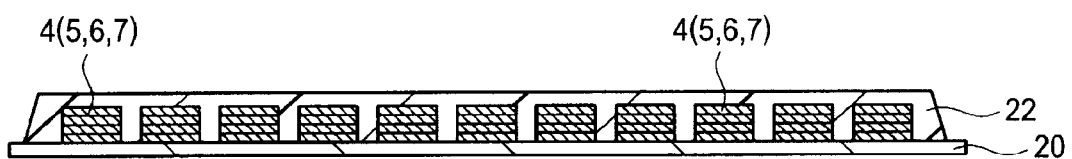
FIG. 41 is a sectional view illustrating an example of the structure illustrated in FIG. 40 after resin molding.
Figure 42:
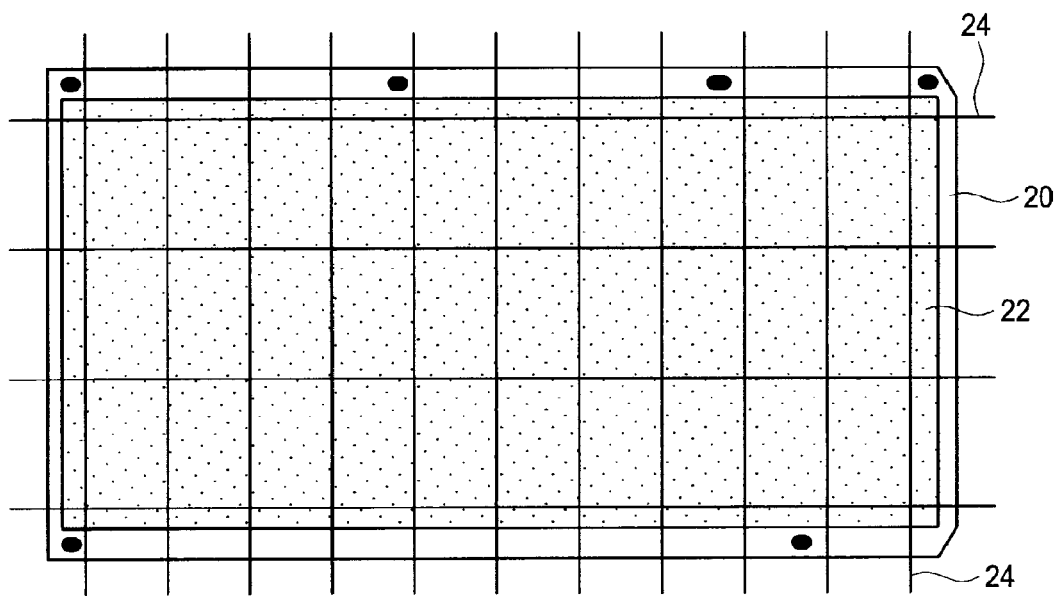
FIG. 42 is a plan view illustrating an example of a structure obtained at the time of segmentation in the assembly of the semiconductor device illustrated in FIG. 1.
Figure 43:
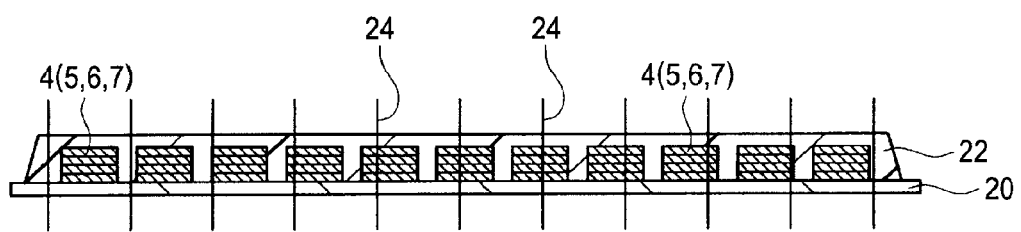
FIG. 43 is a sectional view illustrating an example of the structure illustrated in FIG. 42 at the time of segmentation.

Description will be given to a resin molding step and a segmentation step carried out after the wire bonding step in the assembly of the LGA 1. FIG. 40 is a plan view illustrating an example of a structure obtained after resin molding in the assembly of the semiconductor device illustrated in FIG. 1; FIG. 41 is a sectional view illustrating an example of a structure obtained after the resin molding illustrated in FIG. 40; FIG. 42 is a plan view illustrating an example of a structure obtained at the time of segmentation in the assembly of the semiconductor device illustrated in FIG. 1; and FIG. 43 is a sectional view illustrating an example of the structure obtained at the time of segmentation illustrated in FIG. 42.

In the assembly of LGA 1, resin molding is carried out after the completion of the wire bonding step. At the resin molding step, as illustrated in FIG. 40 and FIG. 41, a blanket sealing body 22 is formed over the multiple substrate 20 that underwent wire bonding using sealing resin by, for example, transfer molding or the like.

Sealing resin containing filler is used as the sealing resin for forming the blanket sealing body 22. As shown in T site in FIG. 39, it is difficult to fill the following gap with sealing resin: the gap 23 sandwiched between the overhanged portion of the second semiconductor chip 5 in the second tier and the wiring board 3 at the lateral of the first semiconductor chip 4 in the first tier. The height of this gap 23 is determined by the thickness of the first semiconductor chip 4 plus the thickness of the first adhesive layer 8. In case of the LGA 1 in the first embodiment, the thickness of the first semiconductor chip 4 is 0.055 mm and the thickness of the first adhesive layer 8 is 0.020 mm. The sum of them is 0.075 mm (75 µm). In this case, as a result, the height of the gap 23 is 0.075 mm (75 µm).

Therefore, the particle size of the filler contained in the sealing resin must be so small that it can enter this gap 23. For example, a filler that passes through a mesh of 50 µm (0.050 mm) is used. A sealing resin containing filler that can pass through a mesh of 50 µm can be sufficiently filled in the gap 23 with a height of 75 µm.

In cases where the semiconductor device is of card type, it is required to ensure strength with the sealing body 10. The sealing body 10 formed of a sealing resin containing filler that can pass through a mesh of 50 µm makes it possible to ensure strength.

In the front surface (or the back surface) of each semiconductor chip, a portion (so-called overhang area) that is not supported by any other semiconductor chip is prone to be warped by resin filling pressure. In this embodiment, as illustrated in FIG. 4, the semiconductor chips in the fifth, ninth, 13th, and 16th tiers have such an overhang area.

In this embodiment, however, the semiconductor chip 4 having the first thickness (Tw1) illustrated in FIG. 5 is used as the semiconductor chips in the fifth, ninth, 13th, and 16th tiers. In other words, a semiconductor chip whose thickness is larger than the thickness of each of the semiconductor chips 5 in the second to fourth, sixth to eighth, 10th to 12th, 14th, and 15th tiers. For this reason, even though resin filling pressure produced at the molding step is applied to these overhang areas, chip cracking can be suppressed.

<<Segmentation Step>>

As illustrated in FIG. 42 and FIG. 43, subsequently, segmentation is carried out to cut the workpiece along imaginary lines 24. When the workpiece is cut, both the blanket sealing body 22 and the multiple substrate 20 are cut together by, for example, blade dicing.

This completes the assembly of the LGA 1 in the first embodiment illustrated in FIG. 1 and FIG. 2.

<Modifications to First Embodiment>

Description will be given to modifications to the first embodiment.

Figure 44:
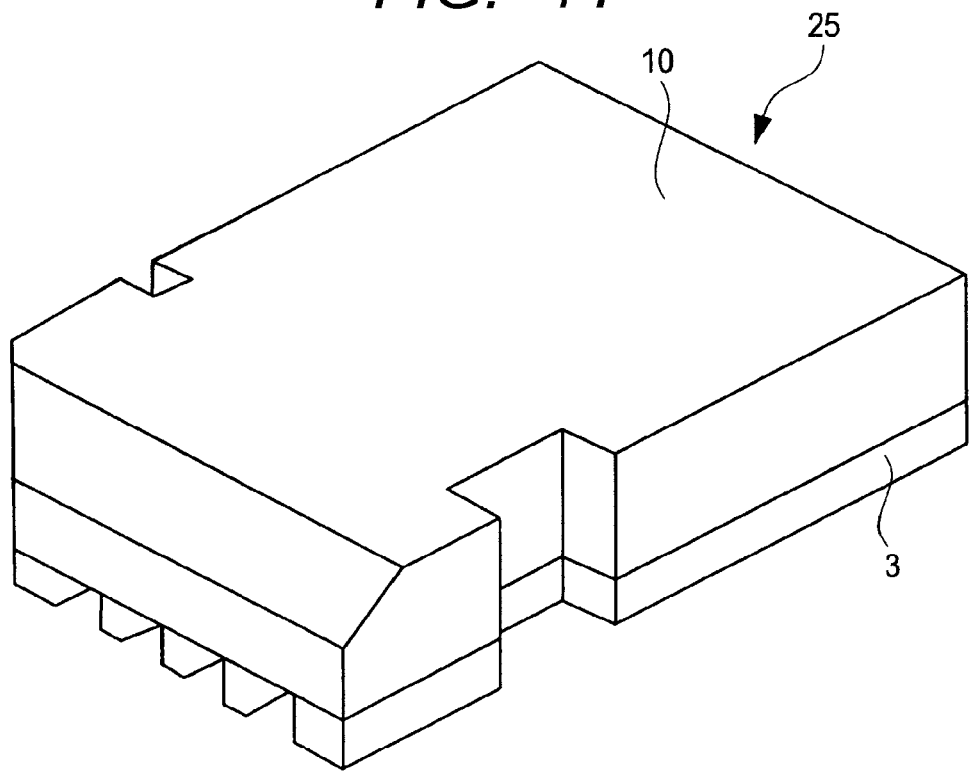
FIG. 44 is a perspective view illustrating the structure of a semiconductor device in a first modification to the first embodiment of the invention.
Figure 45:
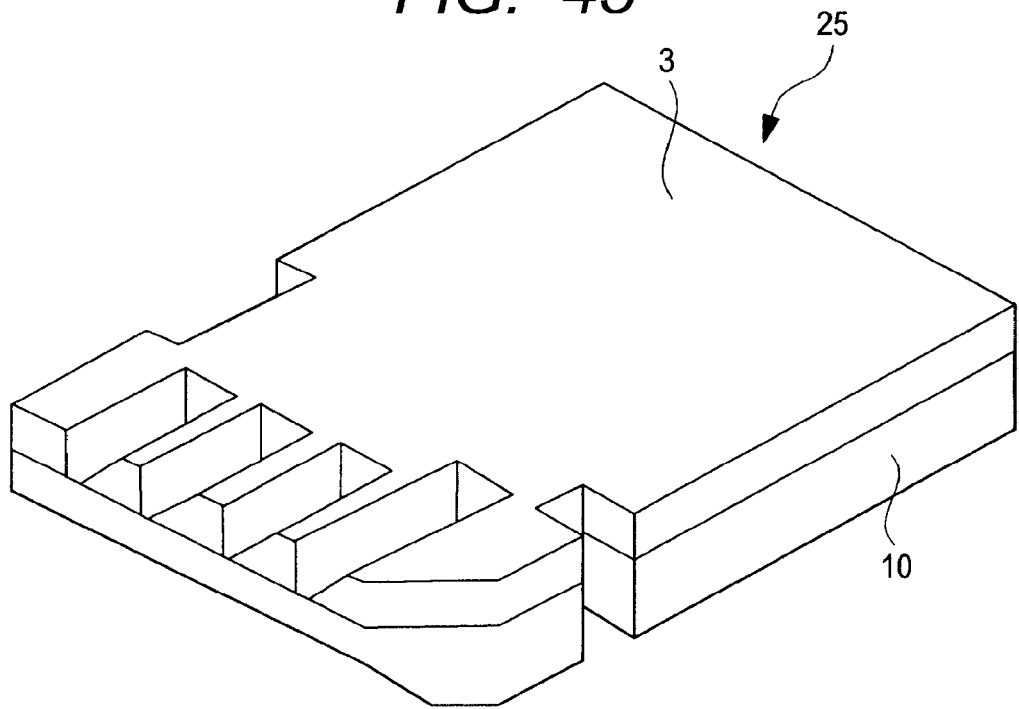
FIG. 45 is a perspective view illustrating an example of the structure of the semiconductor device in FIG. 44 on the back surface side.
Figure 46:
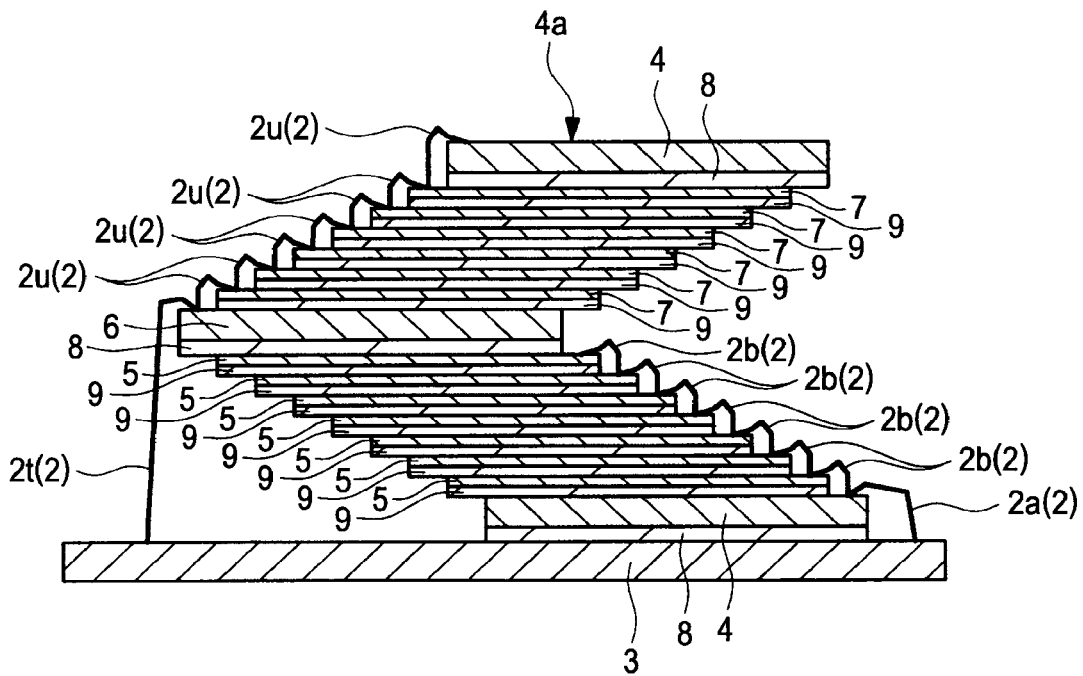
FIG. 46 is a sectional view illustrating the structure of a semiconductor device in a second modification to the first embodiment of the invention.
Figure 47:
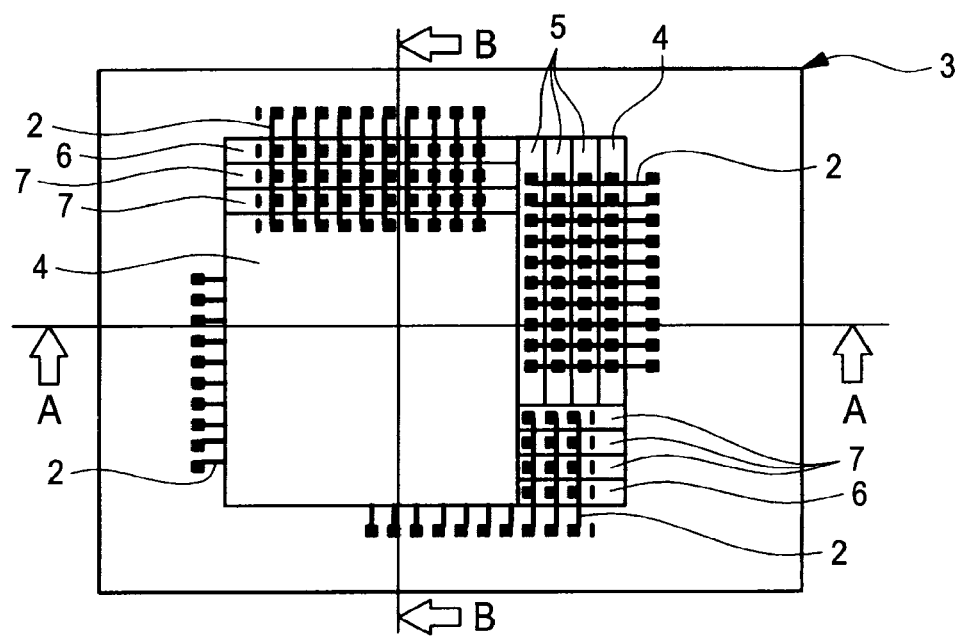
Figure 48:
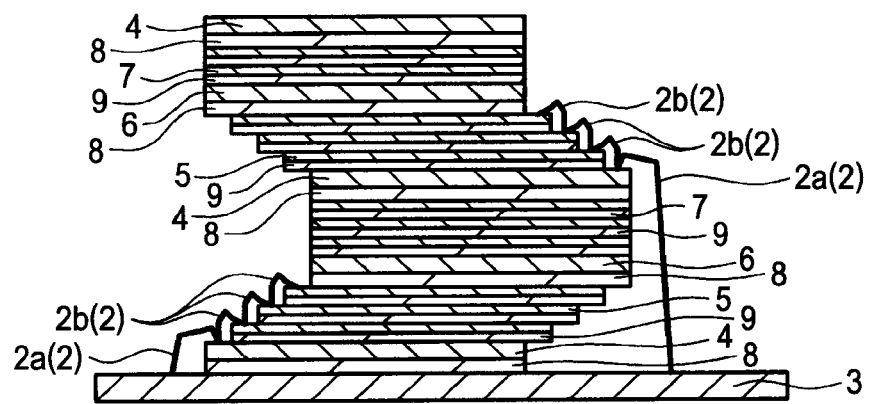
FIG. 48 is a sectional view taken along line A-A of FIG. 47, illustrating an example of the structure of the semiconductor device in FIG. 47.
Figure 49:
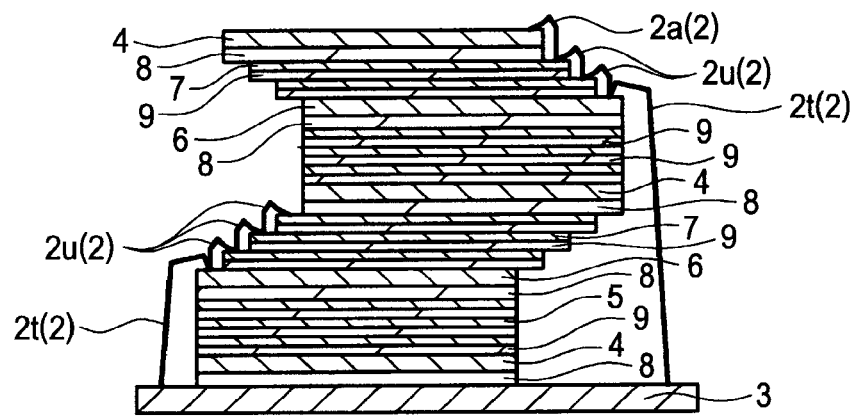
FIG. 49 is a sectional view taken along line B-B of FIG. 47, illustrating an example of the structure of the semiconductor device in FIG. 47.

FIG. 44 is a perspective view illustrating the structure of a semiconductor device in a first modification to the first embodiment of the invention; FIG. 45 is a perspective view illustrating an example of the structure of the semiconductor device in FIG. 44 on the back surface side; and FIG. 46 is a sectional view illustrating the structure of a semiconductor device in a second modification to the first embodiment of the invention. FIG. 47 is a plan view illustrating the structure of a semiconductor device in a third modification to the first embodiment of the invention with a sealing body seen through; FIG. 48 is a sectional view illustrating an example of a structure obtained by cutting the semiconductor device along line A-A of FIG. 47; and FIG. 49 is a sectional view illustrating an example of a structure obtained by cutting the semiconductor device along line B-B of FIG. 47.

The modification illustrated in FIG. 44 and FIG. 45 is a case where the semiconductor device is a card-type semiconductor package 25. In the semiconductor device, the structure, illustrated in FIG. 39, in which multiple thin-type semiconductor chips are laminated over a base material, is incorporated like the LGA 1 in the first embodiment. The card-type semiconductor package 25 is, for example, a microminiature memory card or the like that can be loaded into a card slot of a personal computer and is formed by laminating multiple flash memory chips (nonvolatile memories) over a base material.

The second modification illustrated in FIG. 46 is the structure of a 16-tiered chip laminate in which semiconductor chips are laminated by eight tiers and only one 180-degree turn-back lamination is included on its way. Also in this case, a combination of the thick-type first semiconductor chip 4 (or third semiconductor chip 6) and the thick first adhesive layer 8 is used in the following tiers: the first tier, the ninth tier as the first tier after a turn-back lamination, and the 16th tier as the uppermost tier. As a result, the effect of ensuring the strength of the chips themselves and ensuring the height of steps can be obtained as in the LGA 1 in the first embodiment.

A combination of the thin-type second semiconductor chip 5 (or fourth semiconductor chip 7) and the thin second adhesive layer 9 is used in the second tier to the eighth tier and in the 10th tier to the 15th tier. As a result, the effect of reduction in the thickness of the semiconductor device can be obtained as in the LGA 1.

The third modification illustrated in FIG. 47 to FIG. 49 is the structure of a 16-tiered chip laminate in which the lamination direction is changed by 90 degrees at every four tiers. Also in this case, a combination of the thick-type first semiconductor chip 4 (or third semiconductor chip 6) and the thick first adhesive layer 8 is used in the following tiers: the first tier; the fifth tier after the lamination direction is changed by 90 degrees; the ninth tier after the lamination direction is changed by 90 degrees again; the 13th tier after the lamination direction is changed by 90 degrees once again; and the 16th tier (the uppermost tier). As a result, the effect of ensuring the strength of the chips themselves and ensuring the height of steps can be obtained as in the LGA 1 in the first embodiment.

A combination of the thin-type second semiconductor chip 5 (or fourth semiconductor chip 7) and the thin second adhesive layer 9 is used in the following tiers: the second tier to the fourth tier, the sixth tier to the eighth tier, the 10th tier to the 12th tier, the 14th tier, and the 15th tier. As a result, the effect of reduction in the thickness of the semiconductor device can be obtained as in the LGA 1.

Since the lamination direction is changed three times by 90 degrees, it is possible to reduce the projected area of the laminate of the semiconductor chips and reduce the thickness of the semiconductor device.

(Second Embodiment)

Figure 50:
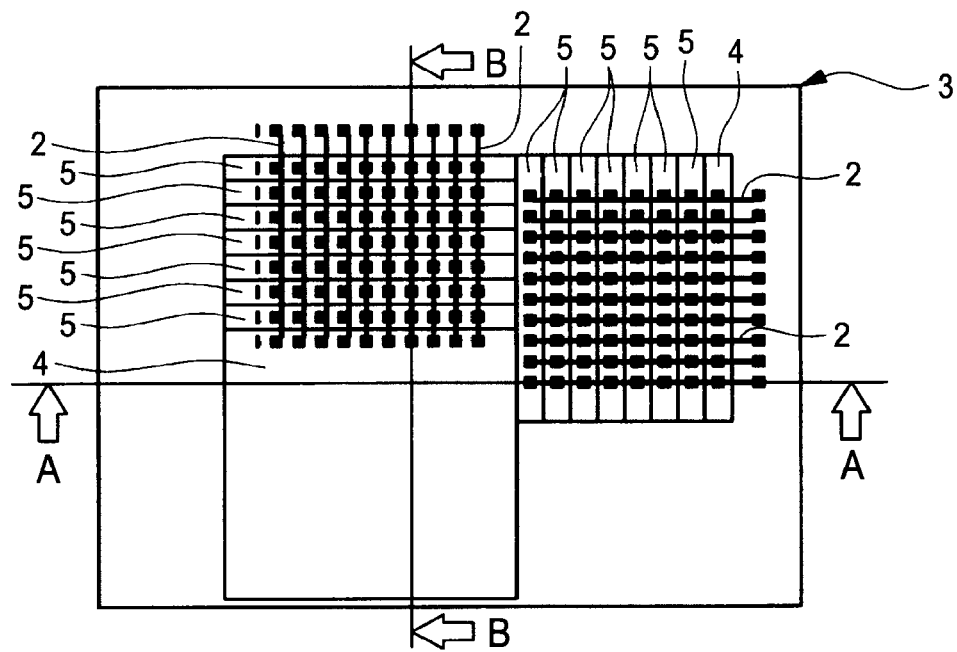
Figure 51:
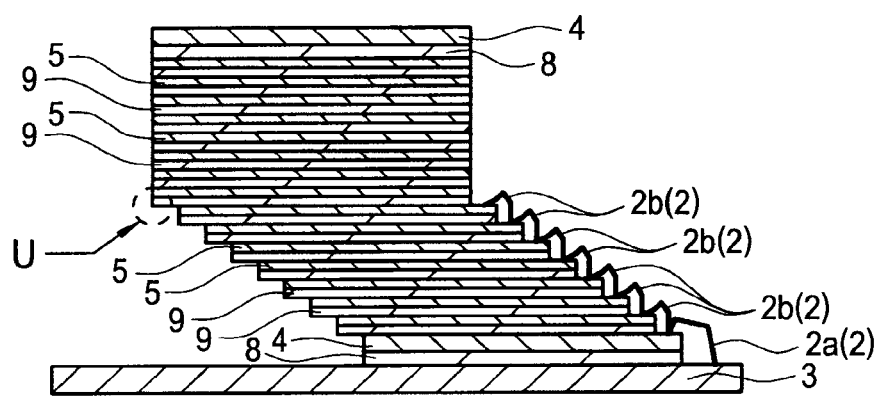
FIG. 51 is a sectional view taken along line A-A of FIG. 50, illustrating an example of the structure of the semiconductor device in FIG. 50.
Figure 52:
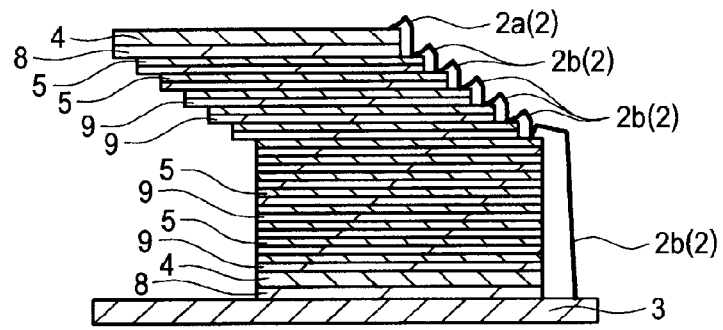
FIG. 52 is a sectional view taken along line B-B of FIG. 50, illustrating an example of the structure of the semiconductor device in FIG. 50.
Figure 53:
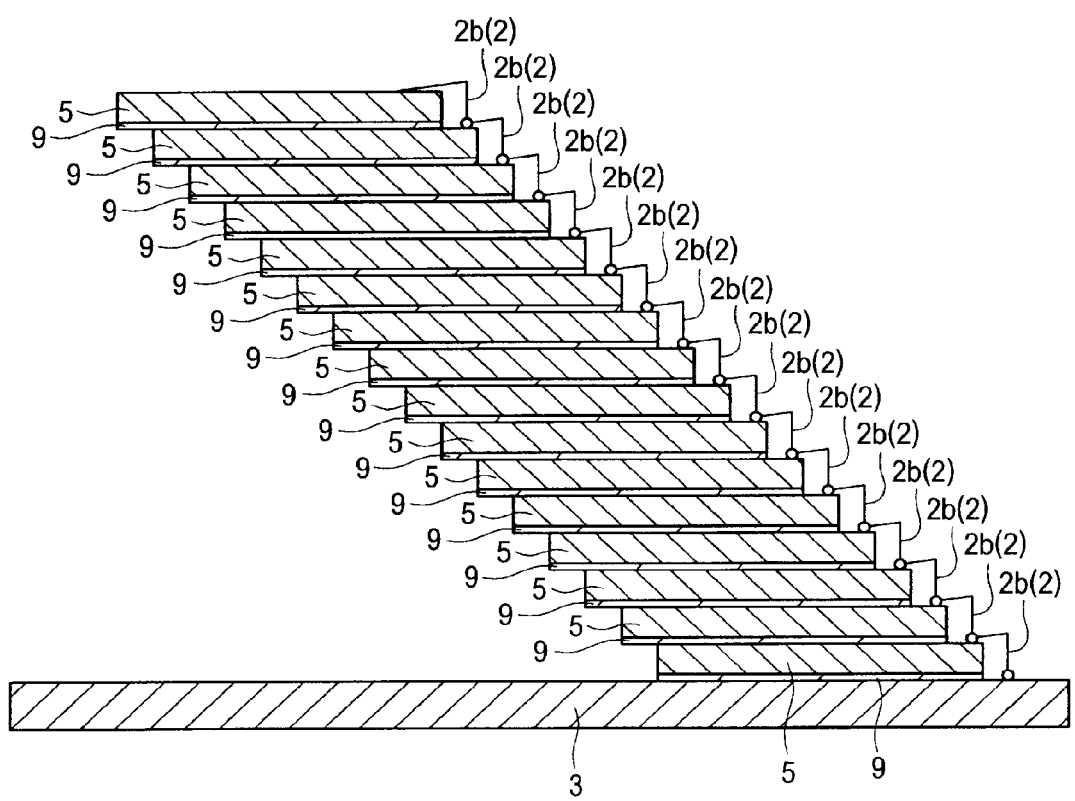
FIG. 53 is an enlarged partial sectional view illustrating the structure of a semiconductor device in a first modification to the second embodiment of the invention.

FIG. 50 is a plan view illustrating an example of the structure of a semiconductor device in the second embodiment of the invention with a sealing body seen through; FIG. 51 is a sectional view illustrating an example of the structure obtained by cutting the semiconductor device along line A-A of FIG. 50; FIG. 52 is a sectional view illustrating an example of the structure obtained by cutting the semiconductor device along line B-B of FIG. 50; and FIG. 53 is an enlarged partial sectional view illustrating the structure of a semiconductor device in a first modification to the second embodiment of the invention.

The semiconductor device in the second embodiment illustrated in FIG. 50 to FIG. 52 is obtained by laminating thin-type semiconductor chips in 16 tiers over a wiring board 3 as the base material as in the first embodiment. The semiconductor device has such a structure that semiconductor chips are laminated by eight tiers with the lamination direction changed by 90 degrees only once on the way. A combination of the thick-type first semiconductor chip 4 (or third semiconductor chip 6) and the thick first adhesive layer 8 is used only in the first tier and the 16th tier as the uppermost tier. A combination of the thin-type second semiconductor chip 5 (or fourth semiconductor chip 7) and the thin second adhesive layer 9 is used in the other intermediate tiers.

The lamination direction is changed only by 90 degrees. Therefore, even at the place of lamination direction change, a wire 2 in the lower tier is not brought into contact with the semiconductor chip in the upper tier and it is unnecessary to ensure a chip height sufficient for a wire loop. Therefore, a combination of the thin-type second semiconductor chip 5 (or fourth semiconductor chip 7) and the thin second adhesive layer 9 can be used in the tiers other than the first tier and the 16th tier as the uppermost tier. This makes it possible to reduce the height of the chip laminate to reduce the thickness of the semiconductor device.

However, a thick-type semiconductor chip may be used as the semiconductor chip in the ninth tier as the first tier after lamination direction change. This makes it possible to suppress the occurrence of chip cracking due to the following force: force produced when a wire 2 is joined to a bonding pad formed in a portion that is not supported by the semiconductor chip in the eighth tier as at U site in FIG. 51.

Up to this point, concrete description has been given to the invention made by the present inventors based on embodiments of the invention. However, the invention is not limited to these embodiments and can be variously modified without departing from its subject matter, needless to add.

For example, the semiconductor device may be configured as in the first modification to fifth modification described below:

(First Modification)

FIG. 53 illustrates the first modification in which the thin-type second semiconductor chip 5 (or fourth semiconductor chip 7) acquired by the dicing method, illustrated in FIG. 12, described in relation to the first embodiment is used in all the 16 tiers and laminated. The first modification has a structure in which turn-back lamination is not carried out. Also in this semiconductor device with such a laminated structure, chip cracking can be suppressed even when the thickness of the semiconductor wafer is reduced. This is done by advancing a blade toward the reference portion formed in the semiconductor wafer, as mentioned above, at the dicing step for the semiconductor wafer. However, since semiconductor chips rectangular in planar shape are placed stepwise in multiple tiers with an identical lamination direction, the first modification is unsuitable for semiconductor device size reduction as compared with such a laminated structure as in the first embodiment.

The number of laminated thin-type second semiconductor chips 5 (or fourth semiconductor chips 7) is not limited to 16 and they may be laminated in any number of tiers as long as the number is two or above.

(Second Modification)

Description will be given to the second modification.

Figure 54:
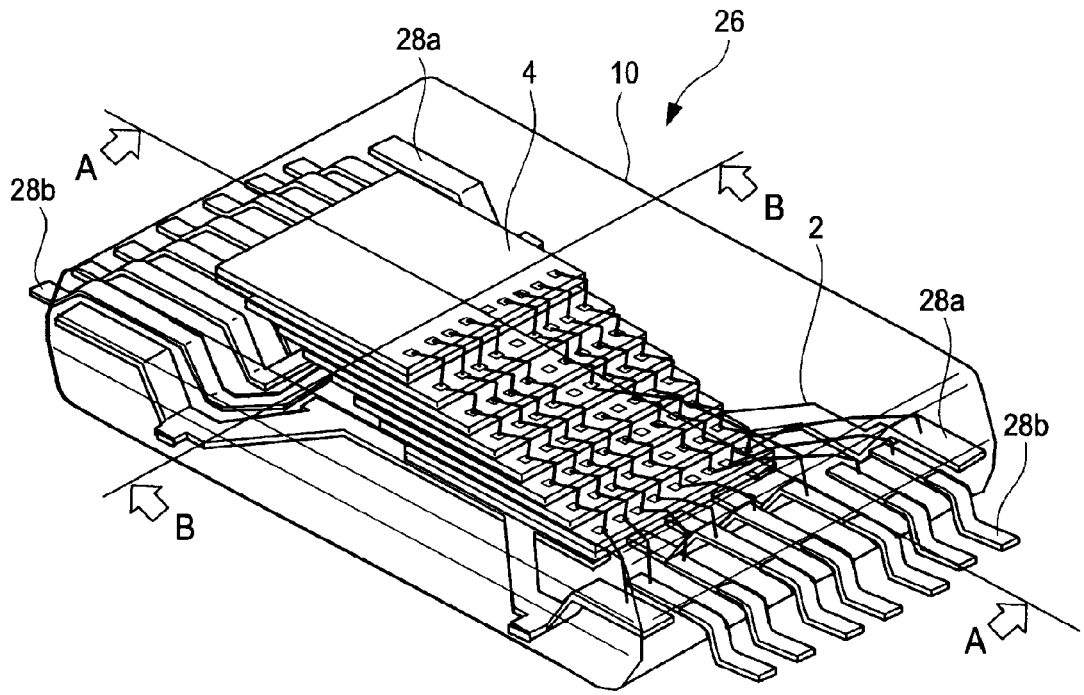
Figure 55:
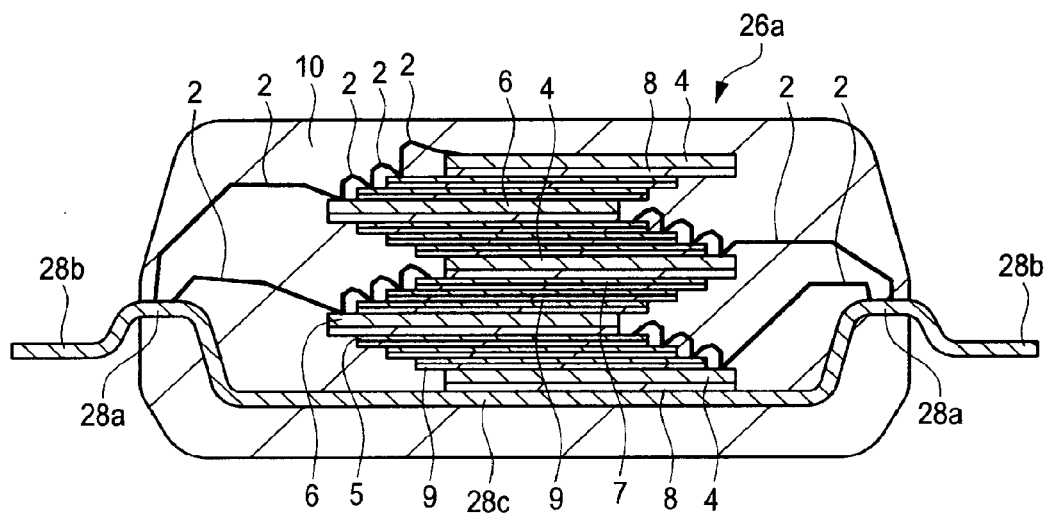
FIG. 55 is a sectional view taken along line A-A of FIG. 54, illustrating an example of a 16-tiered chip laminated structure.
Figure 56:
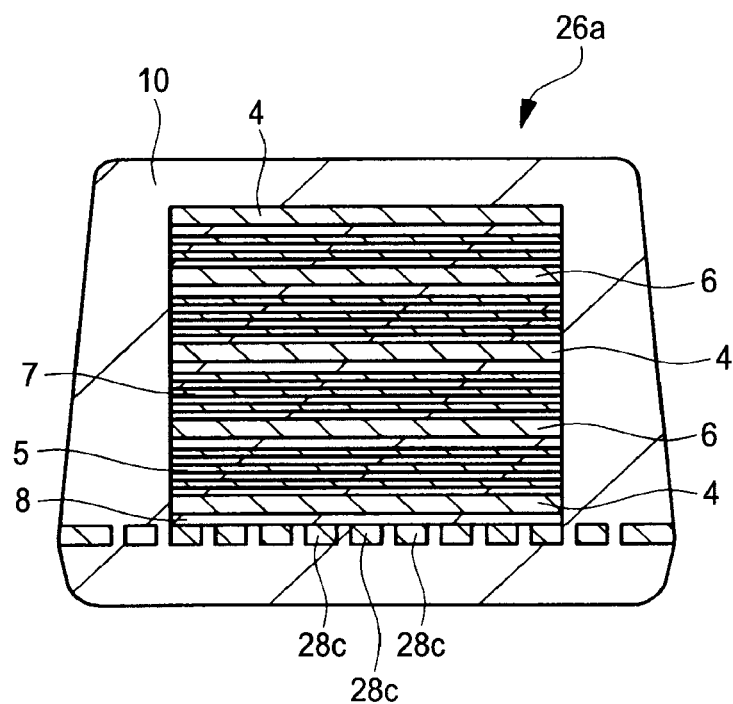
FIG. 56 is a sectional view taken along line B-B of FIG. 54, illustrating an example of the 16-tiered chip laminated structure.
Figure 57:
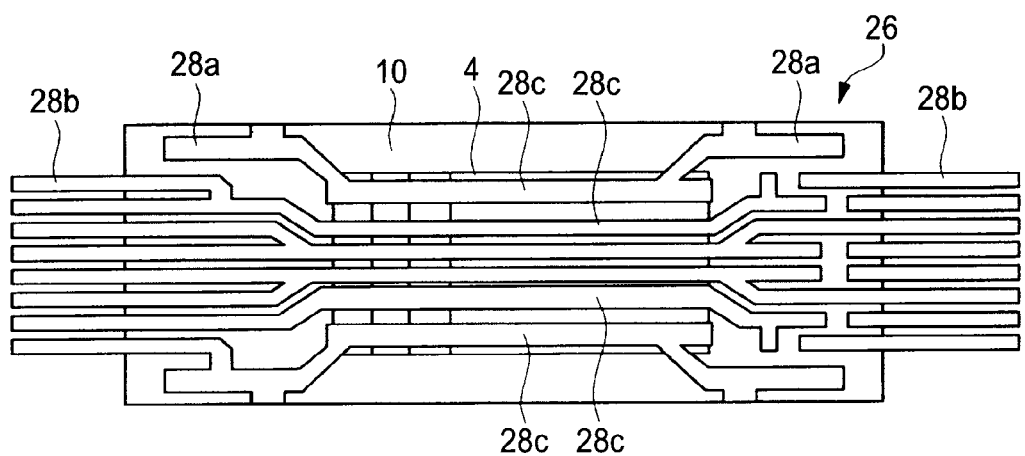
Figure 58:
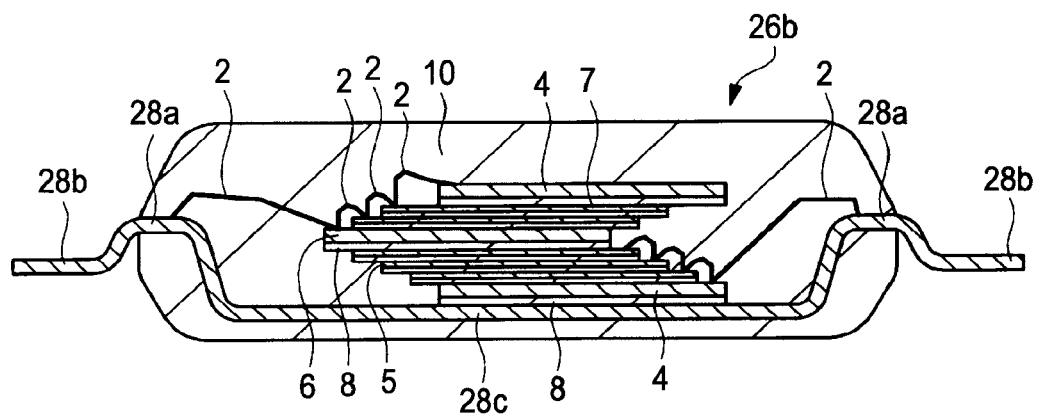
FIG. 58 is a sectional view taken along line A-A of FIG. 54, illustrating an example of an eight-tiered chip laminated structure.
Figure 59:
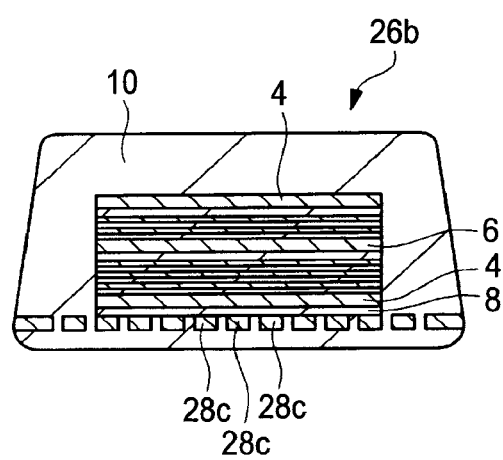
FIG. 59 is a sectional view taken along line B-B of FIG. 54, illustrating an example of the eight-tiered chip laminated structure.
Figure 60:
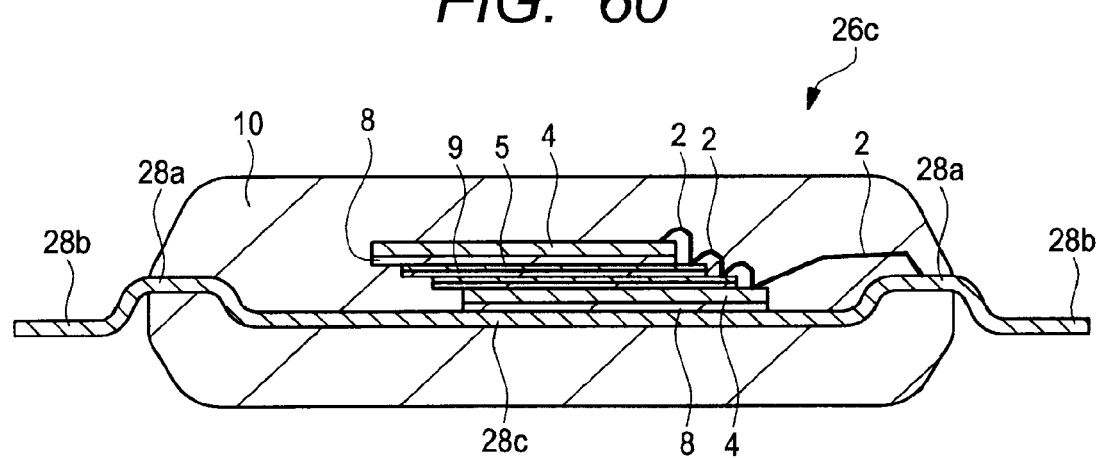
FIG. 60 is a sectional view taken along line A-A of FIG. 54, illustrating an example of a four-tiered chip laminated structure.
Figure 61:
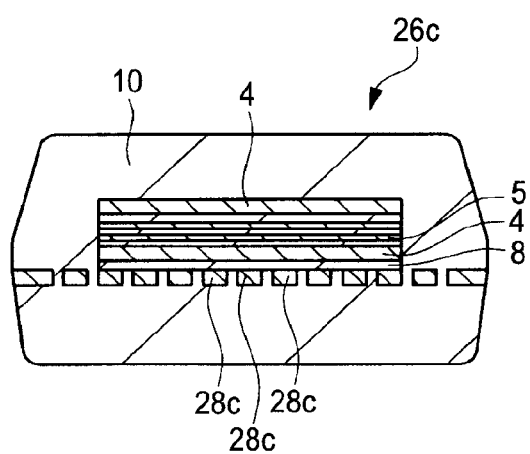
FIG. 61 is a sectional view taken along line B-B of FIG. 54, illustrating an example of a four-tiered chip laminated structure.

FIG. 54 is a perspective view illustrating an example of the structure of a semiconductor device in the second modification (one-side mounting) to the second embodiment of the invention with a sealing body seen through; FIG. 55 is a sectional view illustrating an example of a 16-tiered chip laminated structure obtained by cutting the semiconductor device along line A-A of FIG. 54; FIG. 56 is a sectional view illustrating an example of the 16-tiered chip laminated structure obtained by cutting the semiconductor device along line B-B of FIG. 54; FIG. 57 is a back side back view illustrating the structure of the semiconductor device in FIG. 54 on the back surface side with a sealing body seen through. FIG. 58 is a sectional view illustrating an example of an eight-tiered chip laminated structure obtained by cutting the semiconductor device along line A-A of FIG. 54; FIG. 59 is a sectional view illustrating an example of the eight-tiered chip laminated structure obtained by cutting the semiconductor device along line B-B of FIG. 54; FIG. 60 is a sectional view illustrating an example of a four-tiered chip laminated structure obtained by cutting the semiconductor device along line A-A of FIG. 54; and FIG. 61 is a sectional view illustrating an example of the four-tiered chip laminated structure obtained by cutting the semiconductor device along line B-B of FIG. 54.

The semiconductor device in the second modification illustrated in FIG. 54 is a frame-type semiconductor package 26 assembled using a lead frame (base material). The semiconductor device includes: multiple semiconductor chips (first semiconductor chip 4, second semiconductor chip 5, third semiconductor chip 6, and fourth semiconductor chip 7) laminated over one surface (one side) of a lead (wiring pattern); inner leads 28a as wiring patterns and outer leads 28b that are connected thereto and become external terminals; and multiple wires 2 that join together the electrodes of each semiconductor chip and the inner leads 28a. As illustrated in FIG. 57, further, multiple coupling leads 28c that respectively couple together the inner leads 28a arranged on both sides of the laminated semiconductor chips are arranged under the chips. The semiconductor chips, inner leads 28a, coupling leads 28c, and wires 2 are sealed with a sealing body 10.

The frame-type semiconductor package 26a illustrated in FIG. 55 and FIG. 56 has a structure in which semiconductor chips are laminated in 16 tiers in total by four tiers with the lamination direction changed by 180 degrees at every four tiers.

The frame-type semiconductor package 26b illustrated in FIG. 58 and FIG. 59 has a structure in which semiconductor chips are laminated in eight tiers in total by four tiers with the lamination direction changed by 180 degrees only once at the fifth tier.

The frame-type semiconductor package 26c illustrated in FIG. 60 and FIG. 61 has a structure in which semiconductor chips are laminated in four tiers.

(Third Modification)

Description will be given to the third modification.

Figure 62:
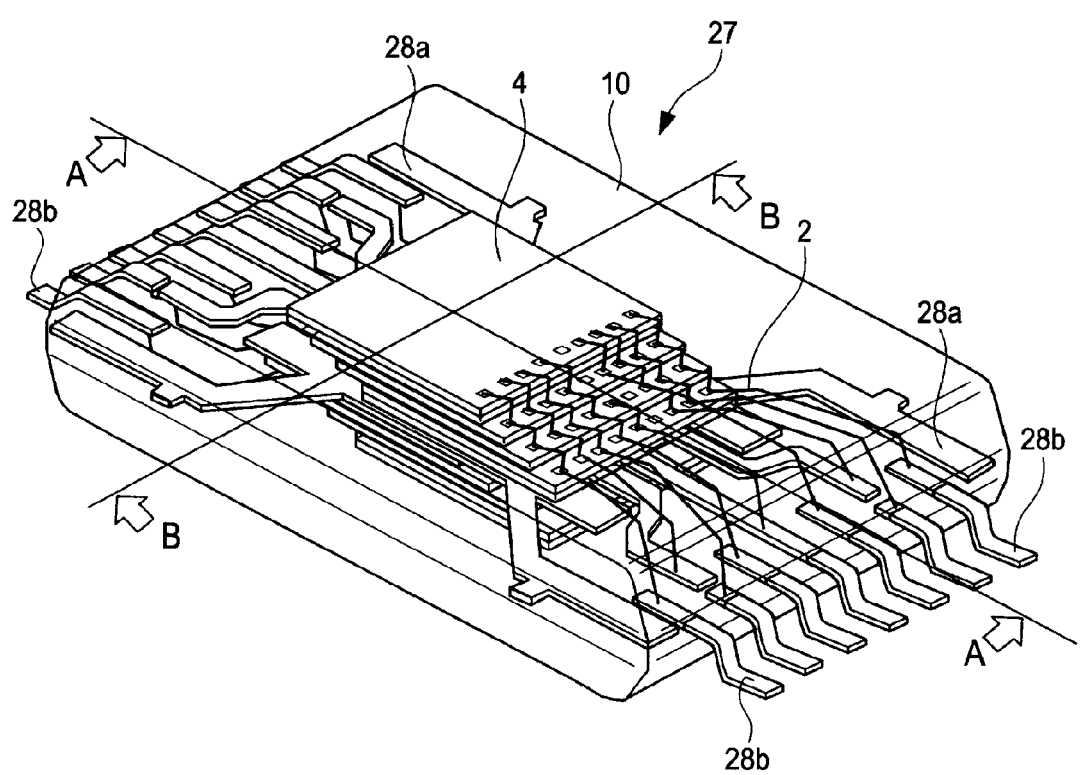
Figure 63:
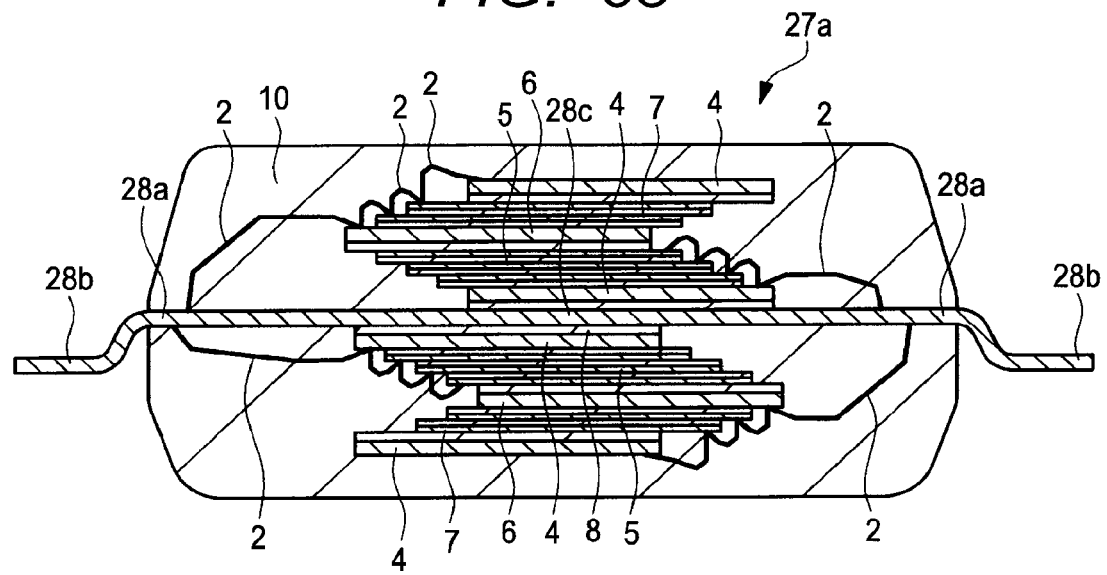
FIG. 63 is a sectional view taken along line A-A of FIG. 62, illustrating an example of a 16-tiered chip laminated structure.
Figure 64:
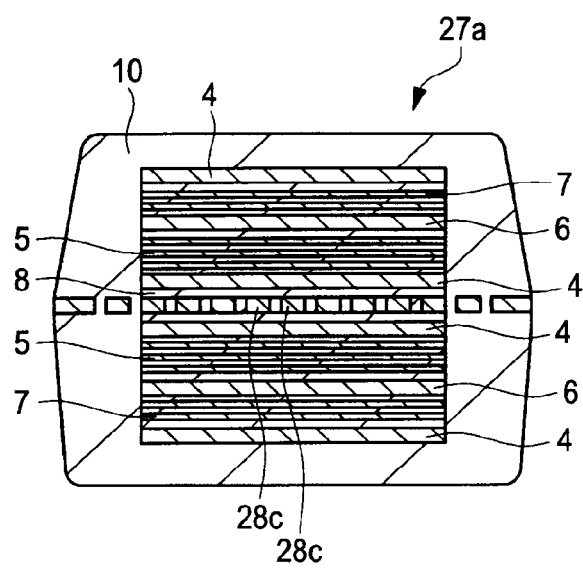
FIG. 64 is a sectional view taken along line B-B of FIG. 62, illustrating an example of the 16-tiered chip laminated structure.
Figure 65:
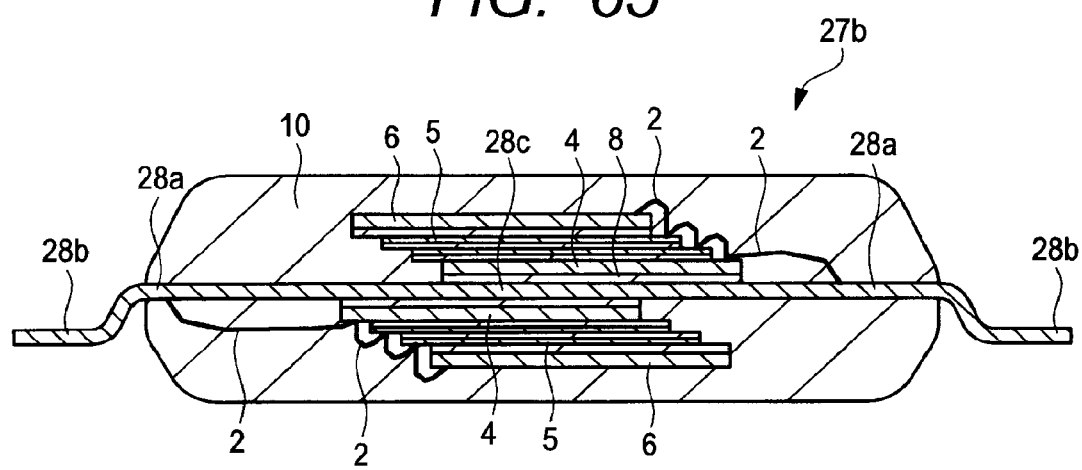
FIG. 65 is a sectional view taken along line A-A of FIG. 62, illustrating an example of an eight-tiered chip laminated structure.

FIG. 62 is a perspective view illustrating an example of the structure of a semiconductor device in the third modification (both-side mounting) to the second embodiment of the invention with a sealing body seen through; FIG. 63 is a sectional view illustrating an example of a 16-tiered chip laminated structure obtained by cutting the semiconductor device along line A-A of FIG. 62; FIG. 64 is a sectional view illustrating an example of the 16-tiered chip laminated structure obtained by cutting the semiconductor device along line B-B of FIG. 62; FIG. 65 is a sectional view illustrating an eight-tiered chip laminated structure obtained by cutting the semiconductor device along line A-A of FIG. 62; and FIG. 66 is a sectional view illustrating an example of the eight-tiered chip laminated structure obtained by cutting the semiconductor device along line B-B of FIG. 62.

The semiconductor device in the third modification illustrated in FIG. 62 is a frame-type semiconductor package 27 assembled using a lead frame. The semiconductor device includes: multiple semiconductor chips laminated on both sides of a lead (wiring pattern); inner leads 28a as wiring patterns and outer leads 28b that are connected thereto and become external terminals; and multiple wires 2 that join together the electrodes of each semiconductor chip and the inner leads 28a.

The frame-type semiconductor package 27a illustrated in FIG. 63 and FIG. 64 has a structure in which the following measure is taken: on one side of the lead, semiconductor chips are laminated in eight tiers by four tiers with the lamination direction changed only once by 180 degrees at the fifth tier. This structure is formed on both sides of the semiconductor package. That is, the 16 semiconductor chips (first semiconductor chips 4, second semiconductor chips 5, third semiconductor chips 6, and fourth semiconductor chips 7) are placed over the coupling leads 28c on both sides.

Figure 66:
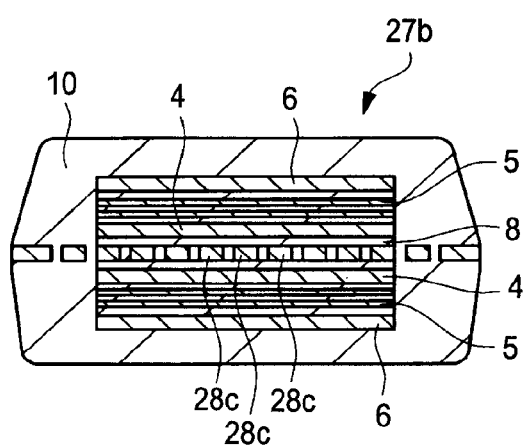
FIG. 66 is a sectional view taken along line B-B of FIG. 62, illustrating an example of the eight-tiered chip laminated structure.

The frame-type semiconductor package 27b illustrated in FIG. 65 and FIG. 66 has a structure in which semiconductor chips are laminated in four tiers on one side. This structure is formed on both sides. That is, the eight semiconductor chips (first semiconductor chips 4, second semiconductor chips 5) are placed over the coupling leads 28c on both sides.

In these frame-type semiconductor packages 26a, 26b, 26c, 27a, 27b, the coupling leads 28c as multiple independent wiring patterns are routed under the chips as illustrated in FIG. 56, FIG. 57, FIG. 59, FIG. 61, FIG. 64, and FIG. 66. It is difficult to enhance the flatness in the independent coupling leads 28c.

To cope with this, a combination of the thick-type first semiconductor chip 4 and the thick first adhesive layer 8 is used as the semiconductor chip in the lowermost tier joined to the multiple coupling leads 28c. As a result, unevenness arising from the independent coupling leads 28c can be absorbed.

A combination of the thick-type first semiconductor chip 4 (or third semiconductor chip 6) and the thick first adhesive layer 8 is used in the lowermost tier, the first tier after a turn-back, and the uppermost tier as in the LGA 1 in the first embodiment. As a result, the effect of ensuring the strength of the chips themselves and ensuring the height of steps can be obtained.

A combination of the thin-type second semiconductor chip 5 (or fourth semiconductor chip 7) and the thin second adhesive layer 9 is used in the tiers other than the lowermost tier, the first tier after a turn-back, and the uppermost tier. As a result, the effect of reduction in the thickness of the semiconductor device can be obtained as in the LGA 1.

(Fourth Modification)

In the description of the first embodiment, the LGA 1 has been taken as an example of the semiconductor device. However, the semiconductor device need not be LGA 1 and may be BGA (Ball Grid Array) or the like in which thin-type semiconductor chips are placed over a wiring board 3 as a base material.

(Fifth Modification)

In the description of the first embodiment, a case where the following measure is taken to absorb unevenness arising from a wiring pattern or the like, formed in the upper surface 3a of the wiring board 3 has been taken as an example: a combination of the thick-type first semiconductor chip 4 and the thick first adhesive layer 8 is used. When the flatness of the upper surface 3a of the wiring board 3 is ensured, a combination of the thin-type semiconductor chip and the thin adhesive layer may be used for the semiconductor chip in the lowermost tier. In this case, the multiple-tiered chip lamination has the following configuration: a configuration in which the first, second, fourth semiconductor chips are of thin-type and only the third semiconductor chip is thicker than the first, second, and fourth semiconductor chips.

(Sixth Modification)

In the description of the first and second embodiments, cases where the following measure is taken have been taken as examples: the thickness of the adhesive layer formed over the back surface 4d of the first semiconductor chip 4 having the first thickness (Tw1) is made larger than the following thickness: the thickness of the adhesive layer formed over the back surface 5d of the second semiconductor chip 5 having the second thickness (Tw2). However, the adhesive layer 9 having the second thickness (Td2) illustrated in FIG. 6 may be used as the adhesive layer formed over the semiconductor chip in, for example, the fifth tier as long as the following condition is met: the thickness of the first semiconductor chip 4 used as the semiconductor chip in the fifth tier should be sufficient to prevent contact between a wire joined to the semiconductor chip in the fourth tier and the semiconductor chip in the sixth tier. This makes it possible to reduce the thickness of the semiconductor device (LGA) 1.

The invention is suitable for assembling an electronic device formed by laminating thin-type semiconductor chips.

What is claimed is:

1. A semiconductor device, comprising:
a base material having a surface, a wiring formed on the surface, and a solder resist film covering the wiring;
a first chip group including a first semiconductor chip and a second semiconductor chip, and mounted on a surface of the solder resist film;
a second chip group including a first semiconductor chip, a second semiconductor chip and a third semiconductor chip, and mounted on the first chip group;
a first wire group including a plurality of first wires and a plurality of second wires, and connected with the first chip group;
a second wire group including a plurality of first wires, a plurality of second wires and a plurality of third wires, and connected with the second chip group; and
a sealing body sealing the first chip group, the second chip group, the first wire group and the second wire group,
wherein the sealing body has a first side surface and a second side surface opposite to the first side surface,
wherein the first semiconductor chip of the first chip group has a side surface along which a plurality of pads connected with the plurality of first wires of the first wire group are arranged, and facing the first side surface of the sealing body,
wherein the second semiconductor chip of the first chip group has a side surface along which a plurality of pads connected with the plurality of second wires of the first wire group are arranged, and facing the first side surface of the sealing body,
wherein the first semiconductor chip of the second chip group has a side surface along which a plurality of pads connected with the plurality of first wires of the second wire group are arranged, and facing the second side surface of the sealing body,
wherein the second semiconductor chip of the second chip group has a side surface along which a plurality of pads connected with the plurality of second wires of the second wire group are arranged, and facing the second side surface of the sealing body,
wherein the third semiconductor chip of the second chip group has a side surface along which a plurality of pads connected with the plurality of third wires of the second wire group are arranged, and facing the second side surface of the sealing body,
wherein the first semiconductor chip of the first chip group is a lowermost chip,
wherein the first semiconductor chip of the second chip group is a lowermost chip of the second chip group,
wherein the third semiconductor chip of the second chip group is an uppermost chip,
wherein each of the third semiconductor chip of the second chip group, the first semiconductor chip of the second chip group and the first semiconductor chip of the first chip group has greater thickness than each of the second semiconductor chip of the first chip group and the second semiconductor chip of the second chip group, and
wherein the third semiconductor chip of the second chip group, the first semiconductor chip of the second chip group and the first semiconductor chip of the first chip group have the same thickness.

2. The semiconductor device according to claim 1, wherein the first semiconductor chip of the second chip group includes a first part in which the plurality of pads connected with the plurality of first wires of the second wire group are formed, and
wherein the first part of the first semiconductor chip of the second chip group is protruded, in a first direction along the surface of the base material, from the first chip group toward the second side surface of the sealing body.

3. The semiconductor device according to claim 1, wherein the first semiconductor chip of the first chip group is mounted via a first adhesive layer,
wherein the second semiconductor chip of the first chip group is mounted via a second adhesive layer, and
wherein a thickness of the first adhesive layer is larger than a thickness of the second adhesive layer.

4. The semiconductor device according to claim 3, wherein the first semiconductor chip of the second chip group is mounted via a third adhesive layer,
wherein the second semiconductor chip of the second chip group is mounted via a fourth adhesive layer,
wherein the third semiconductor chip of the second chip group is mounted via a fifth adhesive layer, and wherein a thickness of each of the third adhesive layer and the fifth adhesive layer is larger than a thickness of the fourth adhesive layer.

5. The semiconductor device according to claim 4, wherein the first adhesive layer, the third adhesive layer and the fifth adhesive layer have the same thickness.

6. The semiconductor device according to claim 1, wherein the second chip group is mounted on the first chip group via a third chip group including a first semiconductor chip and a second semiconductor chip and a fourth chip group including a first semiconductor chip and a second semiconductor chip,
wherein a plurality of first wires of a third wire group are connected with the first semiconductor chip of the third chip group,
wherein a plurality of second wires of the third wire group are connected with the second semiconductor chip of the third chip group,
wherein a plurality of first wires of a fourth wire group are connected with the first semiconductor chip of the fourth chip group,
wherein a plurality of second wires of the fourth wire group are connected with the second semiconductor chip of the fourth chip group, and
wherein the first chip group, the second chip group, the third chip group, the fourth chip group, the first wire group, the second wire group, the third wire group and the fourth wire group are sealed with the sealing body.

7. The semiconductor device according to claim 6, wherein the first semiconductor chip of the third chip group has a side surface along which a plurality of pads connected with the plurality of first wires of the third wire group are arranged, and facing the first side surface of the sealing body,
wherein the second semiconductor chip of the third chip group has a side surface along which a plurality of pads connected with the plurality of second wires of the third wire group are arranged, and facing the first side surface of the sealing body,
wherein the first semiconductor chip of the fourth chip group has a side surface along which a plurality of pads connected with the plurality of first wires of the fourth wire group are connected are arranged, and facing the second side surface of the sealing body, and
wherein the second semiconductor chip of the fourth chip group has a side surface along which a plurality of pads connected with the plurality of second wires of the fourth wire group are arranged, and facing the second side surface of the sealing body.

8. The semiconductor device according to claim 7, wherein each of the third semiconductor chip of the second chip group, the first semiconductor chip of the second chip group, the first semiconductor chip of the third chip group, the first semiconductor chip of the fourth chip group and the first semiconductor chip of the first chip group has greater thickness than each of the second semiconductor chip of the second chip group, the second semiconductor chip of the third chip group, the second semiconductor chip of the fourth chip group and the second semiconductor chip of the first chip group, and
wherein the third semiconductor chip of the second chip group, the first semiconductor chip of the second chip group, the first semiconductor chip of the third chip group, the first semiconductor chip of the fourth chip group and the first semiconductor chip of the first chip group have the same thickness.

9. A semiconductor device, comprising:
a base material having a surface, a wiring formed on the surface, and a solder resist film covering the wiring;
a first chip group including a first semiconductor chip and a plurality of second semiconductor chips, and mounted on a surface of the solder resist film;
a second chip group including a first semiconductor chip, a plurality of second semiconductor chips and a third semiconductor chip, and mounted on the first chip group;
a first wire group including a plurality of first wires and a plurality of second wires, and connected with the first chip group;
a second wire group including a plurality of first wires, a plurality of second wires and a plurality of third wires, and connected with the second chip group; and
a sealing body sealing the first chip group, the second chip group, the first wire group and the second wire group,
wherein the sealing body has a first side surface and a second side surface opposite to the first side surface,
wherein the first semiconductor chip of the first chip group has a side surface along which a plurality of pads connected with the plurality of first wires of the first wire group are arranged, and facing the first side surface of the sealing body,
wherein each of the plurality of second semiconductor chips of the first chip group has a side surface along which a plurality of pads connected with the plurality of second wires of the first wire group are arranged, and facing the first side surface of the sealing body,
wherein the first semiconductor chip of the second chip group has a side surface along which a plurality of pads connected with the plurality of first wires of the second wire group are arranged, and facing the second side surface of the sealing body,
wherein each of the plurality of second semiconductor chips of the second chip group has a side surface along which a plurality of pads connected with the plurality of second wires of the second wire group are arranged, and facing the second side surface of the sealing body,
wherein the third semiconductor chip of the second chip group has a side surface along which a plurality of pads connected with the plurality of third wires of the second wire group are arranged, and facing the second side surface of the sealing body,
wherein the first semiconductor chip of the first chip group is a lowermost chip,
wherein the first semiconductor chip of the second chip group is a lowermost chip of the second chip group,
wherein the third semiconductor chip of the second chip group is an uppermost chip,
wherein each of the third semiconductor chip of the second chip group, the first semiconductor chip of the second chip group and the first semiconductor chip of the first chip group has greater thickness than each of the plurality of second semiconductor chips of the first chip group and the plurality of second semiconductor chips of the second chip group, and
wherein the third semiconductor chip of the second chip group, the first semiconductor chip of the second chip group and the first semiconductor chip of the first chip group have the same thickness.

10. The semiconductor device according to claim 9, wherein the first semiconductor chip of the second chip group includes a first part in which the plurality of pads connected with the plurality of first wires of the second wire group ed are formed, and
wherein the first part of the first semiconductor chip of the second chip group is protruded, in a first direction along the surface of the base material, from the first chip group toward the second side surface of the sealing body.

11. The semiconductor device according to claim 9, wherein the first semiconductor chip of the first chip group is mounted via a first adhesive layer,
   wherein the plurality of second semiconductor chips of the first chip group are mounted via a plurality of second adhesive layers, respectively, and
   wherein a thickness of the first adhesive layer is larger than a thickness of each of the plurality of second adhesive layers.

12. The semiconductor device according to claim 11, wherein the first semiconductor chip of the second chip group is mounted via a third adhesive layer,
   wherein the plurality of second semiconductor chips of the second chip group are mounted via a plurality of fourth adhesive layers, respectively,
   wherein the third semiconductor chip of the second chip group is mounted via a fifth adhesive layer, and
   wherein each of the third adhesive layer and the fifth adhesive layer has greater thickness than each of the plurality of fourth adhesive layers.

13. The semiconductor device according to claim 12, wherein the first adhesive layer, the third adhesive layers and the fifth adhesive layer have the same thickness.

14. The semiconductor device according to claim 9, wherein the second chip group is mounted on the first chip group via a third chip group including a first semiconductor chip and a plurality of second semiconductor chips and a fourth chip group including a first semiconductor chip and a plurality of second semiconductor chips,
   wherein a plurality of first wires of a third wire group are connected with the first semiconductor chip of the third chip group,
   wherein a plurality of second wires of the third wire group are connected with the plurality of second semiconductor chips of the third chip group, respectively,
   wherein a plurality of first wires of a fourth wire group are connected with the first semiconductor chip of the fourth chip group,
   wherein a plurality of second wires of the fourth wire group are connected with the plurality of second semiconductor chips of the fourth chip group, respectively, and
   wherein the first chip group, the second chip group, the third chip group, the fourth chip group, the first wire group, the second wire group, the third wire group and the fourth wire group are sealed with the sealing body.

15. The semiconductor device according to claim 14, wherein the first semiconductor chip of the third chip group has a side surface along which a plurality of pads connected with the plurality of first wires of the third wire group are arranged, and facing the first side surface of the sealing body,
   wherein each of the plurality of second semiconductor chips of the third chip group has a side surface along which a plurality of pads connected with the plurality of second wires of the third wire group are arranged, and facing the first side surface of the sealing body,
   wherein the first semiconductor chip of the fourth chip group has a side surface along which a plurality of pads connected with the plurality of first wires of the fourth wire group are arranged, and facing the second side surface of the sealing body, and
   wherein each of the plurality of second semiconductor chips of the fourth chip group has a side surface along which a plurality of pads connected with the plurality of second wires of the fourth wire group are arranged, and facing the second side surface of the sealing body.

16. The semiconductor device according to claim 15, wherein each of the third semiconductor chip of the second chip group, the first semiconductor chip of the second chip group, the first semiconductor chip of the third chip group, the first semiconductor chip of the fourth chip group and the first semiconductor chip of the first chip group has greater thickness than each of the plurality of second semiconductor chips of the second chip group, the plurality of second semiconductor chips of the third chip group, the plurality of second semiconductor chips of the fourth chip group and the plurality of second semiconductor chips of the first chip group, and
   wherein the third semiconductor chip of the second chip group, the first semiconductor chip of the second chip group, the first semiconductor chip of the third chip group, the first semiconductor chip of the fourth chip group and the first semiconductor chip of the first chip group have the same thickness.

* * * * *